US008349534B2

(12) United States Patent
Kurosawa et al.

(10) Patent No.: US 8,349,534 B2
(45) Date of Patent: Jan. 8, 2013

(54) POSITIVE RESIST COMPOSITION AND METHOD OF FORMING RESIST PATTERN

(75) Inventors: Tsuyoshi Kurosawa, Kawasaki (JP); Hiroaki Shimizu, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 140 days.

(21) Appl. No.: 12/717,785

(22) Filed: Mar. 4, 2010

(65) Prior Publication Data

US 2010/0233623 A1 Sep. 16, 2010

(30) Foreign Application Priority Data

Mar. 9, 2009 (JP) ................................ P2009-055745

(51) Int. Cl.
*G03F 7/039* (2006.01)
*G03F 7/20* (2006.01)
*G03F 7/30* (2006.01)

(52) U.S. Cl. ..................... 430/270.1; 430/311; 430/326; 430/907; 430/910; 430/914

(58) Field of Classification Search ........................ None
See application file for complete search history.

(56) References Cited

U.S. PATENT DOCUMENTS 4,458,001 A 7/1984 Taylor
4,495,275 A 1/1985 Yokoyama et al.
4,638,024 A 1/1987 Sato et al.
5,945,517 A 8/1999 Nitta et al.
6,153,733 A 11/2000 Yukawa et al.
6,255,392 B1 7/2001 Inoue et al.
7,074,543 B2 7/2006 Iwai et al.
7,078,562 B2 7/2006 Furukawa et al.
7,291,690 B2 11/2007 Yamago et al.
8,221,956 B2 7/2012 Shiono
2002/0012874 A1 1/2002 Namba
2005/0271978 A1 12/2005 Takeda et al.
2006/0008736 A1 1/2006 Kanda et al.
2006/0029884 A1 2/2006 Hatakeyama et al.
2007/0148595 A1 6/2007 Kanda
2007/0160929 A1 7/2007 Hasegawa et al.
2007/0172769 A1 7/2007 Kanna et al.
2007/0231738 A1 10/2007 Kaneko et al.
2007/0298355 A1 12/2007 Harada et al.
2008/0311507 A1 12/2008 Isono et al.
2008/0319134 A1 12/2008 Ma et al.
2009/0197204 A1 8/2009 Shiono et al.
2009/0226842 A1 9/2009 Shimizu et al.
2009/0317743 A1 12/2009 Shiono et al.
2010/0062364 A1 3/2010 Dazai et al.
2010/0081088 A1 4/2010 Kawaue et al.
2010/0086873 A1 4/2010 Seshimo et al.
2010/0136480 A1 6/2010 Motoike et al.
2010/0178609 A1 7/2010 Dazai et al.
2010/0183981 A1 7/2010 Matsumiya et al.
2010/0196820 A1 8/2010 Kawaue et al.
2010/0196821 A1 8/2010 Dazai et al.
2010/0209848 A1 8/2010 Dazai et al.
2010/0233624 A1 9/2010 Kakinoya et al.
2010/0233625 A1 9/2010 Hirano et al.
2010/0233626 A1 9/2010 Shimizu et al.
2011/0236824 A1 9/2011 Hirano et al.
2012/0077125 A1 3/2012 Shiono et al.
2012/0094236 A1 4/2012 Shiono et al.

FOREIGN PATENT DOCUMENTS

EP 1 580 598 A 9/2005
EP 1 589 377 A 10/2005
EP 2 048 128 A 4/2009
JP 06-001750 A 1/1994
JP H09-208554 8/1997
JP H11-035551 2/1999
JP H11-035552 2/1999
JP H11-035573 2/1999
JP H11-133593 A 5/1999
JP H11-322707 11/1999

(Continued)

OTHER PUBLICATIONS

Office Action in U.S. Appl. No. 12/721,291 mailed Jan. 6, 2012.

(Continued)

*Primary Examiner* — Sin J. Lee
(74) *Attorney, Agent, or Firm* — Knobbe Martens Olson & Bear LLP

(57) ABSTRACT

A positive resist composition including:

a polymeric compound (A1) having a structural unit (a0) that contains a "cyclic group containing $—SO_2—$" on the side chain terminal, and a structural unit (a1) derived from an acrylate ester containing an acid dissociable, dissolution inhibiting group;

an acid generator component (B); and a fluorine-containing resin component having a structural unit (f1) represented by general formula (f1-0):

[Chemical Formula 1]

(f1-0)

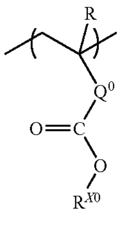

wherein R represents a hydrogen atom, an alkyl group of 1 to 5 carbon atoms or a halogenated alkyl group of 1 to 5 carbon atoms; $Q^0$ represents a single bond or a divalent linking group having a fluorine atom; and $R^{X0}$ represents an acid dissociable, dissolution inhibiting group-containing group which may contain a fluorine atom, with the provision that at least one fluorine atom is contained in formula (f1-0).

9 Claims, 1 Drawing Sheet

FOREIGN PATENT DOCUMENTS

| | | | |
|---|---|---|---|
| JP | A-2003-241385 | | 8/2003 |
| JP | 2004-323693 | | 11/2004 |
| JP | 2005-037888 | | 2/2005 |
| JP | 2005-126459 | | 5/2005 |
| JP | 2005-344009 | | 12/2005 |
| JP | A-2006-016379 | | 1/2006 |
| JP | 2006-048029 | | 2/2006 |
| JP | 2006-299278 | | 11/2006 |
| JP | A-2007-031355 | | 2/2007 |
| JP | 2008-247919 | | 10/2008 |
| KR | 10-2007-0074476 | A | 7/2007 |
| TW | 2007-41347 | | 11/2007 |
| TW | 2008-01049 | | 1/2008 |
| WO | WO 92/00366 | A1 | 1/1992 |
| WO | WO 2004/074242 | | 9/2004 |
| WO | WO 2008/021291 | | 2/2008 |
| WO | WO 2008/123560 | A | 10/2008 |

OTHER PUBLICATIONS

Gil et al., "First Microprocessors with Immersion Lithography," *Optical Microlithography XVIII*, Proceedings of SPIE, vol. 5754, pp. 119-128 (2005).

Kodama et al., Synthesis of Novel Fluoropolymer for 157nm Photoresists by Cyclo-polymerization, *Advances in Resist Technology and Processing XIX*, Proceedings of SPIE, vol. 4690, pp. 76-83 (2002).

Irie et al., Surface Property Control for 193nm Immersion Resist *Journal of Photopolymer Science and Technology*, vol. 19, No. 4, pp. 565-568 (2006).

Office Action in U.S. Appl. No. 12/461,687 mailed Sep. 12, 2011.

Notice of Allowance issued in U.S. Appl. No. 12/461,687 on Jan. 25, 2012.

Office Action issued in U.S. Appl. No. 12/789,152 on Jan. 25, 2012.

Office Action issued in U.S. Appl. No. 12/717,870 on Sep. 14, 2011.

Office Action issued in U.S. Appl. No. 12/717,870 on Jan. 26, 2012.

The date-stamped European Search Report issued in corresponding European Patent Application No. EP 09152046, dated May 20, 2009.

Decision for Grant of Patent received in corresponding Korean Patent Application No. 10-2009-0007960 dated Jun. 28, 2011.

Office Action issued in U.S. Appl. No. 12/360,415 on Sep. 12, 2011.

Office Action issued in U.S. Appl. No. 12/360,415 on Feb. 8, 2012.

Office Action issued in U.S. Appl. No. 12/360,415 on May 17, 2012.

Office Action issued in U.S. Appl. No. 13/310,625 on Jul. 24, 2012.

Office Action issued in U.S. Appl. No. 12/824,089 on Jul. 25, 2012.

Office Action issued in Taiwanese Patent Application No. 098103527 on Jul. 23, 2012.

Office Action issued in U.S. Appl. No. 12/824,089 on Apr. 6, 2012.

Office Action issued in U.S. Appl. No. 12/789,152 on Sep. 7, 2012.

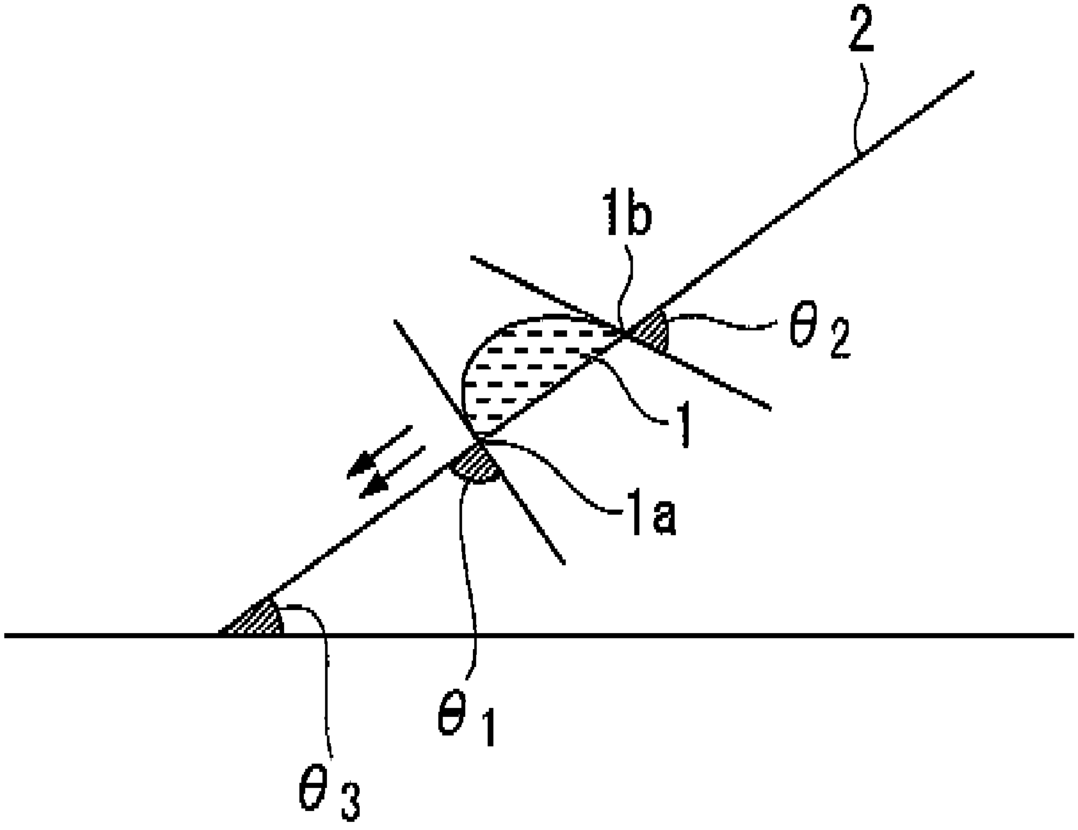
2
1b
θ 2
1
1a
θ 1
θ 3

POSITIVE RESIST COMPOSITION AND METHOD OF FORMING RESIST PATTERN

BACKGROUND OF THE INVENTION

1. Field of the Invention

The present invention relates to a positive resist composition and a method of forming a resist pattern using the positive resist composition.

Priority is claimed on Japanese Patent Application No. 2009-055745, filed Mar. 9, 2009, the content of which is incorporated herein by reference.

2. Description of the Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

As shortening of the wavelength of the exposure light source progresses, it is required to improve various lithography properties of the resist material, such as the sensitivity to the exposure light source and the resolution capable of reproducing patterns of minute dimensions. As a resist material which satisfies these conditions, a chemically amplified resist is used, which includes a base resin that exhibits a changed solubility in an alkali developing solution under action of acid and an acid generator that generates acid upon exposure.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see, for example, Non-Patent Document 1).

According to this type of immersion exposure, it is considered that higher resolutions equivalent to those obtained using a shorter wavelength light source or a larger NA (numerical aperture) lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift methods and modified illumination methods. Currently, as the immersion exposure technique, techniques using an ArF excimer laser as an exposure source are being actively studied. Further, water is mainly used as the immersion medium.

In recent years, fluorine-containing compounds have been attracting attention for their properties such as water repellency and transparency, and active research and development of fluorine-containing compounds have been conducted in various fields.

For example, in the fields of resist materials, currently, an acid-labile group such as a methoxymethyl group, tert-butyl group or tert-butyloxycarbonyl group is being introduced into a fluorine-containing polymeric compound, and the fluorine-containing polymeric compound is then used as a base resin for a chemically amplified positive resist.

However, when such a fluorine-containing polymeric compound is used as a base resin for a chemically amplified positive resist, disadvantages are caused in that a large amount of an out gas is generated following exposure, and the resistance to a dry etching gas (namely, the etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

In addition, a fluorine-containing polymeric compound has been reported in order to provide a resist film with water repellency in a resist composition for immersion exposure (see, for example, Non-Patent Document 3).

[Non-Patent Document 1] Proceedings of SPIE (U.S.), vol. 5754, pp. 119-128 (2005)

[Non-Patent Document 2] Proceedings of SPIE (U.S.), vol. 4690, pp. 76-83 (2002)

[Non-Patent Document 3] Journal of Photopolymer Science and Technology, vol. 19, No. 4, pp. 565-568 (2006)

In immersion exposure, a resist material is required which exhibits not only general lithography properties (e.g., sensitivity, resolution, etching resistance and the like), but also properties suited for immersion lithography.

For example, in immersion exposure, when the resist film comes into contact with the immersion medium, elution of a substance contained in the resist film into the immersion medium (substance elution) occurs. This elution of a substance causes phenomena such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced.

Further, when the immersion medium is water, and immersion exposure is performed using a scanning-type immersion exposure apparatus as disclosed in Non-Patent Document 1, a water tracking ability in which the immersion medium is capable of tracking the movement of the lens is required. When the water tracking ability is poor, the exposure speed becomes low, and as a result, there is a possibility that the productivity may be adversely affected. It is presumed that the water tracking ability can be improved by enhancing the hydrophobicity of the resist film surface (rendering the resist film surface hydrophobic). It has been desired to achieve high speed scanning by improving the water tracking ability.

However, the effect of enhancing the hydrophobicity of the resist film surface is not yet satisfactory in the conventional resist compositions containing a fluorine-containing compound.

The present invention takes the above circumstances into consideration, with an object of providing a positive resist composition which is capable of forming a resist film having a highly hydrophobic surface, and a method of forming a resist pattern using the positive resist composition.

SUMMARY OF THE INVENTION

In order to solve the above-mentioned problems, the present invention employs the following aspects.

Specifically, a first aspect of the present invention is a positive resist composition including a base material component (A) which exhibits increased solubility in an alkali developing solution under action of acid, an acid generator component (B) which generates acid upon exposure and a fluorine-containing compound component (F), the base material component (A) including a polymeric compound (A1) having a structural unit (a0) represented by general formula (a0-1) shown below and a structural unit (a1) derived from an acrylate ester containing an acid dissociable, dissolution inhibiting group, and the fluorine-containing compound component (F) including a fluorine-containing resin component having a structural unit (f1) represented by general formula (f1-0) shown below.

[Chemical Formula 1]

(a0-1)

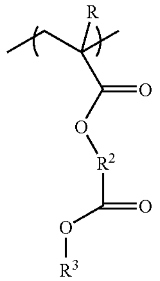

[In formula (a0-1), R represents a hydrogen atom, an alkyl group of 1 to 5 carbon atoms or a halogenated alkyl group of 1 to 5 carbon atoms; $R^2$ represents a divalent linking group; and $R^3$ represents a cyclic group containing $—SO_2—$ within the ring skeleton thereof.]

[Chemical Formula 2]

(f1-0)

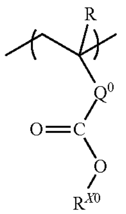

[In formula (f1-0), R represents a hydrogen atom, an alkyl group of 1 to 5 carbon atoms or a halogenated alkyl group of 1 to 5 carbon atoms; $Q^0$ represents a single bond or a divalent linking group having a fluorine atom; $R^{X0}$ represents an acid dissociable, dissolution inhibiting group-containing group which may contain a fluorine atom, with the provision that at least one fluorine atom is contained in formula (f1-0).]

A second aspect of the present invention is a method of forming a resist pattern, including applying a positive resist composition according to the first aspect on a substrate to form a resist film, subjecting the resist film to exposure, and subjecting the resist film to alkali developing to form a resist pattern.

In the present description and claims, an "alkyl group" includes linear, branched or cyclic, monovalent saturated hydrocarbon groups, unless otherwise specified.

The term "alkylene group" includes linear, branched or cyclic divalent saturated hydrocarbon groups, unless otherwise specified.

A "lower alkyl group" is an alkyl group of 1 to 5 carbon atoms.

A "halogenated alkyl group" is a group in which part or all of the hydrogen atoms of an alkyl group is substituted with halogen atoms. Examples of halogen atoms include fluorine atoms, chlorine atoms, bromine atoms and iodine atoms.

The term "aliphatic" is a relative concept used in relation to the term "aromatic", and defines a group or compound that has no aromaticity.

A "halogen atom" includes a fluorine atom, a chlorine atom, a bromine atom and an iodine atom, unless otherwise specified.

The term "structural unit" refers to a monomer unit that contributes to the formation of a polymeric compound (namely, a polymer or copolymer).

The term "exposure" is used as a general concept that includes irradiation with any form of radiation.

According to the present invention, there are provided a positive resist composition which is capable of forming a resist film having a highly hydrophobic surface, and a method of forming a resist pattern using the positive resist composition.

BRIEF DESCRIPTION OF THE DRAWINGS

FIG. 1 is a diagram describing an advancing angle ($\theta_1$), a receding angle ($\theta_2$) and a sliding angle ($\theta_3$).

DETAILED DESCRIPTION OF THE INVENTION

<<Positive Resist Composition>>

The positive resist composition according to the first aspect of the present invention includes a base material component (A) which exhibits increased solubility in an alkali developing solution under action of acid (hereafter, referred to as "component (A)"), an acid generator component (B) which generates acid upon exposure (hereafter, referred to as "component (B)") and a fluorine-containing compound component (F) (hereafter, referred to as "component (F)").

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions of the resist film in an alkali developing solution is increased, whereas the solubility of the unexposed portions in an alkali developing solution is unchanged, and hence, a resist pattern can be formed by alkali developing.

In the positive resist composition of the present invention, it is preferable that a nitrogen-containing organic compound component (D) (hereafter, referred to as "component (D)") be further included.

<Component (A)>

In the present invention, the term "base material component" refers to an organic compound capable of forming a film.

As the base material component, an organic compound having a molecular weight of 500 or more can be preferably used. When the organic compound has a molecular weight of 500 or more, the film-forming ability is improved, and a nano level resist pattern can be readily formed.

The "organic compound having a molecular weight of 500 or more" which can be used as a base material component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 2,000 or more is used. Hereafter, a polymer having a molecular weight of 2,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

In the present invention, the component (A) includes a polymeric compound (A1) (hereafter, referred to as "component (A1)") having a structural unit (a0) represented by general formula (a0-1) above and a structural unit (a1) derived from an acrylate ester containing an acid dissociable, dissolution inhibiting group.

[Component (A1)]

The component (A1) is a polymeric compound having the structural unit (a0) and the structural unit (a1).

Moreover, in addition to the structural unit (a0) and the structural unit (a1), the component (A1) preferably also has a structural unit (a3) derived from an acrylate ester that contains a polar group-containing aliphatic hydrocarbon group.

(Structural Unit (a0))

In formula (a0-1) above, R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group of 1 to 5 carbon atoms is substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a halogenated alkyl group of 1 to 5 carbon atoms is preferable, and a hydrogen atom or a methyl group is particularly desirable in terms of industrial availability.

In general formula (a0-1) above, $R^2$ represents a divalent linking group.

Preferable examples of $R^2$ include a divalent hydrocarbon group which may have a substituent, and a divalent linking group containing a hetero atom.

Divalent Hydrocarbon Group Which May Have a Substituent

With respect to $R^2$, the hydrocarbon group "has a substituent" means that part or all of the hydrogen atoms within the hydrocarbon group has been substituted with a group or an atom other than a hydrogen atom.

The hydrocarbon group may be either an aliphatic hydrocarbon group or an aromatic hydrocarbon group. An aliphatic hydrocarbon group refers to a hydrocarbon group that has no aromaticity.

The aliphatic hydrocarbon group may be either saturated or unsaturated, but in general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable, and specific examples include a methylene group [$-CH_2-$], an ethylene group [$-(CH_2)_2-$], a trimethylene group [$-(CH_2)_3-$], a tetramethylene group [$-(CH_2)_4-$] and a pentamethylene group [$-(CH_2)_5-$].

As the branched aliphatic hydrocarbon group, a branched alkylene group is preferable, and specific examples include alkylalkylene groups, e.g., alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$ and $-C(CH_2CH_3)_2-CH_2-$; alkyltrimethylene groups such as $-CH(CH_3)CH_2CH_2-$, and $-CH_2CH(CH_3)CH_2-$; and alkyltetramethylene groups such as $-CH(CH_3)CH_2CH_2CH_2-$, and $-CH_2CH(CH_3)CH_2CH_2-$. As the alkyl group within the alkylalkylene group, a linear alkyl group of 1 to 5 carbon atoms is preferable, The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms which is substituted by a fluorine atom, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of the substituent include an alkyl group of 1 to 5 carbon atoms, a fluorine atom, a fluorinated alkyl group of 1 to 5 carbon atoms which is substituted by a fluorine atom, and an oxygen atom (═O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (═O).

Divalent Linking Group Containing a Hetero Atom

With respect to the "divalent linking group containing a hetero atom" for $R^2$, a hetero atom refers to an atom other than a carbon atom and a hydrogen atom, and examples thereof include an oxygen atom, a nitrogen atom, a sulfur atom and a halogen atom.

Specific examples of divalent linking groups containing a hetero atom include —O—, —C(═O)—, —C(═O)—O—, a carbonate bond (—O—C(═O)—O—), —NH—, —$NR^{04}$— (in the formula, $R^{04}$ represents a substituent such as an alkyl group or an acyl group), —NH—C(═O)—, ═N, —S—, —$S(═O)_2$— and —$S(═O)_2$—O—. Further, a combination of any one of these "divalent linking groups containing a hetero atom" with a divalent hydrocarbon group can also be used. As examples of the divalent hydrocarbon group, the same groups as those described above for the divalent hydrocarbon group which may have a substituent can be given, and a linear or branched aliphatic hydrocarbon group is preferable.

In the —$NR^{04}$— group, $R^{04}$ represents a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

$R^2$ may or may not have an acid dissociable portion in the structure thereof.

An "acid dissociable portion" refers to a portion within the $R^2$ group which is dissociated from the group by action of acid generated upon exposure. When $R^2$ group has an acid dissociable portion, it preferably has an acid dissociable portion having a tertiary carbon atom.

In the present invention, as the divalent linking group for $R^2$, an alkylene group, a divalent aliphatic cyclic group or a divalent linking group containing a hetero atom is preferable. Among these, an alkylene group is particularly desirable.

When $R^2$ represents an alkylene group, it preferably has 1 to 10 carbon atoms, more preferably 1 to 6 carbon atoms, still more preferably 1 to 4 carbon atoms, and most preferably 1 to 3 carbon atoms. Specific examples of alkylene groups include the aforementioned linear alkylene groups and branched alkylene groups.

When $R^2$ represents a divalent aliphatic cyclic group, as the aliphatic cyclic group, the same cyclic aliphatic hydrocarbon groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantine, tricyclodecane or tetracyclododecane is particularly desirable.

When $R^2$ represents a divalent linking group containing a hetero atom, preferable examples of linking groups include —O—, —C(═O)—O—, —C(═O)—, —O—C(═O)—O—, —C(═O)—NH—, —$NR^{04}$— (in the formula, $R^{04}$ represents a substituent such as an alkyl group or an acyl group), —S—, —$S(═O)_2$—O—, a group represented by the formula: -A-O—B—, and a group represented by the formula: -[A-C(═O)—O]$_q$—B—. Herein, each of A and B independently represents a divalent hydrocarbon group which may have a substituent, and q represents an integer of 1 to 3. In the formula -A-O—B— and -[A-C(═O)—O]$_q$—B—, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as $R^2$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkyl methylene group is more preferable. The alkyl group within the alkyl methylene group is preferably a linear alkyl group of 1 to 5 carbon atoms, more preferably a linear alkyl group of 1 to 3 carbon atoms, and most preferably a methyl group.

In the group represented by the formula -[A-C(═O)—O]$_q$—B—, q represents an integer of 1 to 3, preferably an integer of 1 or 2, and most preferably 1.

In general formula (a0-1) above, $R^3$ represents a cyclic group containing —$SO_2$— in the ring skeleton thereof.

More specifically, $R^3$ is a cyclic group in which the sulfur atom (S) within the —$SO_2$— group forms part of the ring skeleton thereof.

The cyclic group for $R^3$ refers to a cyclic group including a ring that contains —$SO_2$— within the ring skeleton thereof, and this ring is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The cyclic group for $R^3$ may be either a monocyclic group or a polycyclic group.

As $R^3$, a cyclic group containing —O—$SO_2$— within the ring skeleton thereof, i.e., a sulfone ring in which —O—S— within the —O—$SO_2$— group forms part of the ring skeleton thereof is particularly desirable.

The cyclic group for $R^3$ preferably has 3 to 30 carbon atoms, more preferably 4 to 20 carbon atoms, still more preferably 4 to 15 carbon atoms, and most preferably 4 to 12 carbon atoms.

Herein, the number of carbon atoms refers to the number of carbon atoms constituting the ring skeleton, excluding the number of carbon atoms within a substituent.

The cyclic group for $R^3$ may be either an aliphatic cyclic group or an aromatic cyclic group, and is preferably an aliphatic cyclic group.

Examples of aliphatic cyclic groups for $R^3$ include the aforementioned cyclic aliphatic hydrocarbon groups in which part of the carbon atoms constituting the ring skeleton thereof has been substituted with $—SO_2—$ or $—O—SO_2—$.

More specifically, examples of the monocyclic groups include a monocycloalkane in which one hydrogen atom have been removed therefrom and a $—CH_2—$ group constituting the ring skeleton thereof has been substituted with $—SO_2—$; and a monocycloalkane in which one hydrogen atom have been removed therefrom and a $—CH_2—CH_2—$ group constituting the ring skeleton thereof has been substituted with $—O—SO_2—$. Examples of the polycyclic groups include a polycycloalkane (a bicycloalkane, a tricycloalkane, a tetracycloalkane or the like) in which one hydrogen atom have been removed therefrom and a $—CH_2—$ group constituting the ring skeleton thereof has been substituted with $—SO_2—$; and a polycycloalkane in which one hydrogen atom have been removed therefrom and a $—CH_2—CH_2—$ group constituting the ring skeleton thereof has been substituted with $—O—SO_2—$.

The cyclic group for $R^3$ may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group. R" represents a hydrogen atom or an alkyl group.

The alkyl group for the substituent is preferably an alkyl group of 1 to 6 carbon atoms. The alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or an ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups for the substituent have been substituted with the aforementioned halogen atoms. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

More specific examples of $R^3$ include groups represented by general formulas (3-1) to (3-4) shown below.

[Chemical Formula 3]

(3-1)

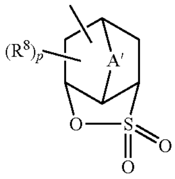

(3-2)

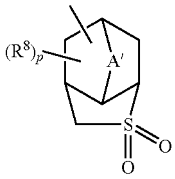

(3-3)

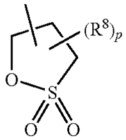

(3-4)

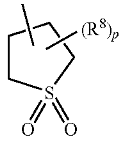

[In the formulas, A' represents an oxygen atom, a sulfur atom, or an alkylene group of 1 to 5 carbon atoms which may contain an oxygen atom or a sulfur atom; p represents an integer of 0 to 2; and $R^8$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.]

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkylene group. Specific examples of such alkylene groups include —O—$CH_2$—, —$CH_2$—O—$CH_2$—, —S—$CH_2$—, —$CH_2$—S—$CH_2$—.

As A', an alkylene group of 1 to 5 carbon atoms or —O— is preferable, more preferably an alkylene group of 1 to 5 carbon atoms, and most preferably a methylene group.

p represents an integer of 0 to 2, and is most preferably 0.

When p is 2, the plurality of $R^8$ may be the same or different from each other.

As the alkyl group, alkoxy group, halogenated alkyl group, —COOR", —OC(═O)R" and hydroxyalkyl group for $R^8$, the same alkyl groups, alkoxy groups, halogenated alkyl groups, —COOR", —OC(═O)R" and hydroxyalkyl groups as those described above as the substituent which the cyclic group for $R^3$ may have can be used.

Specific examples of the cyclic groups represented by general formulas (3-1) to (3-4) are shown below. In the formulas shown below, “Ac” represents an acetyl group.

[Chemical Formula 4]

(3-1-1)

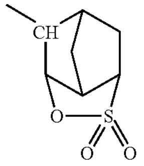

(3-1-2)

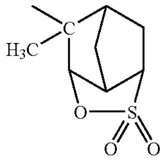

(3-1-3)

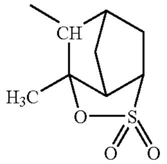

(3-1-4)

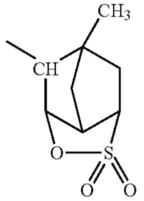

(3-1-5)

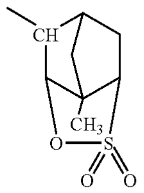

-continued (3-1-6)

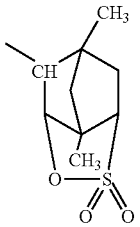

(3-1-7)

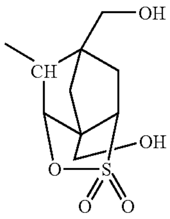

(3-1-8)

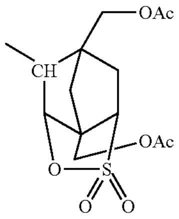

[Chemical Formula 5]

(3-1-9)

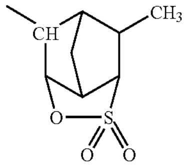

(3-1-10)

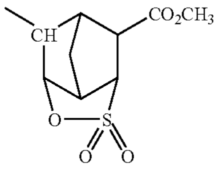

(3-1-11)

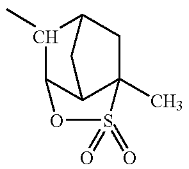

(3-1-12)

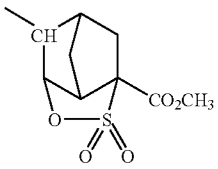

(3-1-13)

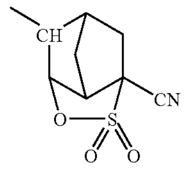

-continued
(3-1-14)
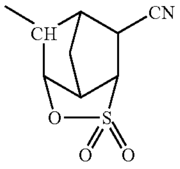
(3-1-15)
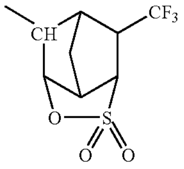
(3-1-16)
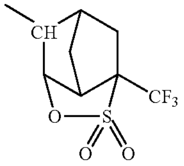
(3-1-17)
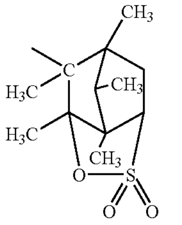
[Chemical Formula 6]
(3-1-18)
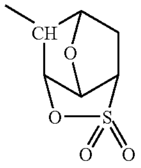
(3-1-19)
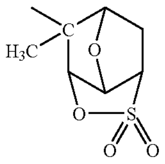
(3-1-20)
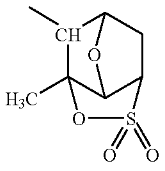
(3-1-21)
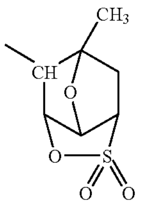
-continued
(3-1-22)
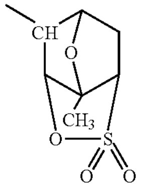
(3-1-23)
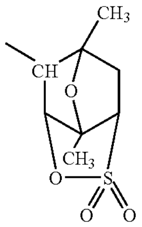
(3-1-24)
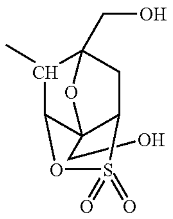
(3-1-25)
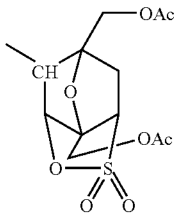
(3-1-26)
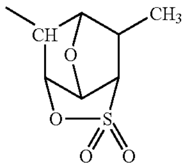
(3-1-27)
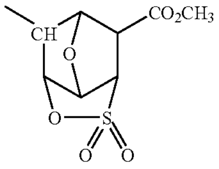
(3-1-28)
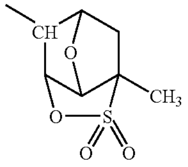
(3-1-29)
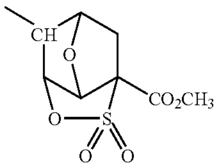

-continued

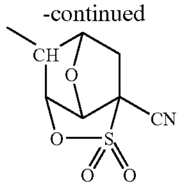

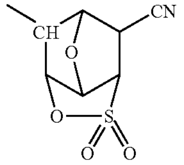

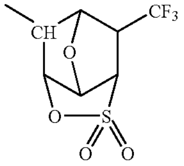

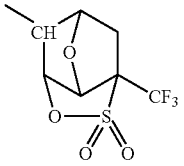

[Chemical Formula 7]

(3-2-1)

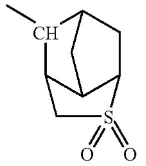

(3-2-2)

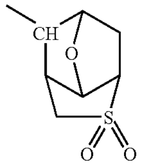

(3-3-1)

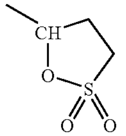

(3-4-1)

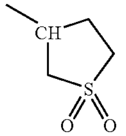

Among the examples shown above, as $R^3$, a cyclic group represented by general formula (3-1), (3-3) or (3-4) above is preferable, and a cyclic group represented by general formula (3-1) above is particularly desirable.

More specifically, as $R^3$, it is preferable to use at least one cyclic group selected from the group consisting of cyclic groups represented by chemical formulas (3-1-1), (3-1-18), (3-3-1) and (3-4-1) above, and a cyclic group represented by chemical formula (3-1-1) above is particularly desirable.

In the present invention, as the structural unit (a0), a structural unit represented by general formula (a0-1-11) shown below is particularly desirable.

[Chemical Formula 8]

(a0-1-11)

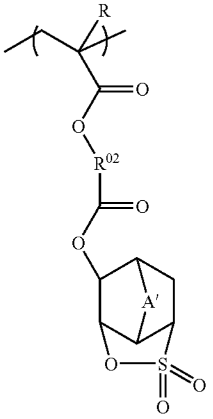

[In the formula, R is the same as defined for R in general formula (a0-1) above; $R^{02}$ represents a linear or branched alkylene group or -A-C(═O)—O—B— (wherein A and B are the same as defined for the "divalent hydrocarbon group which may have a substituent" usable as $R^2$ above); and A' is the same as defined for A' in general formula (3-1) above.]

The linear or branched alkylene group for $R^{02}$ preferably has 1 to 10 carbon atoms, more preferably 1 to 8 carbon atoms, still more preferably 1 to 5 carbon atoms, still more preferably 1 to 3 carbon atoms, and most preferably 1 or 2 carbon atoms.

In the -A-C(═O)—O—B— group, each of A and B preferably represents a linear or branched alkylene group, more preferably an alkylene group of 1 to 5 carbon atoms, and most preferably a methylene group or an ethylene group.

Specific examples thereof include $—(CH_2)_2—C(═O)—O—(CH_2)_2—$, and $—(CH_2)_2—O—C(═O)—(CH_2)_2—$.

A' is preferably a methylene group, an oxygen atom (—O—) or a sulfur atom (—S—).

As the structural unit (a0), one type of structural unit may be used alone, or two or more types of structural units may be used in combination.

In terms of achieving excellent lithography properties such as exposure latitude (EL margin), line width roughness (LWR) and the like in the formation of a resist pattern using a positive resist composition containing the component (A1), the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

(Structural Unit (a1))

The structural unit (a1) is a structural unit derived from an acrylate ester containing an acid dissociable, dissolution inhibiting group and does not fall under the category of the aforementioned structural unit (a0).

As the acid dissociable, dissolution inhibiting group in the structural unit (a1), any of the groups that have been proposed as acid dissociable, dissolution inhibiting groups for the base resins of chemically amplified resists can be used provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

As an example of the aliphatic branched, acid dissociable, dissolution inhibiting group, for example, a group represented by the formula —C($R^{71}$)($R^{72}$)($R^{73}$) can be given. In the formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tart-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (═O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group-containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded, Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 9]

(1-1)

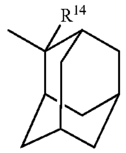

(1-2)

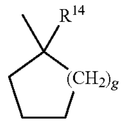

(1-3)

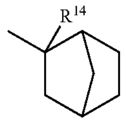

(1-4)

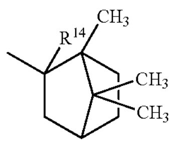

(1-5)

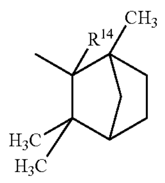

(1-6)

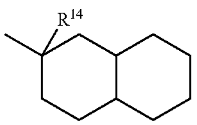

-continued (1-7)

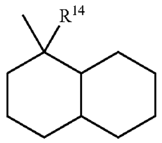

(1-8)

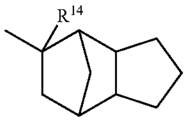

(1-9)

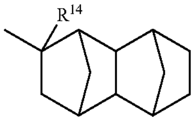

[In the formulas above, $R^{14}$ represents an alkyl group; and g represents an integer of 0 to 8.]

[Chemical Formula 10]

(2-1)

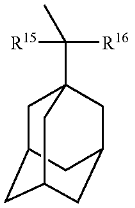

(2-2)

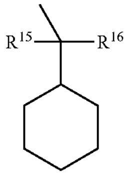

(2-3)

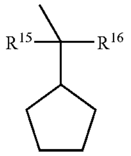

(2-4)

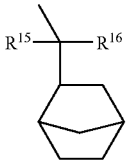

(2-5)

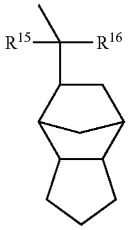

-continued (2-6)

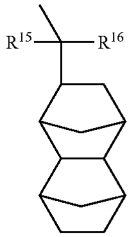

[In the formulas above, each of $R^{15}$ and $R^{16}$ independently represents an alkyl group.]

As the alkyl group for $R^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, an isobutyl group, a tent-butyl group, an isopentyl group and a neopentyl group, and an isopropyl group is particularly desirable.

g is preferably an integer of 0 to 3, more preferably an integer of 1 to 3, and still more preferably 1 or 2.

As the alkyl group for $R^{15}$ and $R^{16}$, the same alkyl groups as those for $R^{14}$ can be used.

In above formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom, and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 11]

(p1)

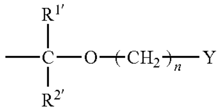

[In the formula, $R^{1'}$ and $K^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.]

In general formula (p1) above, n is preferably an integer of 0 to 2, more preferably 0 or 1, and most preferably 0.

As the alkyl group of 1 to 5 carbon atoms for $R^{1'}$ and $R^{2'}$, the same alkyl groups of 1 to 5 carbon atoms as those described above for R can be used, although a methyl group or an ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 12]

(p1-1)

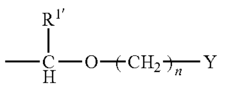

[In the formula, $R^{1'}$, n and Y are the same as defined for $R^{1'}$, n and Y in general formula (p1) above.]

As the alkyl group of 1 to 5 carbon atoms for Y, the same as the alkyl group of 1 to 5 carbon atoms for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 13]

(p2)

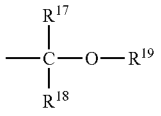

[In the formula, $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein $R^{17}$ and $R^{19}$ may be bonded to form a ring.]

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and $R^{19}$ may be bonded to $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include a tetrahydropyranyl group and a tetrahydrofuranyl group.

Specific examples of acetal-type acid dissociable, dissolution inhibiting groups include groups represented by formulas (p3-1) to (p3-12) shown below.

[Chemical Formula 14]

(p3-1)

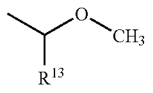

(p3-2)

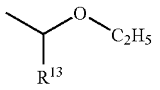

(p3-3)

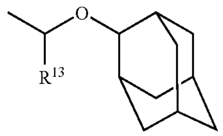

(p3-4)

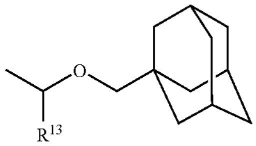

(p3-5)

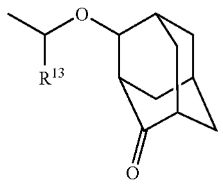

(p3-6)

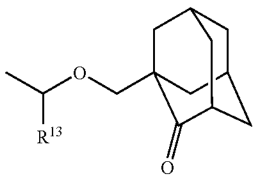

-continued (p3-7)

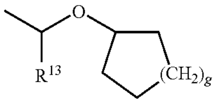

(p3-8)

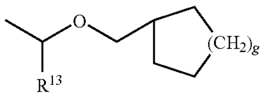

(p3-9)

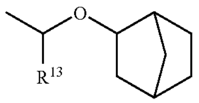

(p3-10)

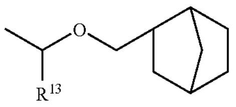

(p3-11)

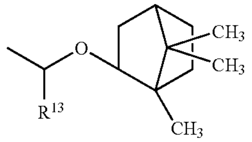

(p3-12)

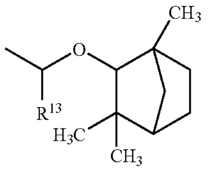

[In the formulas above, $R^{13}$ represents a hydrogen atom or a methyl group; and g represents an integer of 0 to 8.]

g is the same as defined above for g in general formula (1-2).

Specific examples of the structural unit (a1) include a structural unit represented by general formula (a1-0-1) shown below and a structural unit represented by general formula (a1-0-2) shown below.

[Chemical Formula 15]

(a1-0-1)

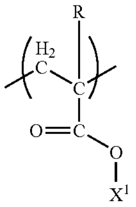

(a1-0-2)

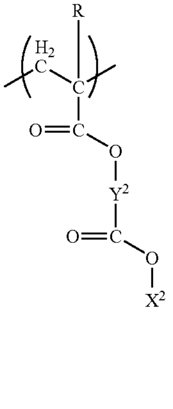

[In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.]

In general formula (a1-0-1), R is the same as defined for R in general formula (a0-1) above.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined for R in general formula (a0-1) above.

$X^2$ is the same as defined for $X^1$ in general formula (a1-0-1).

As examples of the divalent linking group for $Y^2$, the same groups as those described above for $R^2$ in formula (a0-1) can be given.

As $Y^2$, the same groups as the alkylene groups, divalent aliphatic cyclic groups or divalent linking groups containing a hetero atom described above in relation to $R^2$ are preferable. Among these, a divalent linking group containing a hetero atom is preferable, and a linear group containing an oxygen atom as a hetero atom, e.g., a group containing an ester bond is particularly desirable.

More specifically, a group represented by the aforementioned formula -A-O—B— or -A-C(═O)—O—B— is preferable, and a group represented by the formula $—(CH_2)_x—C(═O)—O—(CH_2)_y—$ is particularly desirable.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by general formulas (a1-1) to (a1-4) shown below.

[Chemical Formula 16]

(a1-1)

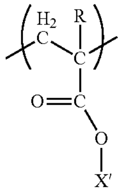

(a1-2)

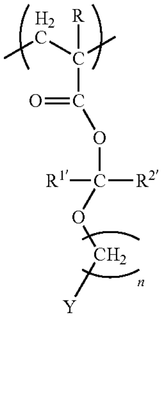

-continued (a1-3)

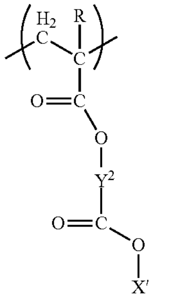

(a1-4)

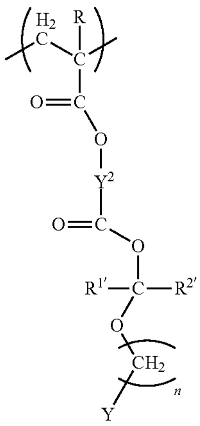

[In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R represents a hydrogen atom, an alkyl group of 1 to 5 carbon atoms or a halogenated alkyl group of 1 to 5 carbon atoms; and each of $R^{1'}$ and $R^{2'}$ independently represents a hydrogen atom or an alkyl group of 1 to 5 carbon atoms.]

In general formulas above, R is the same as defined for R in general formula (a1-0-1) above.

Examples of the tertiary alkyl ester-type acid dissociable, dissolution inhibiting group for X' include the same tertiary alkyl ester-type acid dissociable, dissolution inhibiting groups as those described above for $X^1$ in general formula (a1-0-1).

As $R^{1'}$, $R^{2'}$, and Y are respectively the same as defined for $R^{1'}$, $R^{2'}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^{\alpha}$ represents a hydrogen atom, a methyl group or a trifluoromethyl group.

[Chemical Formula 17]

(a1-1-1)

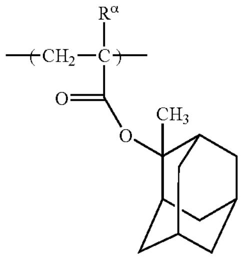

(a1-1-2)

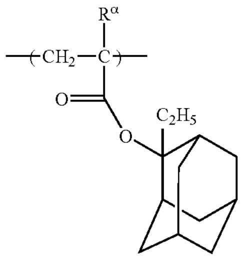

(a1-1-3)

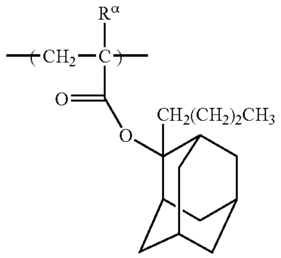

(a1-1-4)

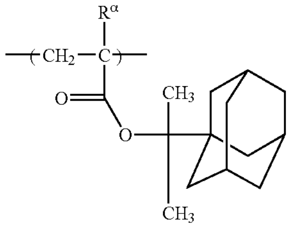

(a1-1-5)

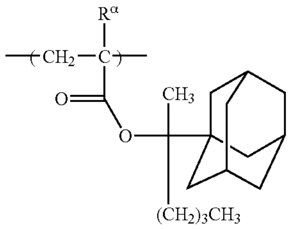

(a1-1-6)

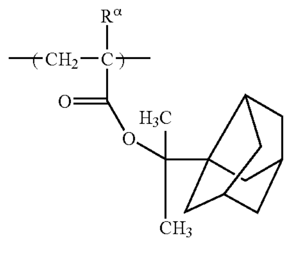

-continued
(a1-1-7)
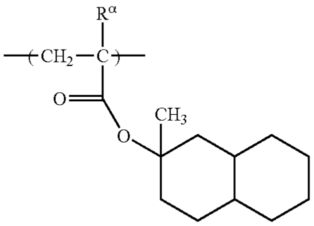
(a1-1-8)
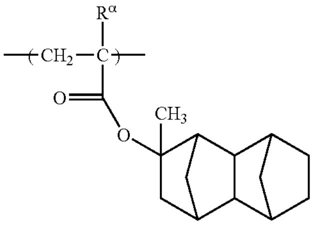
(a1-1-9)
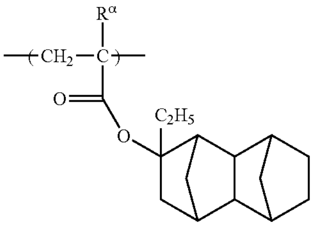
[Chemical Formula 18]
(a1-1-10)
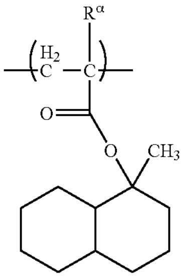
(a1-1-11)
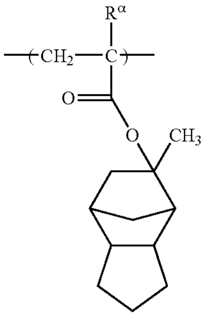
(a1-1-12)
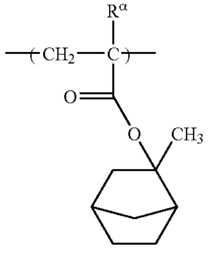
-continued
(a1-1-13)
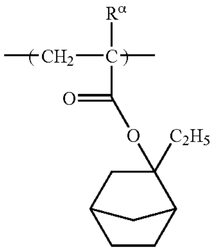
(a1-1-14)
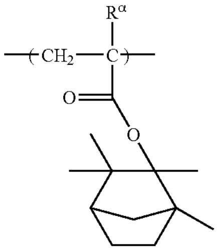
(a1-1-15)
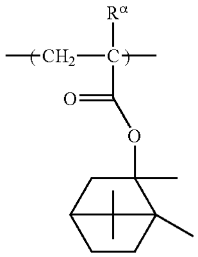
(a1-1-16)
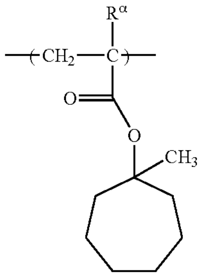
(a1-1-17)
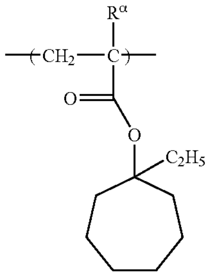
(a1-1-18)
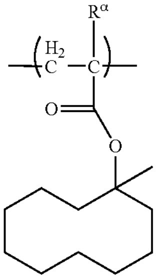

-continued
(a1-1-19)
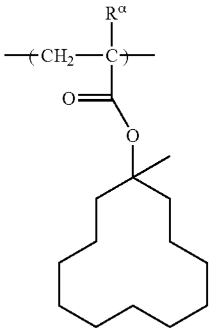
(a1-1-20)
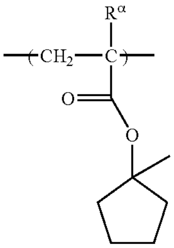
(a1-1-21)
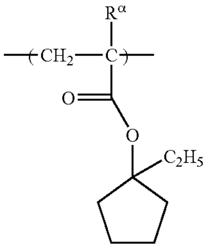
[Chemical Formula 19]
(a1-1-22)
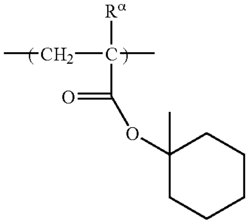
(a1-1-23)
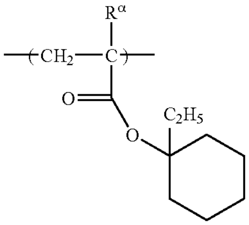
(a1-1-24)
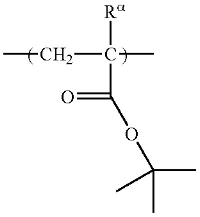
-continued
(a1-1-25)
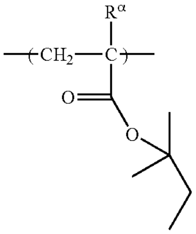
(a1-1-26)
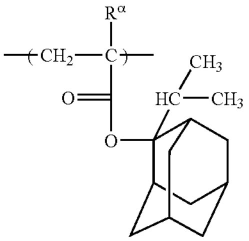
(a1-1-27)
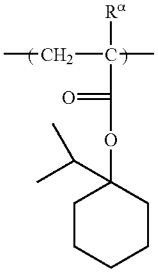
(a1-1-28)
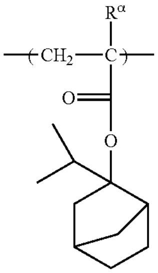
(a1-1-29)
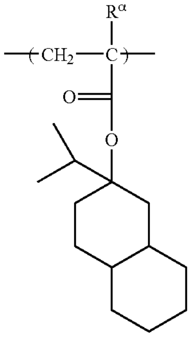

-continued
(a1-1-30)
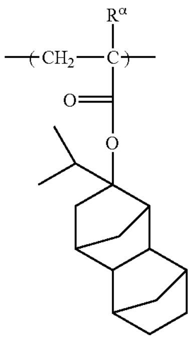
(a1-1-31)
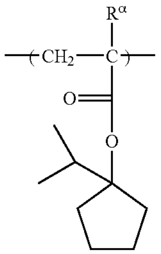
[Chemical Formula 20]
(a1-2-1)
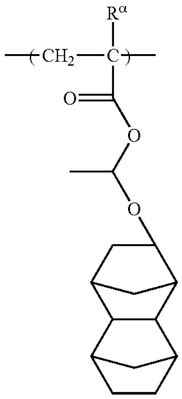
(a1-2-2)
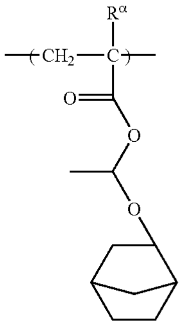
-continued
(a1-2-3)
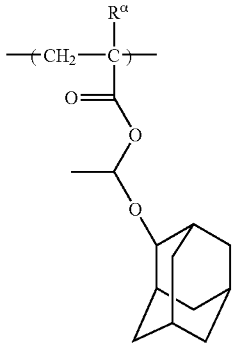
(a1-2-4)
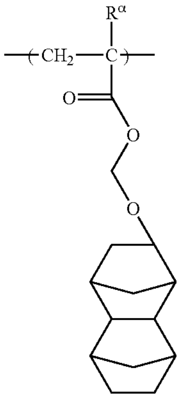
(a1-2-5)
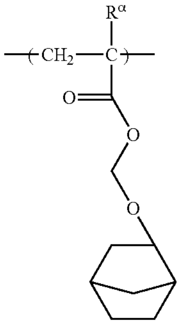
(a1-2-6)
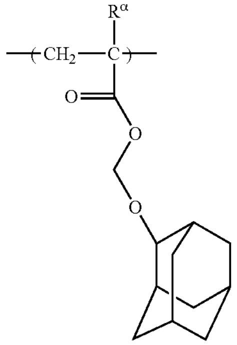

-continued
(a1-2-7)
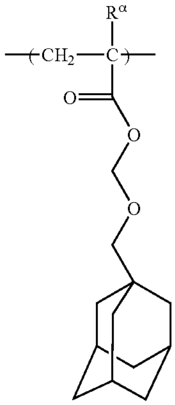
(a1-2-8)
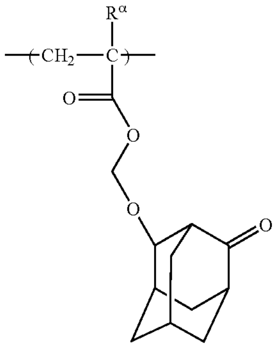
(a1-2-9)
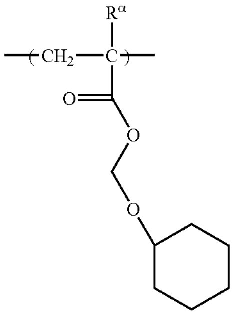
(a1-2-10)
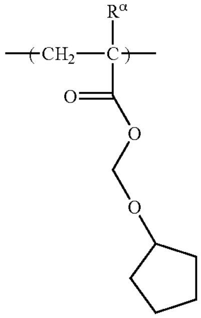
-continued
(a1-2-11)
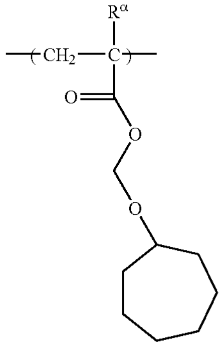
(a1-2-12)
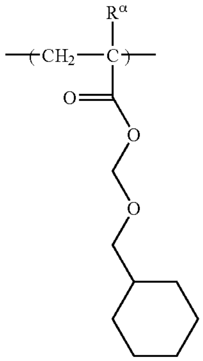
(a1-2-13)
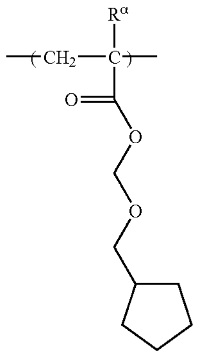
(a1-2-14)
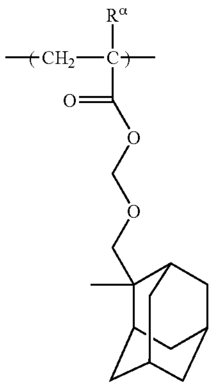

-continued
(a1-2-15)
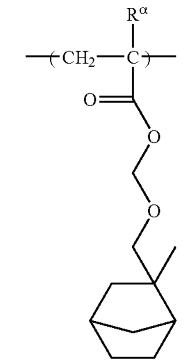
(a1-2-16)
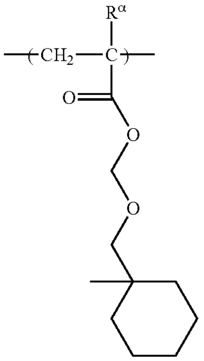
(a1-2-17)
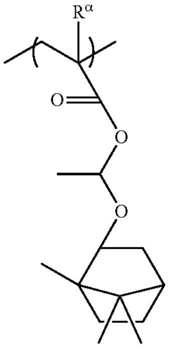
(a1-2-18)
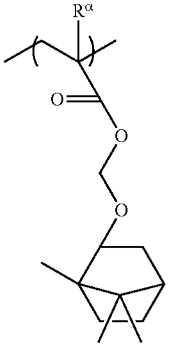
-continued
(a1-2-19)
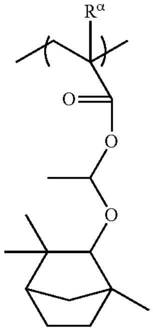
(a1-2-20)
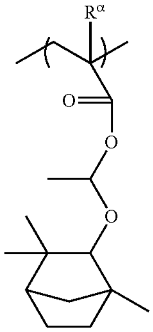
(a1-2-21)
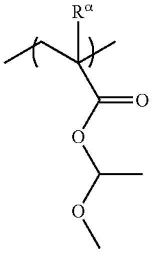
(a1-2-22)
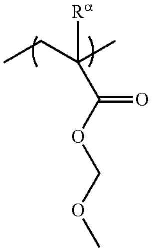
(a1-2-23)
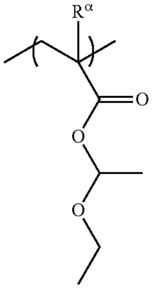

-continued
(a1-2-24)
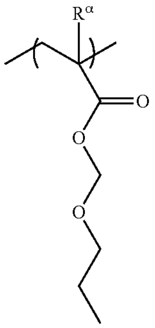
[Chemical Formula 21]
(a1-3-1)
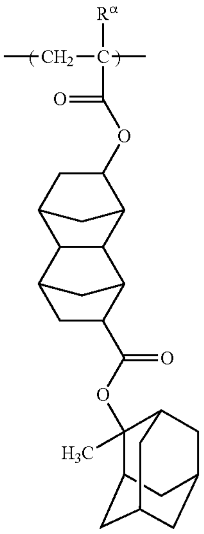
(a1-3-2)
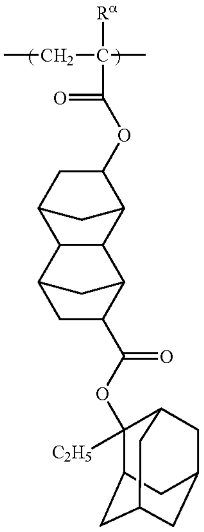
-continued
(a1-3-3)
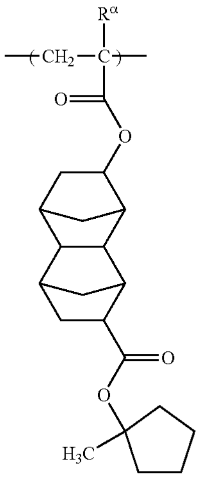
(a1-3-4)
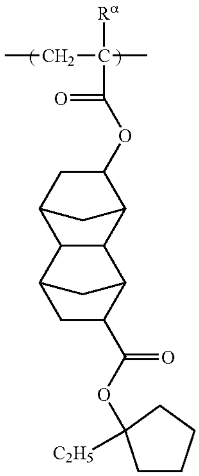
(a1-3-5)
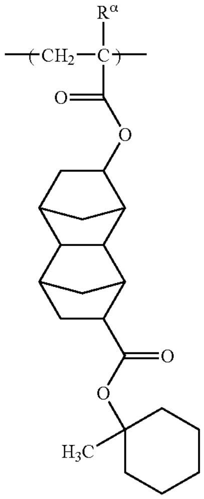

-continued
(a1-3-6)
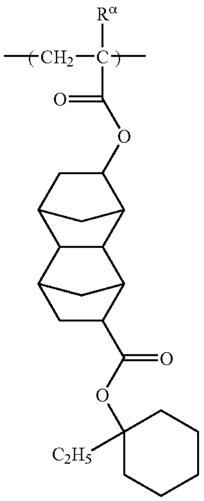
(a1-3-7)
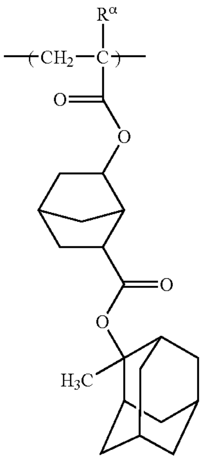
(a1-3-8)
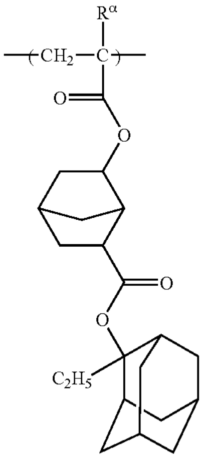
-continued
(a1-3-9)
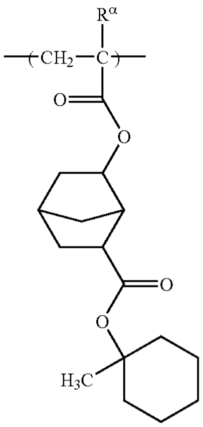
(a1-3-10)
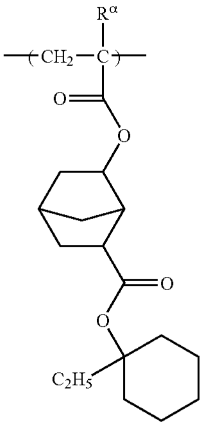
(a1-3-11)
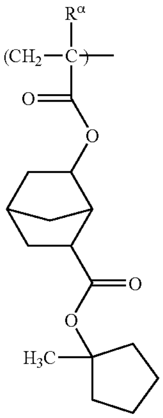

-continued
(a1-3-12)
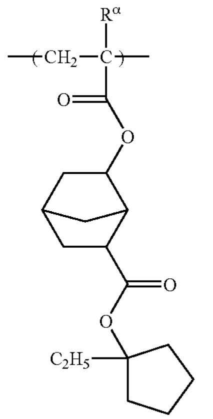
(a1-3-13)
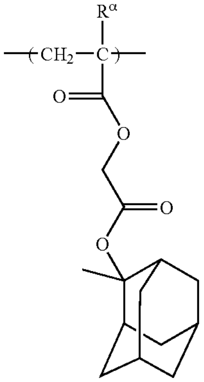
(a1-3-14)
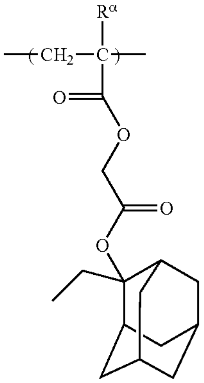
(a1-3-15)
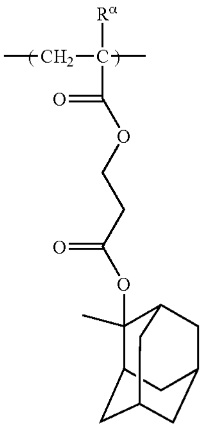
-continued
(a1-3-16)
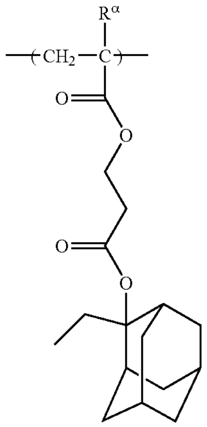
(a1-3-17)
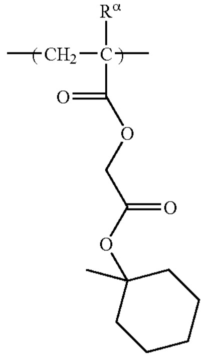
(a1-3-18)
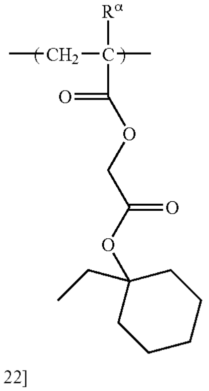
[Chemical Formula 22]
(a1-3-19)
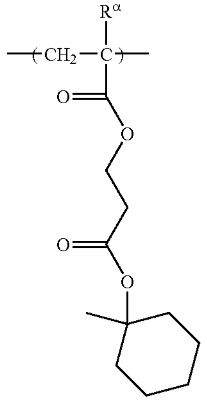

-continued
(a1-3-20)
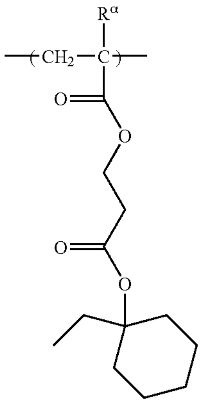
(a1-3-21)
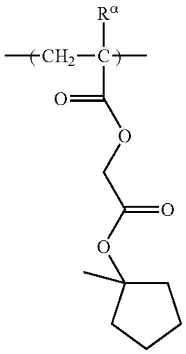
(a1-3-22)
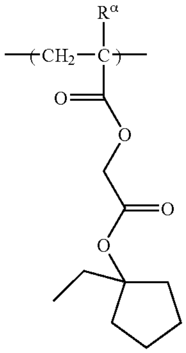
(a1-3-23)
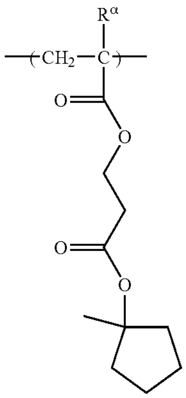
-continued
(a1-3-24)
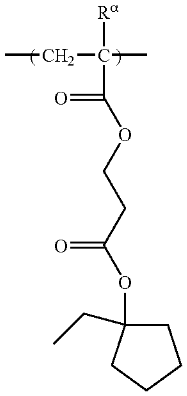
[Chemical Formula 23]
(a1-3-25)
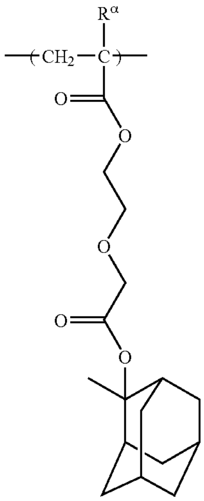
(a1-3-26)
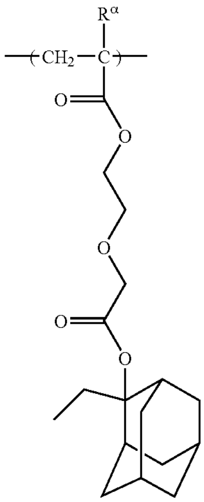

-continued
(a1-3-27)
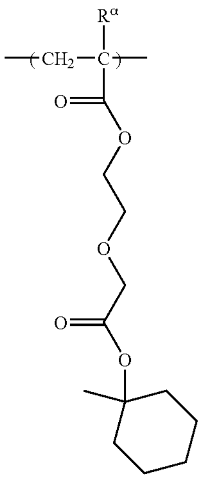
(a1-3-28)
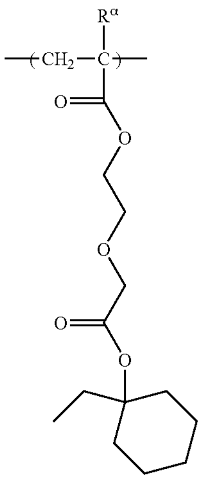
(a1-3-29)
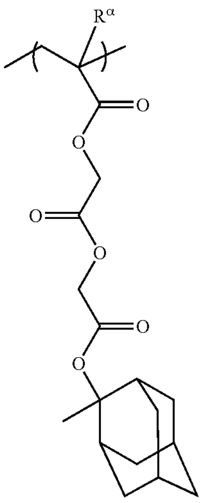
-continued
(a1-3-30)
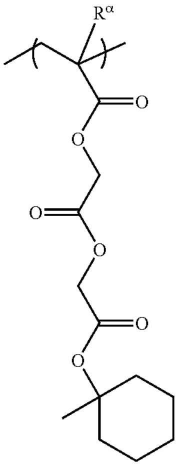
[Chemical Formula 24]
(a1-4-1)
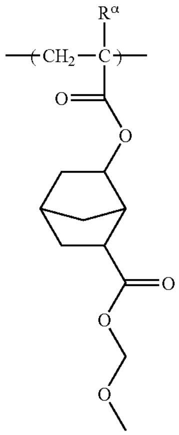
(a1-4-2)
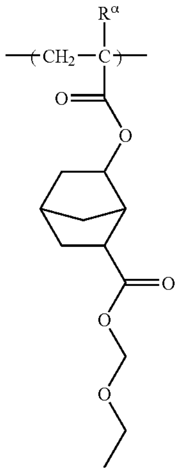

-continued
(a1-4-3)
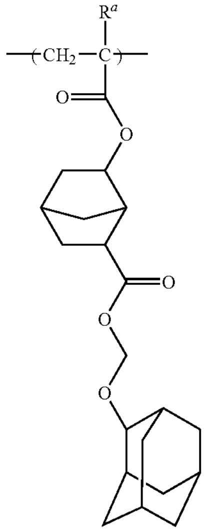
(a1-4-4)
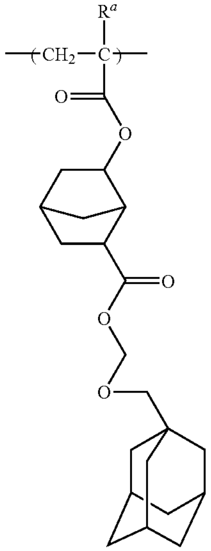
(a1-4-5)
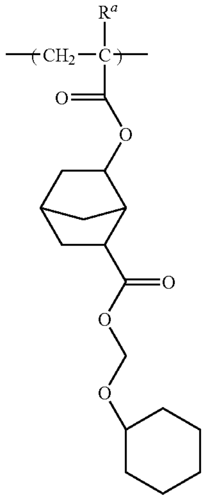
-continued
(a1-4-6)
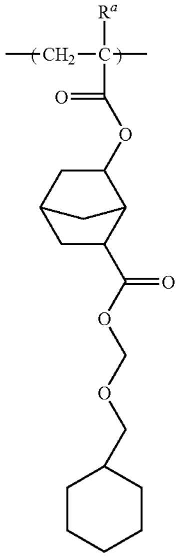
(a1-4-7)
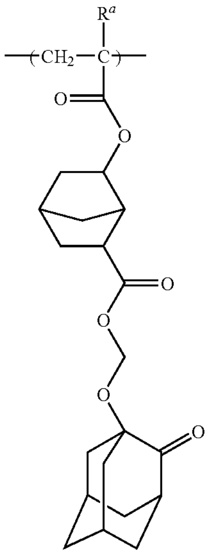
(a1-4-8)
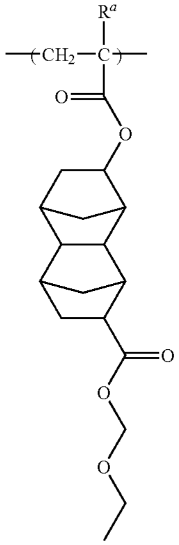

-continued
(a1-4-9)
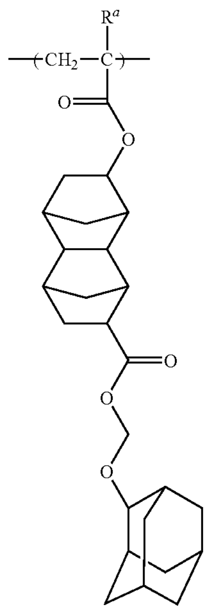
(a1-4-10)
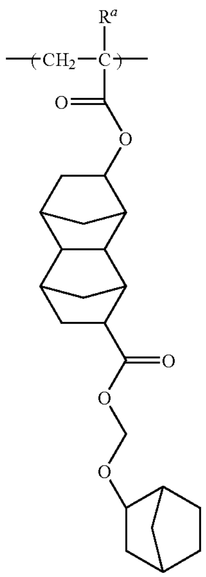
-continued
(a1-4-11)
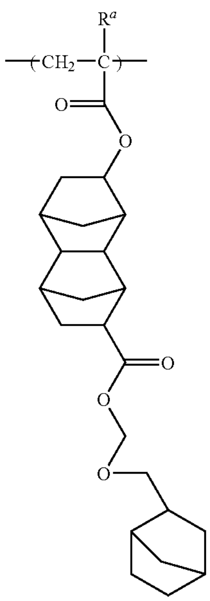
(a1-4-12)
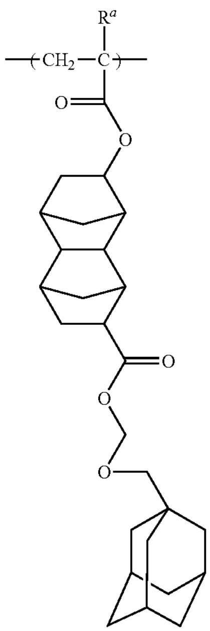

-continued (a1-4-13)

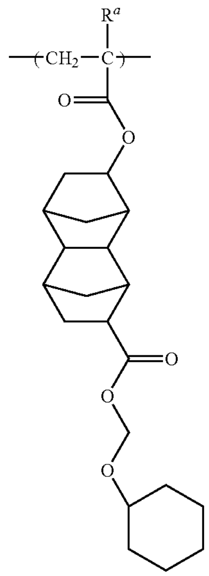

(a1-4-14)

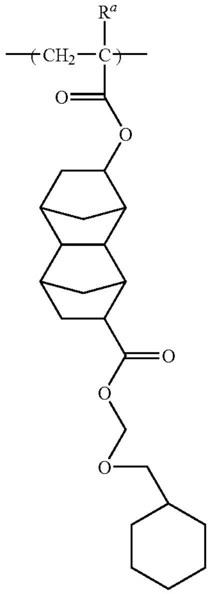

-continued (a1-4-15)

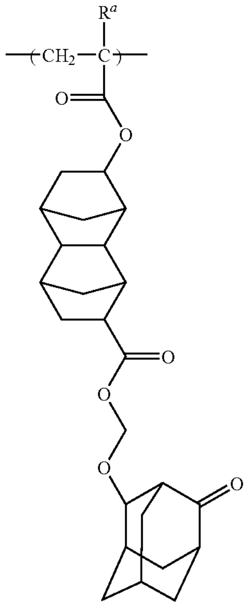

As the structural unit (a1), one type of structural unit may be used alone, or two or more types of structural units may be used in combination.

In the present invention, as the structural unit (a1), a structural unit represented by general formula (a1-1-01) shown below which includes the aforementioned formulas (a1-1-1), (a1-1-2) and (a1-1-7) to (a1-1-15) is particularly desirable in terms of achieving excellent lithography properties (e.g. EL margin, LWR, resolution and the like) and an excellent resist pattern shape.

As a structural unit represented by general formula (a1-1-01) shown below, a structural unit represented by general formula (a1-1-101) shown below which includes the aforementioned formulas (a1-1-1) and (a1-1-2) is particularly desirable.

[Chemical Formula 25]

(a1-1-01)

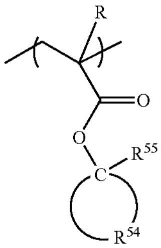

(a1-1-101)

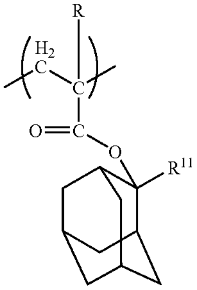

[In the formulas, R represents a hydrogen atom, an alkyl group of 1 to 5 carbon atoms or a halogenated alkyl group of 1 to 5 carbon atoms; each $R^{55}$ and $R^{11}$ independently represents a linear alkyl group of 1 to 5 carbon atoms; and $R^{54}$ represents a group which forms an aliphatic polycyclic group together with the carbon atom bonded to the $R^{54}$ group.]

In general formula (a1-1-01), R is the same as defined for R in general formula (a1-0-1) shown above.

In general formula (a1-1-01) above, as the aliphatic polycyclic group formed by $R^{54}$ and the carbon atom to which $R^{54}$ is bonded, the same aliphatic cyclic groups as those described above for the aforementioned tertiary alkyl ester-type acid dissociable, dissolution inhibiting group and which are polycyclic can be used.

Further, it is preferable that the component (A1) include, as the structural unit (a1), at least one member selected from the group consisting of a structural unit represented by general formula (a1-0-11) shown below, a structural unit represented by general formula (a1-0-12) shown below, and a structural unit represented by general formula (a1-0-2) shown below.

[Chemical Formula 26]

(a1-0-11)

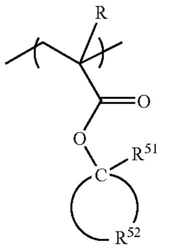

(a1-0-12)

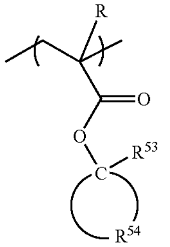

(a1-0-2)

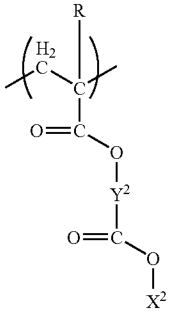

[In the formulas, R represents a hydrogen atom, an alkyl group of 1 to 5 carbon atoms or a halogenated alkyl group of 1 to 5 carbon atoms; $R^{51}$ represents an alkyl group; $R^{52}$ represents a group which forms an aliphatic monocyclic group with the carbon atom to which $R^{52}$ is bonded; $R^{53}$ represents a branched alkyl group; $R^{54}$ is the same as defined above for $R^{54}$ in general formula (a1-1-01); $Y^2$ represents a divalent linking group; and $X^2$ represents an acid dissociable, dissolution inhibiting group.]

In the formulas, R, $Y^2$ and $X^2$ are the same as defined above.

In general formula (a1-0-11), as the alkyl group for $R^{51}$, the same alkyl groups as those described above for $R^{14}$ in formulas (1-1) to (1-9) can be used, preferably a methyl group or an ethyl group, and most preferably an ethyl group.

As the aliphatic monocyclic group formed by $R^{52}$ and the carbon atoms to which $R^{52}$ is bonded, the same aliphatic cyclic groups as those described above for the aforementioned tertiary alkyl ester-type acid dissociable, dissolution inhibiting group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ethereal oxygen atom (—O—).

Further, the monocycloalkane may have a substituent such as a lower alkyl group, a fluorine atom or a fluorinated alkyl group.

As an examples of $R^{52}$ constituting such an aliphatic cyclic group, a linear alkylene group which may have an ethereal oxygen atom (—O—) interposed between the carbon atoms can be given.

Specific examples of structural units represented by general formula (a1-0-11) include structural units represented by the aforementioned formulas (a1-1-16) to (a1-1-23). Among these, a structural unit represented by general formula (a1-1-02) shown below which includes the structural units represented by the aforementioned formulas (a1-1-16), (a1-1-17) and (a1-1-20) to (a1-1-23) is preferable. Further, a structural unit represented by general formula (a1-1-02') shown below is also preferable.

In the formulas shown below, h is preferably 1 or 2, and most preferably 2.

[Chemical Formula 27]

(a1-1-02)

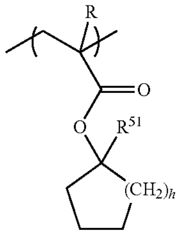

(a1-1-02')

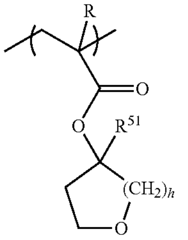

(In the formulas, R represents a hydrogen atom, an alkyl group of 1 to 5 carbon atoms or a halogenated alkyl group of 1 to 5 carbon atoms; $R^{51}$ represents an alkyl group; and h represents an integer of 1 to 3.)

In the formulas, R and $R^{51}$ are the same as defined above.

In general formula (a1-0-12), as the branched alkyl group for $R^{53}$, the same alkyl groups as those described above for $R^{14}$ in formulas (1-1) to (1-9) which are branched can be used, and an isopropyl group is particularly desirable.

$R^{54}$ is the same as defined above for $R^{54}$ in formula (a1-1-01).

Specific examples of structural units represented by general formula (a1-0-12) include structural units represented by the aforementioned formulas (a1-1-26) to (a1-1-31).

Examples of structural units represented by general formula (a1-0-2) include structural units represented by the aforementioned formulas (a1-3) and (a1-4), and a structural unit represented by formula (a1-3) is preferable.

As a structural unit represented by general formula (a1-0-2), those in which $Y^2$ is a group represented by the aforementioned formula -A-O—B— or -A-C(=O)—O—B— is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 28]

(a1-3-01)

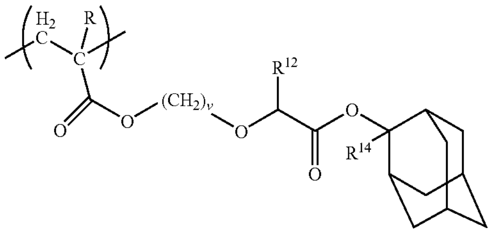

(In the formula, R represents a hydrogen atom, an alkyl group of 1 to 5 carbon atoms or a halogenated alkyl group of 1 to 5 carbon atoms; $R^{14}$ represents an alkyl group; $R^{12}$ represents a hydrogen atom or a methyl group; and v represents an integer of 1 to 10.)

[Chemical Formula 29]

(a1-3-02)

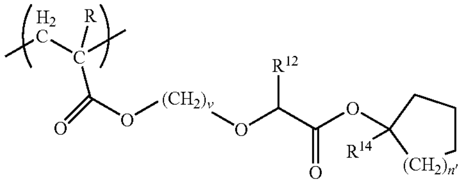

(In the formula, R represents a hydrogen atom, an alkyl group of 1 to 5 carbon atoms or a halogenated alkyl group of 1 to 5 carbon atoms; $R^{14}$ represents an alkyl group; $R^{12}$ represents a hydrogen atom or a methyl group; v represents an integer of 1 to 10; and n' represents an integer of 0 to 3.)

[Chemical Formula 30]

(a1-3-03)

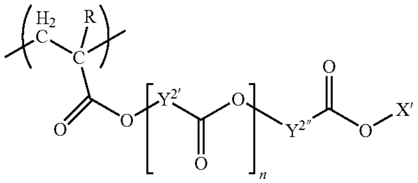

[In the formula, R represents a hydrogen atom, an alkyl group of 1 to 5 carbon atoms or a halogenated alkyl group of 1 to 5 carbon atoms; each of $Y^{2'}$ and $Y^{2''}$ independently represents a divalent linking group; X' represents an acid dissociable, dissolution inhibiting group; and n represents an integer of 0 to 3.]

In general formulas (a1-3-01) to (a1-3-03) above, R is the same as defined for R in general formula (a1-0-1) shown above, and $R^{14}$ is the same alkyl group as defined above for $R^{14}$ in formulas (1-1) to (1-9).

In general formulas (a1-3-01) and (a1-3-02), $R^{12}$ is preferably a hydrogen atom.

v is preferably an integer of 1 to 8, more preferably an integer of 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable. Among these, a structural unit represented by general formula (a1-3-03-1) is preferable, and a structural unit represented by the aforementioned formula (a1-3-29) or (a1-3-30) is particularly desirable.

[Chemical Formula 31]

(a1-3-03-1)

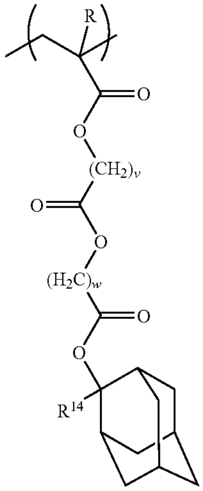

-continued (a1-3-03-2)

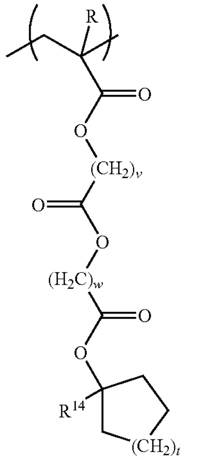

[In the formulas, R represents a hydrogen atom, an alkyl group of 1 to 5 carbon atoms or a halogenated alkyl group of 1 to 5 carbon atoms; $R^{14}$ represents an alkyl group; v represents an integer of 1 to 10; w represents an integer of 1 to 10; and t represents an integer of 0 to 3.]

In general formulas (a1-3-03-1) and (a1-3-03-2) above, R is the same as defined for R in general formula (a1-0) shown above, and $R^{14}$ is the same alkyl group as defined above for $R^{14}$ in formulas (1-1) to (1-9).

v is preferably an integer of 1 to 5, and most preferably 1 or 2.

w is preferably an integer of 1 to 5, and most preferably 1 or 2.

t is preferably an integer of 1 to 3, and most preferably 1 or 2.

In the component (A1), the amount of the structural unit (a1) based on the combined total of all structural units constituting the component (A1) is preferably 10 to 80 mol %, more preferably 20 to 70 mol %, and still more preferably 25 to 65 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and cyclic aliphatic hydrocarbon groups (cyclic groups). The cyclic group may be either a monocyclic group or a polycyclic group, and can be selected appropriately from the multitude of groups that have been proposed for the resins of resist compositions designed for use with ArF excimer lasers. The cyclic group is preferably a polycyclic group, and preferably has 7 to 30 carbon atoms.

Of the various possibilities, structural units derived from an acrylate ester that include an aliphatic polycyclic group that contains a hydroxyl group, a cyano group, a carboxyl group or a hydroxyalkyl group in which part of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 32]

(a3-1)

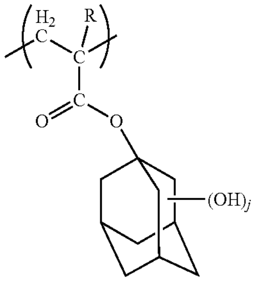

(a3-2)

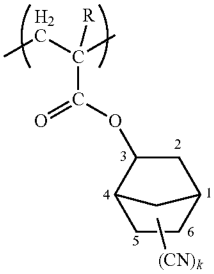

(a3-3)

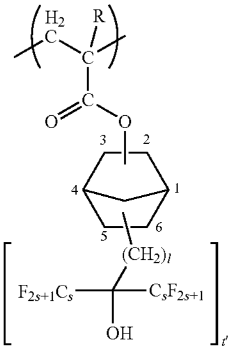

(In the formulas, R represents a hydrogen atom, an alkyl group of 1 to 5 carbon atoms or a halogenated alkyl group of 1 to 5 carbon atoms; j is an integer of 1 to 3; k is an integer of 1 to 3; t' is an integer of 1 to 3; 1 is an integer of 1 to 5; and s is an integer of 1 to 3.)

In general formulas (a3-1) to (a3-3), R is the same as defined for R in general formula (a1-0-1) above.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In general formula (a3-2), k is preferably 1. The cyano group is preferably bonded to the 5th or 6th position of the norbornyl group.

In general formula (a3-3), t' is preferably 1. 1 is preferably 1. s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also have a structural unit other than the above-mentioned structural units (a0), (a1) and (a3), as long as the effects of the present invention are not impaired.

As such a structural unit, any other structural unit which cannot be classified as one of the above structural units (a0), (a1) and (a3) can be used without any particular limitations, and any of the multitude of conventional structural units used within resist resins for ArF excimer lasers or KrF excimer lasers (and particularly for ArF excimer lasers) can be used Examples of other structural units include a structural unit (a2) is a structural unit derived from an acrylate ester containing a lactone-containing cyclic group, and a structural unit (a4) derived from an acrylate ester containing a non-acid-dissociable aliphatic polycyclic group.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 33]

(a2-1)

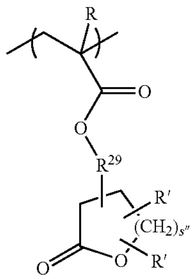

(a2-2)

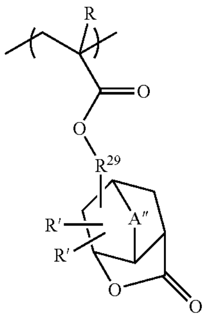

(a2-3)

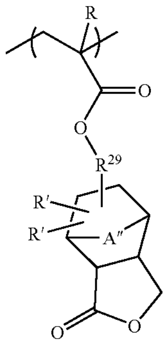

(a2-4)

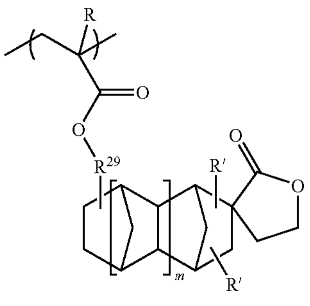

-continued (a2-5)

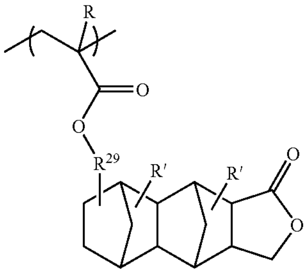

[In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents an integer of 0 or 1.]

In general formulas (a2-1) to (a2-5), R is the same as defined above for R in the structural unit (a1).

As examples of alkyl group of 1 to 5 carbon atoms, an alkoxy group of 1 to 5 carbon atoms or —COOR" for R', the same alkyl groups, alkoxy groups and —COOR" as those described above for $R^8$ in general formula (3-1) can be given. In terms of industrial availability, R' is preferably a hydrogen atom.

As examples of A", the same groups as those described above for A' in general formula (3-1) can be given.

$R^{29}$ represents a single bond or a divalent linking group. Examples of divalent linking groups include the same divalent linking groups as those described above for $R^2$ in general formula (a0-1). Among these, an alkylene group, an ester bond (—C(═O)—O—) or a combination thereof is preferable. The alkylene group as a divalent linking group for $R^{29}$ is preferably a linear or branched alkylene group. Specific examples include the same linear alkylene groups and branched alkylene groups as those described above for $R^2$.

s" is preferably an integer of 1 to 2.

Specific examples of structural units represented by general formulas (a2-1) to (a2-5) above are shown below. In the formulas shown below, $R^\alpha$ represents a hydrogen atom, a methyl group or a trifluoromethyl group.

[Chemical Formula 34]

(a2-1-1)

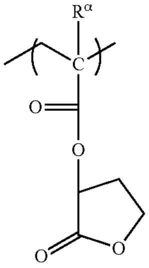

-continued (a2-1-2)

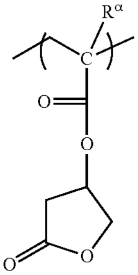

(a2-1-3)

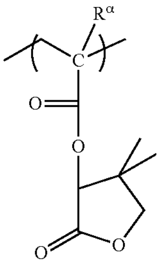

(a2-1-4)

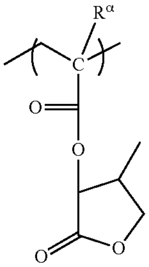

(a2-1-5)

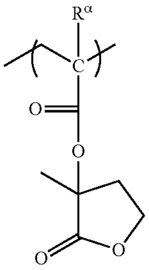

(a2-1-6)

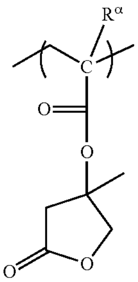

-continued
(a2-1-7)
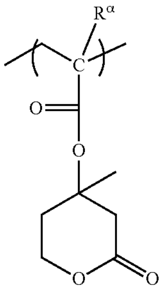
(a2-1-8)
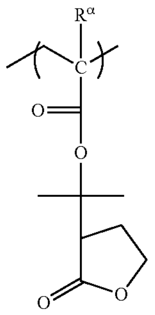
(a2-1-9)
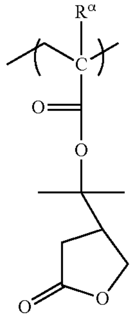
(a2-1-10)
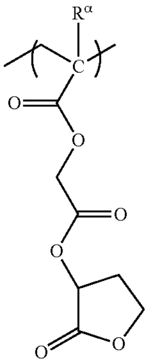
-continued
(a2-1-11)
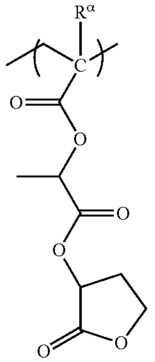
(a2-1-12)
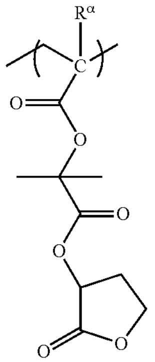
(a2-1-13)
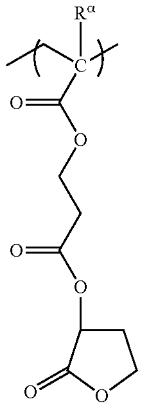
[Chemical Formula 35]
(a2-2-1)
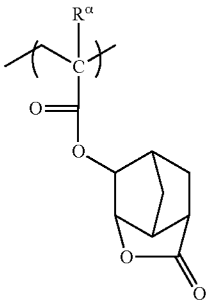

-continued
(a2-2-2)
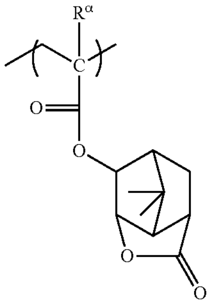
(a2-2-3)
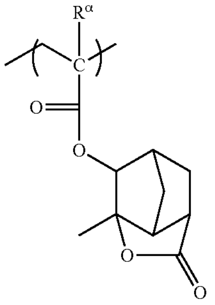
(a2-2-4)
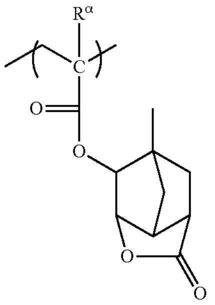
(a2-2-5)
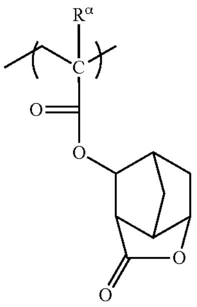
(a2-2-6)
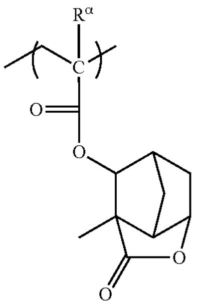
-continued
(a2-2-7)
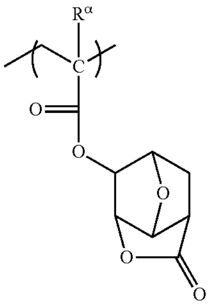
(a2-2-8)
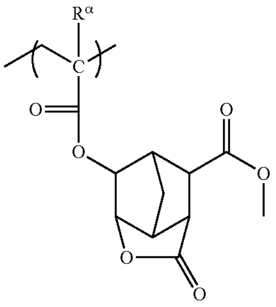
(a2-2-9)
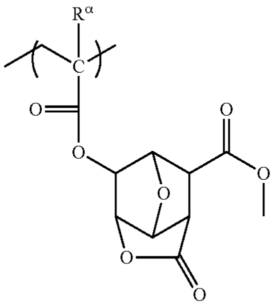
(a2-2-10)
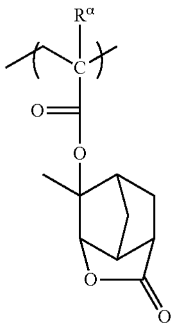
(a2-2-11)
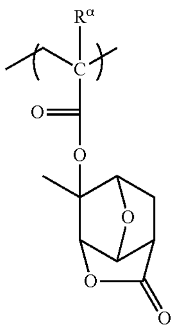

-continued
(a2-2-12)
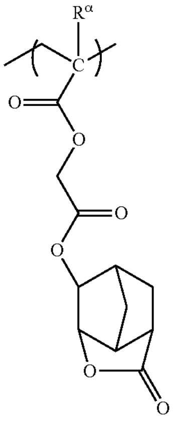
(a2-2-13)
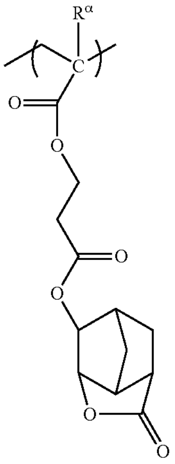
(a2-2-14)
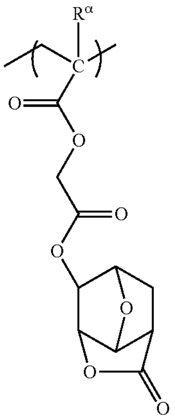
-continued
(a2-2-15)
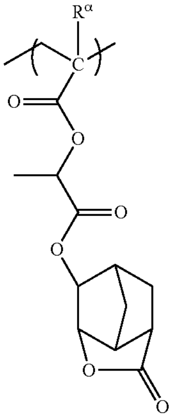
(a2-2-16)
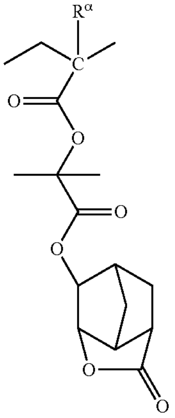
(a2-2-17)
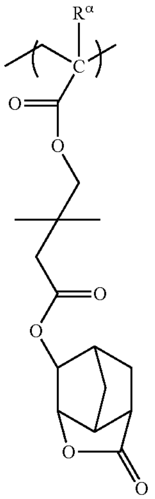

-continued
[Chemical Formula 36]
(a2-3-1)
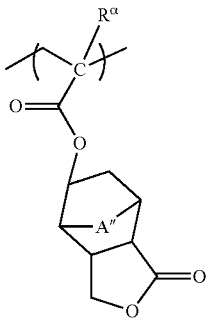
(a2-3-2)
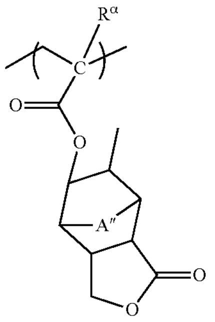
(a2-3-3)
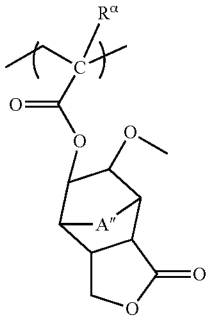
(a2-3-4)
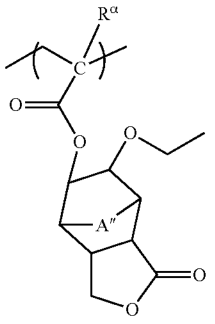
-continued
(a2-3-5)
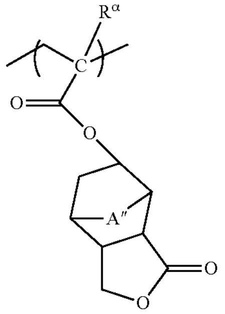
[Chemical Formula 37]
(a2-4-1)
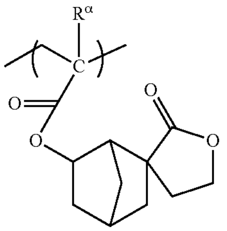
(a2-4-2)
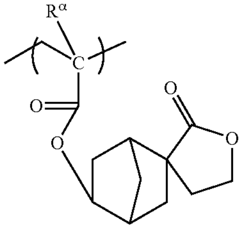
(a2-4-3)
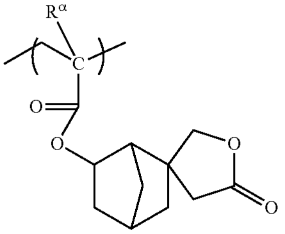
(a2-4-4)
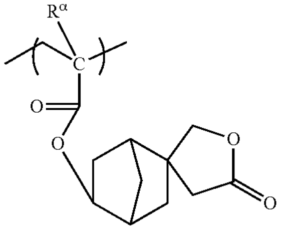
(a2-4-5)
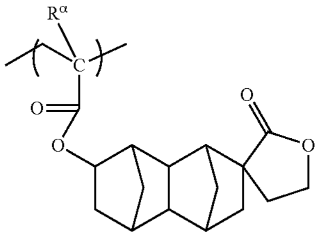

-continued
(a2-4-6)
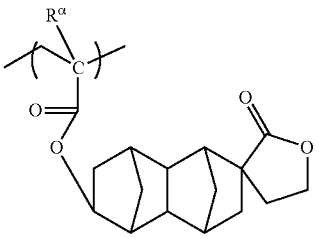
(a2-4-7)
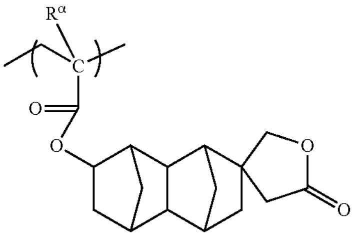
(a2-4-8)
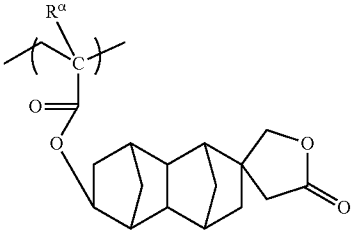
(a2-4-9)
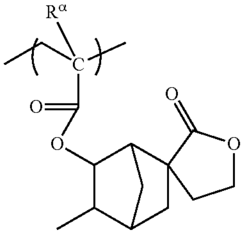
(a2-4-10)
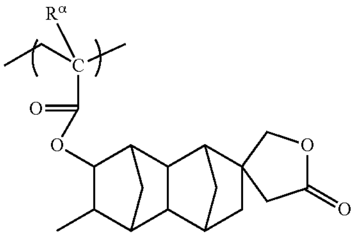
(a2-4-11)
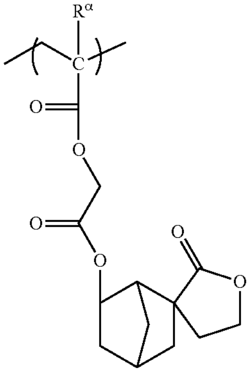
-continued
(a2-4-12)
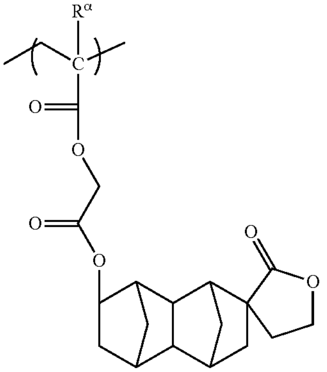
[Chemical Formula 38]
(a2-5-1)
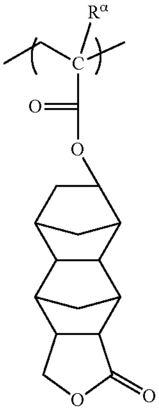
(a2-5-2)
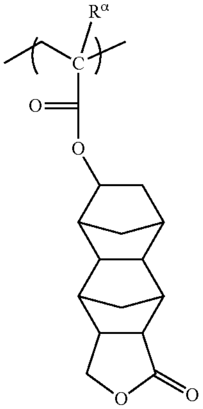
(a2-5-3)
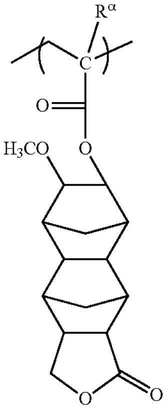

-continued (a2-5-4)

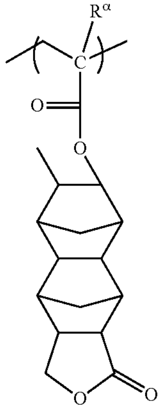

(a2-5-5)

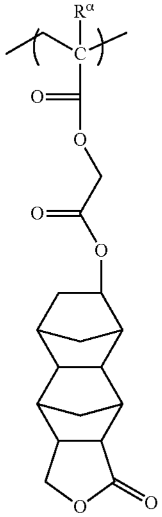

(a2-5-6)

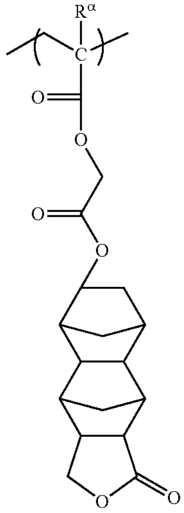

In the component (A1), as the structural unit (a2), one type of structural unit may be used alone, or two or more types of structural units may be used in combination.

In the present invention, it is particularly desirable that the component (A1) contain, as a structural unit (a2), at least one structural unit selected from the group consisting of a structural unit represented by general formula (a2-1) and a structural unit represented by general formula (a2-2).

In terms of improving the adhesion between a substrate and a resist film formed using a positive resist composition containing the component (A1) and increasing the compatibility with a developing solution, the amount of the structural unit (a2) within the component (A1), based on the combined total of all structural units constituting the component (A1) is preferably 1 to 50 mol %, more preferably 5 to 50 mol %, and still more preferably 10 to 45 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units. By ensuring the above-mentioned range, various lithography properties can be further improved.

Structural Unit (a4)

The structural unit (a4) is a structural unit derived from an acrylate ester containing a non-acid dissociable, aliphatic polycyclic group.

Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 39]

(a4-1)

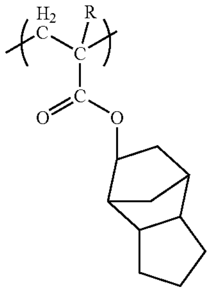

(a4-2)

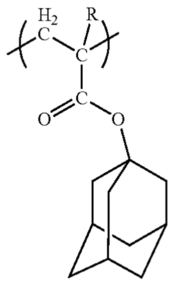

(a4-3)

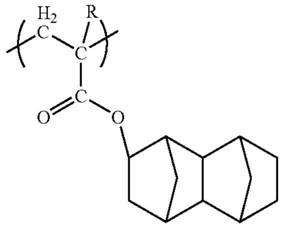

-continued (a4-4)

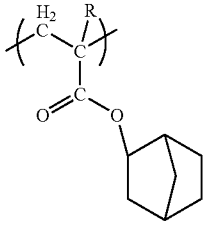

(a4-5)

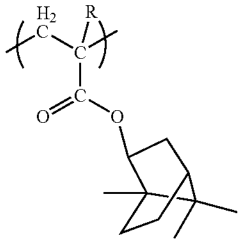

(In the formula, R represents a hydrogen atom, an alkyl group of 1 to 5 carbon atoms or a halogenated alkyl group of 1 to 5 carbon atoms.)

In general formulas (a4-1) to (a4-5), R is the same as defined for R in general formula (a1-0-1) above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The component (A1) is a polymeric compound including the structural unit (a0) and the structural unit (a1).

Examples of the component (A1) include a copolymer consisting of the structural units (0) and (a1), a copolymer consisting of the structural units (a0), (a1) and (a3), and a copolymer consisting of the structural units (a0), (a1) and (a2).

In the present invention, as the component (A1), a copolymer that includes a combination of structural units such as that shown below (polymeric compounds (A1-1) to (A1-5)) is particularly desirable.

[Chemical Formula 40]

POLYMERIC COMPOUND(A1-1)

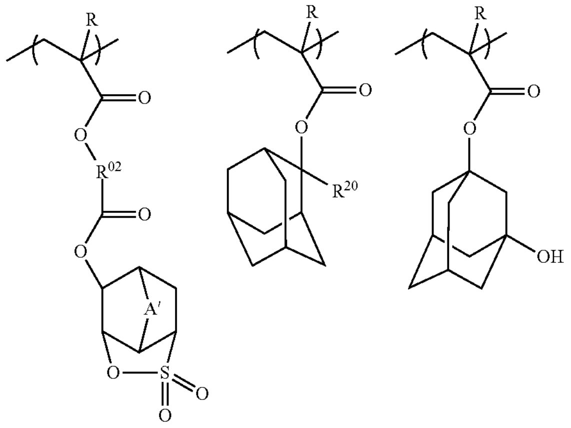

[In the formulas, R is the same as defined above for R in general formula (a0-1); $R^{02}$ is the same as defined above for $R^{02}$ in general formula (a0-1-11); A' is the same as defined above for A' in general formula (3-1); the plurality of R may be the same or different from each other; and $R^{20}$ represents an alkyl group, and examples thereof include the same alkyl groups as those described above for $R^{14}$.]

[Chemical Formula 41]

POLYMERIC COMPOUND(A1-2)

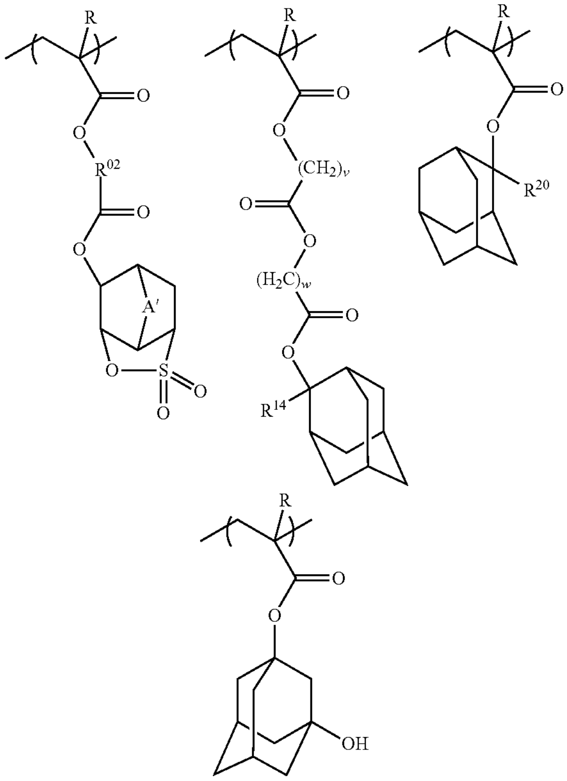

[In the formulas, R is the same as defined above for R in general formula (a0-1); $R^{02}$ is the same as defined above for $R^{02}$ in general formula (a0-1-11); A' is the same as defined above for A' in general formula (3-1); $R^{14}$ is the same as defined above for $R^{14}$ in general formulas (1-1) to (1-9); v and w are the same as defined above for v and w in general formula (a1-3-03-1); the plurality of R may be the same or different from each other; and $R^{20}$ represents an alkyl group, and examples thereof include the same alkyl groups as those described above for $R^{14}$.]

[Chemical Formula 42]

POLYMERIC COMPOUND (A1-3)

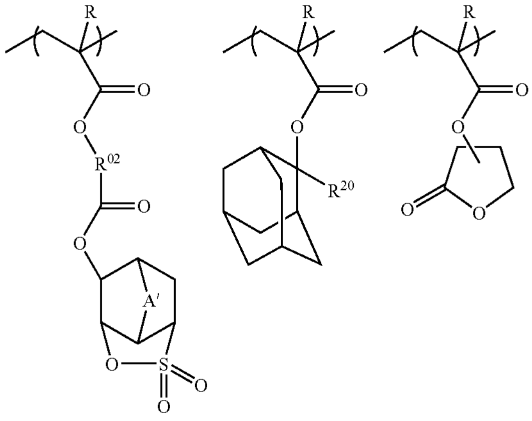

[In the formulas, R is the same as defined above for R in general formula (a0-1); $R^{02}$ is the same as defined above for $R^{02}$ in general formula (a0-1-11); A' is the same as defined above for A' in general formula (3-1); the plurality of R may be the same or different from each other; and $R^{20}$ represents an alkyl group, and examples thereof include the same alkyl groups as those described above for $R^{14}$.]

[Chemical Formula 43]

POLYMERIC COMPOUND (A1-4)

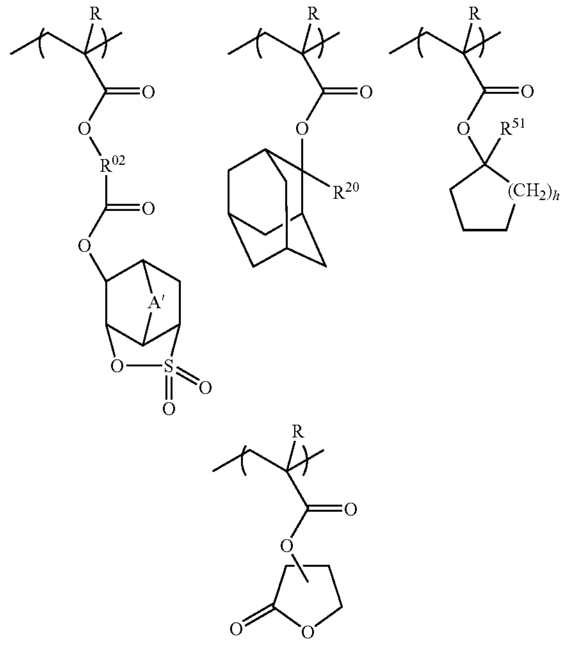

[In the formulas, R is the same as defined above for R in general formula (a0-1); $R^{02}$ is the same as defined above for $R^{02}$ in general formula (a0-1-11); A' is the same as defined above for A' in general formula (3-1); $R^{51}$ and h are the same as defined above for $R^{51}$ and h in general formula (a1-1-02); the plurality of R may be the same or different from each other; and $R^{20}$ represents an alkyl group, and examples thereof include the same alkyl groups as those described above for $R^{14}$.]

[Chemical Formula 44]

POLYMERIC COMPOUND (A1-5)

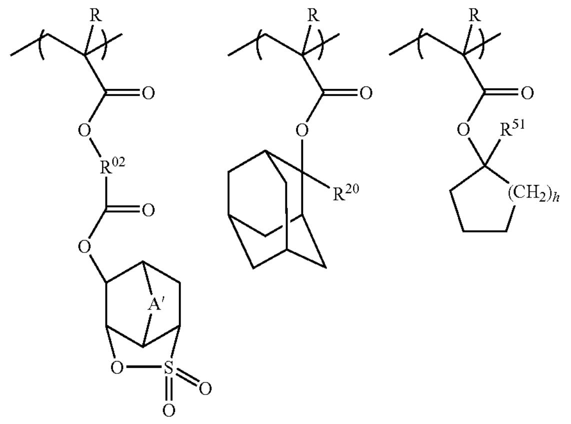

-continued

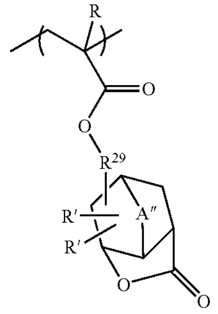

[In the formulas, R is the same as defined above for R in general formula (a0-1); $R^{02}$ is the same as defined above for $R^{02}$ in general formula (a0-1-11); A' is the same as defined above for A' in general formula (3-1); $R^{51}$ and h are the same as defined above for $R^{51}$ and h in general formula (a1-1-02); $R^{29}$, A" and R' are the same as defined above for $R^{29}$, A" and R' in general formula (a2-2); the plurality of R and R' may be the same or different from each other; and $R^{20}$ represents an alkyl group, and examples thereof include the same alkyl groups as those described above for $R^{14}$.]

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) in the component (A) is 25% by weight or more, various lithography properties are improved. Further, the solubility of the base material component (A) in an organic solvent can be improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as $HS—CH_2—CH_2—CH_2—C(CF_3)_2—OH$, a $—C(CF_3)_2—OH$ group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit (a0), a compound represented by general formula (a0-1-0) shown below (hereafter, referred to as "compound (a0-1-0)") can be used.

[Chemical Formula 45]

(a0-1-0)

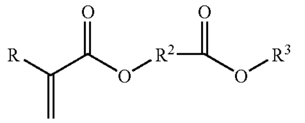

[In formula (a0-1-0), R, $R^2$ and $R^3$ are the same as defined above for R, $R^2$ and $R^3$ in general formula (a0-1).]

The method for producing the compound (a0-1-0) is not particularly limited, and the compound (a0-1-0) can be produced by a conventional method.

For example, in the presence of a base, a compound (X-2) represented by general formula (X-2) shown below is added to a solution obtained by dissolving a compound (X-1) represented by general formula (X-1) shown below in a reaction solvent, and a reaction is effected to thereby obtain a compound (a0-1-0).

Examples of the base include inorganic bases such as sodium hydride, $K_2CO_3$ and $Cs_2CO_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxyimide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

[Chemical Formula 46]

(X-1)

$R^3$—OH (X-2)

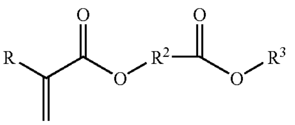

[In formulas (X-1) and (X-2), R, $R^2$ and $R^3$ are the same as defined above for R, $R^2$ and $R^3$ in general formula (a0-1).]

Further, the monomers for deriving the structural units represented by general formulas (a1-3-01) and (a1-3-02) above as the structural unit (a1) (hereafter, these monomers are collectively referred to as "monomers W") can be produced by a production method shown below.

Production method of monomer W:

A compound represented by general formula (X-6) shown below is added to a solution obtained by dissolving a compound represented by general formula (X-5) shown below in a reaction solvent, in the presence of a base, and a reaction is effected to obtain a compound represented by general formula (X-3) shown below (hereafter, referred to as "compound (X-3)"). Then, a compound represented by general formula (X-4) shown below is added to the resulting solution having the compound (X-3) dissolved therein, in the presence of a base, and a reaction is effected to thereby obtain a monomer W.

Examples of the base include inorganic bases such as sodium hydride, $K_2CO_3$ and $Cs_2CO_3$; and organic bases such as triethylamine, 4-dimethylaminopyridine (DMAP) and pyridine.

As the reaction solvent, any reaction solvent that is capable of dissolving the compound (X-5) and the compound (X-6) that serve as the raw materials can be used and specific examples include tetrahydrofuran (THF), acetone, dimethylformamide (DMF), dimethylacetamide, dimethylsulfoxide (DMSO) and acetonitrile.

[Chemical Formula 47]

(X-5)

$X^{13}$—A—OH (X-6)

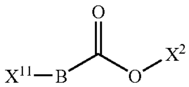

(X-3)

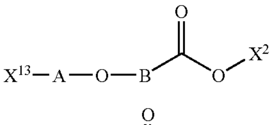

(X-4)

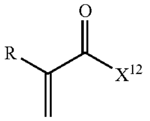

[In the formulas, R represents a hydrogen atom, an alkyl group of 1 to 5 carbon atoms or a halogenated alkyl group of 1 to 5 carbon atoms; each of A and B independently represents a divalent hydrocarbon group which may have a substituent; $X^2$ represents an acid dissociable, dissolution inhibiting group; each of $X^{13}$ and $X^{12}$ independently represents a hydroxyl group or a halogen atom, with the provision that either one of $X^{13}$ and $X^{12}$ represents a hydroxyl group and the other represents a halogen atom; and $X^{11}$ represents a halogen atom.]

In the formulas above, R is the same as defined above for R in general formula (a1-0), $X^2$ is the same as defined above for $X^2$ in general formula (a1-0-2), and A and B are the same as defined above for A and B described in connection with $R^2$ in general formula (a1-0).

Examples of halogen atoms for $X^{13}$, $X^{11}$ and $X^{12}$ include a bromine atom, a chlorine atom, an iodine atom and a fluorine atom.

As the halogen atom for $X^{13}$ or $X^{12}$, in terms of reactivity, a chlorine atom or a bromine atom is preferable.

As $X^{11}$, in terms of reactivity, a bromine atom or a chlorine atom is preferable, and a bromine atom is particularly desirable.

[Component (A2)]

The positive resist composition of the present invention may include a base material component which exhibits increased solubility in an alkali developing solution under action of acid other than the component (A1) (hereafter, referred to as "component (A2)") as the component (A).

The component (A2) is not particularly limited, and any of the multitude of conventional base material components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a4) can be used. Further, the component (A2) may contain a non-polymer (low molecular weight compound) having a molecular weight of 500 to less than 4,000.

(Low Molecular Weight Compound)

In the positive resist composition of the present invention, as a low molecular weight compound, a low molecular weight compound that has a molecular weight of at least 500 and less than 2,000, contains an acid dissociable, dissolution inhibiting group described above in connection with the structural unit (a1), and also contains a hydrophilic group is preferable. Specific examples include compounds containing a plurality of phenol skeletons in which a part of the hydrogen atoms within hydroxyl groups have been substituted with the aforementioned acid dissociable, dissolution inhibiting groups.

Preferable examples of the low molecular weight compound include low molecular weight phenolic compounds that are known, for example, as sensitizers or heat resistance improvers for use in non-chemically amplified g-line or i-line resists, and in which a portion of the hydroxyl group hydrogen atoms have been substituted with the above-mentioned acid dissociable, dissolution inhibiting group, and any of these compounds may be used.

Specific examples of these low molecular weight phenolic compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenolic compound is not limited to these examples.

Also, there are no particular limitations on the acid dissociable, dissolution inhibiting group, and suitable examples include the groups described above.

As the component (A2), one type of resin may be used, or two or more types of resins may be used in combination.

In the positive resist composition of the present invention, as the component (A), one type may be used, or two or more types may be used in combination.

In the positive resist composition of the present invention, the amount of the component (A) can be appropriately adjusted depending on the thickness of the resist film to be formed, and the like, <Component (B)>

In the present invention, as the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 48]

(b-1)

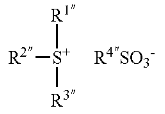

(b-2)

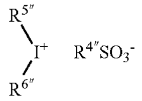

[In the formulas above, $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom in the formula; and $R^{4''}$ represents an alkyl group, a halogenated alkyl group, an aryl group or an alkenyl group which may have a substituent, with the proviso that at least one of $R^{1''}$ to $R^{3''}$ represents an aryl group, and at least one of $R^{5''}$ and $R^{6'}$ represents an aryl group.]

In general formula (b-1), $R^{1''}$ to $R^{3''}$ each independently represents an aryl group or an alkyl group. In general formula (b-1), two of $R^{1''}$ to $R^{3''}$ may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups, The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1''}$ to $R^{3''}$ in general formula (b-1) are bonded to each other to form a ring with the sulfur atom in the formula, it is preferable that the two of $R^{1''}$ to $R^{3''}$ form a 3- to 10-membered ring including the sulfur atom, and it is particularly desirable that the two of $R^{1''}$ to $R^{3''}$ form a 5- to 7-membered ring including the sulfur atom.

When two of $R^{1''}$ to $R^{3''}$ in general formula (b-1) are bonded to each other to form a ring with the sulfur atom in the formula, the remaining one of $R^{1''}$ to $R^{3''}$ is preferably an aryl group. As examples of the aryl group, the same as the above-mentioned aryl groups for $R^{1''}$ to $R^{3''}$ can be given.

As preferable examples of the cation moiety for the compound represented by general formula (b-1), those having a triphenylmethane skeleton represented by formulas (I-1-1) to (I-1-8) shown below can be given, Further, as the cation moiety for the onium salt acid generator, a cation moiety represented by formulas (I-1-9) and (I-1-10) shown below is also preferable. In formulas (I-1-9) and (I-1-10) shown below, each of $R^9$ and $R^{10}$ independently represents a phenyl group or naphthyl group which may have a substituent, an alkyl group of 1 to 5 carbon atoms, an alkoxy group or a hydroxyl group.

u represents an integer of 1 to 3, and is most preferably 1 or 2,

[Chemical Formula 49]

(I-1-1)

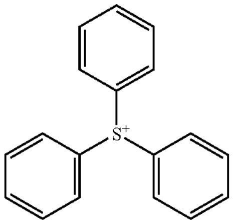

(I-1-2)

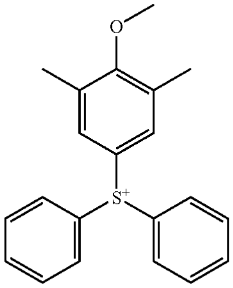

(I-1-3)

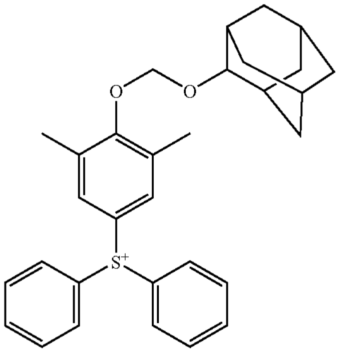

-continued (I-1-4)

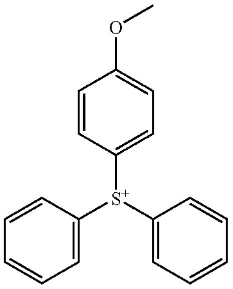

(I-1-5)

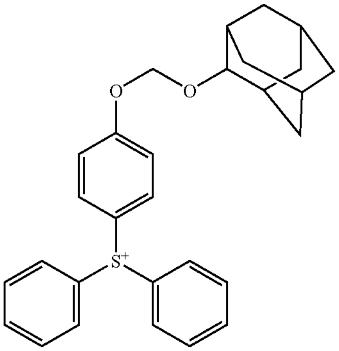

(I-1-6)

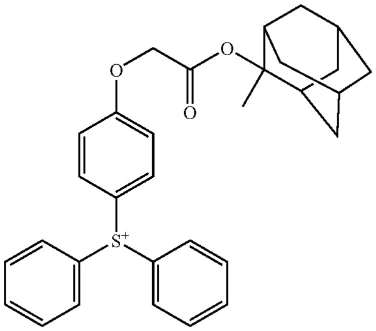

(I-1-7)

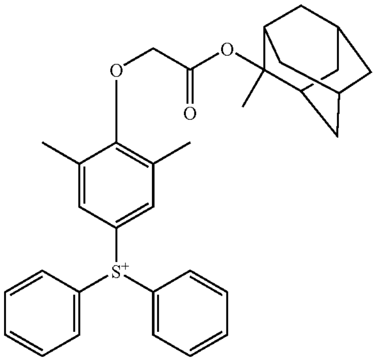

(I-1-8)

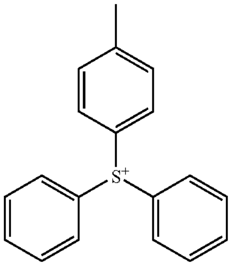

-continued (I-1-9)

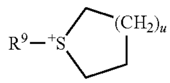

(I-1-10)

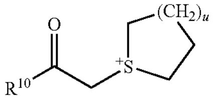

$R^{4''}$ represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include a halogen atom, a hetero atom, an alkyl group, and a group represented by the formula X-$Q^2$- (in the formula, $Q^2$ represents a divalent linking group containing an oxygen atom; and X represents a hydrocarbon group of 3 to 30 carbon atoms which may have a substituent).

Examples of halogen atoms and alkyl groups as substituents for $R^{4''}$ include the same halogen atoms and alkyl groups as those described above with respect to the halogenated alkyl group for $R^{4''}$.

Examples of the hetero atom include an oxygen atom, a nitrogen atom, and a sulfur atom, In the group represented by formula X-$Q^2$-, $Q^2$ represents a divalent linking group containing an oxygen atom, $Q^2$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—(=O)—NH—), a carbonyl group (—C(=O)—) and a carbonate group (—O—C(=O)—O—); and combinations of the aforementioned non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—$CH_2$—]; alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; alkylethylene groups such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; alkyltrimethylene groups such as —$CH(CH_3)CH_2CH_2$— and —$CH_2CH(CH_3)CH_2$—; a tetramethylene group [—$CH_2CH_2CH_2CH_2$—]; alkyltetramethylene groups such as —$CH(CH_3)CH_2CH_2CH_2$— and —$CH_2CH(CH_3)CH_2CH_2$—; and a pentamethylene group [—$CH_2CH_2CH_2CH_2CH_2$—].

$Q^2$ is preferably a divalent linking group containing an ester bond or an ether bond, and more preferably a group of —$R^{91}$—O—, —$R^{92}$—O—C(=O)— or —C(=O)—O—$R^{93}$—O—C(=O)—.

In the group represented by the formula X-$Q^2$-, the hydrocarbon group for X may be either an aromatic hydrocarbon group or an aliphatic hydrocarbon group.

The aromatic hydrocarbon group is a hydrocarbon group having an aromatic ring, The aromatic hydrocarbon ring preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=)—NH—, —NH— (the H may be replaced with a substituent such as an alkyl group or an acyl group), —S—, —$S(=O)_2$— and —$S(=O)_2$—O—. When the aliphatic hydrocarbon group is cyclic, the aliphatic hydrocarbon group may contain any of these substituent groups in the ring structure.

Examples of the substituent group for substituting a part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable, Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable, The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms, As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable, When the aliphatic cyclic group contains a hetero atom-containing substituent group in the ring structure thereof, the hetero atom-containing substituent group is preferably —O—, —C(O)—O—, —S—, —$S(=O)_2$— or —$S(=O)_2$—O—. Specific examples of such aliphatic cyclic groups include groups represented by formulas (L1) to (L5) and (S1) to (S4) shown below.

[Chemical Formula 50]

(L1)

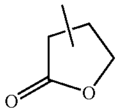

(L2)

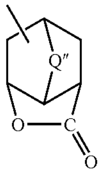

(L3)

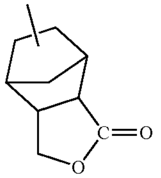

(L4)

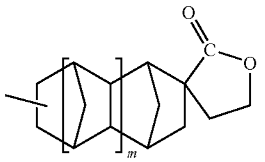

(L5)

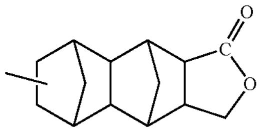

(S1)

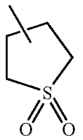

(S2)

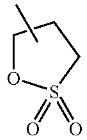

(S3)

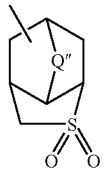

(S4)

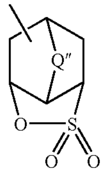

[In the formula, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents an integer of 0 or 1.]

In the formulas, as the alkylene group for Q", $R^{o}$ and $R^{95}$, the same alkylene groups as those described above for $R^{91}$ to $R^{93}$ can be used.

In these aliphatic cyclic groups, a part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting a part or all of the hydrogen atoms can be used.

Among the examples described above, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

Further, in the present invention, X preferably has a structure similar to that of the $R^3$ group within the structural unit (a0) for the component (A1), and a group having a polar portion is particularly desirable, because it results in improved lithographic properties and resist pattern shape.

Specific examples of X having a polar moiety include those in which a part of the carbon atoms constituting the aliphatic hydrocarbon group for X is substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, $—S(=O)_2—$ and $—S(=O)_2—O—$.

In the present invention, $R^{4"}$ preferably has X-$Q^2$- as a substituent. In this case, $R^{4"}$ is preferably a group represented by formula X-$Q^2$-$Y^3$— [in the formula, $Q^2$ and X are the same as defined above; and $Y^3$ represents an alkylene group of 1 to 4 carbon atoms which may have a substituent, or a fluorinated alkylene group of 1 to 4 carbon atoms which may have a substituent].

In the group represented by the formula X-$Q^2$-$Y^3$—, as the alkylene group for $Y^3$, the same alkylene group as those described above for $Q^2$ in which the number of carbon atoms is 1 to 4 can be used, As the fluorinated alkylene group for $Y^3$, the aforementioned alkylene group in which part or all of the hydrogen atoms has been substituted with fluorine atoms can be used.

Specific examples of $Y^3$ include $—CF_2—$, $—CF_2CF_2—$, $—CF_2CF_2CF_2—$, $—CF(CF_3)CF_2—$, $—CF(CF_2CF_3)—$, $—C(CF_3)_2—$, $—CF_2CF_2CF_2CF_2—$, $—CF(CF_3)CF_2CF_2—$, $—CF_2CF(CF_3)CF_2—$, $—CF(CF_3)CF(CF_3)—$, $—C(CF_3)_2CF_2—$, $—CF(CF_2CF_3)CF_2—$, $—CF(CF_2CF_2CF_3)—$, $—C(CF_3)(CF_2CF_3)—$; —CHF—, $—CH_2CF_2—$, $—CH_2CH_2CF_2—$, $—CH_2CF_2CF_2—$; $—CH(CF_3)CH_2—$, $—CH(CF_2CF_3)—$, $—C(CH_3)(CF_3)—$, $—CH_2CH_2CH_2CF_2—$, $—CH_2CH_2CF_2CF_2—$, $—CH(CF_3)CH_2CH_2—$, $—CH_2CH(CF_3)CH_2—$, $—CH(CF_3)CH(CF_3)—$, $—C(CF_3)_2CH_2—$; $—CH_2—$, $—CH_2CH_2—$, $—CH_2CH_2CH_2—$, $—CH(CH_3)CH_2—$, $—CH(CH_2CH_3)—$, $—C(CH_3)_2—$, $—CH_2CH_2CH_2CH_2—$, $—CH(CH_3)CH_2CH_2—$, $—CH_2CH(CH_3)CH_2—$, $—CH(CH_3)CH(CH_3)—$, $—C(CH_3)_2CH_2—$, $—CH(CH_2CH_3)CH_2—$, $—CH(CH_2CH_2CH_3)—$, and $—C(CH_3)(CH_2CH_3)—$.

$Y^3$ is preferably a fluorinated alkylene group, and particularly preferably a fluorinated alkylene group in which the carbon atom bonded to the adjacent sulfur atom is fluorinated. Examples of such fluorinated alkylene groups include $—CF_2—$, $—CF_2CF_2—$, $—CF_2CF_2CF_2—$, $—CF(CF_3)CF_2—$, $—CF_2CF_2CF_2CF_2—$, $—CF(CF_3)CF_2CF_2—$, $—CF_2CF(CF_3)CF_2—$, $—CF(CF_3)CF(CF_3)—$, $—C(CF_3)_2CF_2—$, $—CF(CF_2CF_3)CF_2—$; $—CH_2CF_2—$, $—CH_1CH_2CF_2—$, $CH_2CF_2CF_2—$; $—CH_2CH_2CH_2CF_2—$, $—CH_2CH_2CF_2CF_2—$, and $—CH_2CF_2CF_2CF_2—$.

Of these, $—CF_2—$, $—CF_2CF_2—$, $—CF_2CF_2CF_2—$ or $CH_2CF_2CF_2—$ is preferable, $—CF_2—$, $—CF_2CF_2—$ or $—CF_2CF_2CF_2—$ is more preferable, and $—CF_2—$ is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms, Examples of substituents which the alkylene group or fluorinated alkylene group may have include an alkyl group of 1 to 4 carbon atoms, an alkoxy group of 1 to 4 carbon atoms, and a hydroxyl group.

In general formula (b-2), $R^{5''}$ and $R^{6''}$ each independently represent an aryl group or an alkyl group. At least one of $R^{5''}$ and $R^{6''}$ represents an aryl group. It is preferable that both of $R^{5''}$ and $R^{6''}$ represent an aryl group.

As the aryl group for $R^{5''}$ and $R^{6''}$, the same as the aryl groups for $R^{1''}$ to $R^{3''}$ can be used.

As the alkyl group for $R^{5''}$ and $R^{6''}$, the same as the alkyl groups for $R^{1''}$ to $R^{3''}$ can be used.

It is particularly desirable that both of $R^{5''}$ and $R^{6''}$ represents a phenyl group, As $R^{4''}$ in general formula (b-2), the same groups as those mentioned above for $R^{4''}$ in general formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(5,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate, It is also possible to use onium salts in which the anion moiety of these onium salts are replaced by an allcylsulfonate such as methanesulfonate, n-propanesulfonate, n-butanesulfonate, or n-octanesulfonate.

Furthermore, onium salts in which the anion moiety of these onium salts is replaced by an anion moiety represented by any one of formulas (b1) to (b8) shown below can also be used,

[Chemical Formula 51]

(b1)

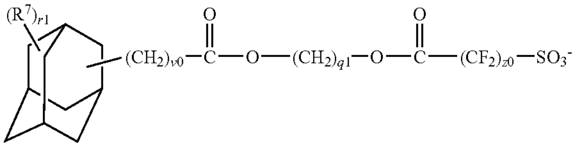

(b2)

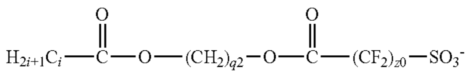

(b3)

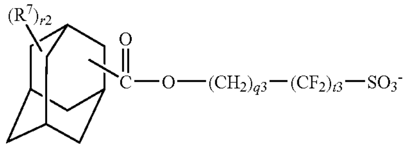

(b4)

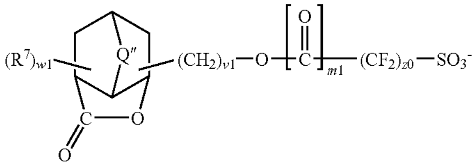

-continued (b5)

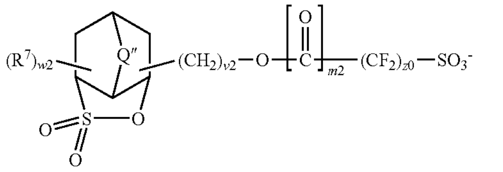

(b6)

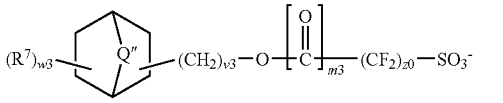

(b7)

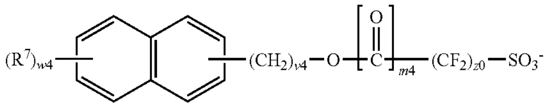

(b8)

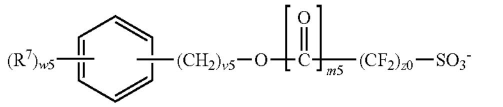

[In the formulas, z0 represents an integer of 1 to 3; each of $q1$ and $q2$ independently represents an integer of 1 to 5; $q3$ represents an integer of 1 to 12; $t3$ represents an integer of 1 to 3; each of $r1$ and $r2$ independently represents an integer of 0 to 3; i represents an integer of 1 to 20; $R^7$ represents a substituent; each of $m1$ to $m5$ independently represents 0 or 1; each of $v0$ to $v5$ independently represents an integer of 0 to 3; each of $w1$ to $w5$ independently represents an integer of 0 to 3; and Q" is the same as defined above.]

As the substituent for $R^7$, the same groups as those which the aforementioned aliphatic hydrocarbon group or aromatic hydrocarbon group for X may have as a substituent can be used If there are two or more of the $R^7$ group, as indicated by the values $r1$, $r2$, and $w1$ to $w5$, then the two or more of the $R^7$ groups may be the same or different from each other.

Further, onium salt-based acid generators in which the anion moiety in general formula (b-1) or (b-2) is replaced by an anion represented by general formula (b-3) or (b-4) shown below (the cation moiety is the same as (b-1) or (b-2)) may be used.

[Chemical Formula 52]

(b-3)

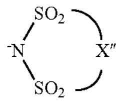

(b-4)

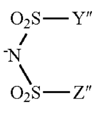

[In formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms, Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved, Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used

[Chemical Formula 53]

(b-5)

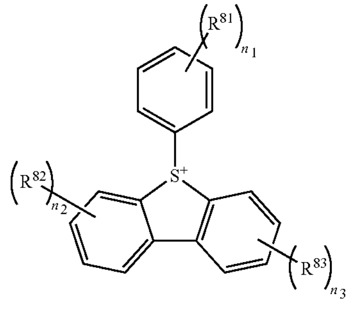

(b-6)

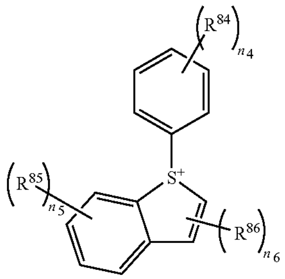

[In formulas, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.]

With respect to $R^{81}$ to $R^{86}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used, examples of such anion moieties include fluorinated alkylsulfonic acid ions such as anion moieties ($R^{4''}SO_3^-$) for onium salt-based acid generators represented by general formula (b-1) or (b-2) shown above; and anion moieties represented by general formula (b-3) or (b-4) shown above.

In the present description, an oximesulfonate acid generator is a compound having at least one group represented by general formula (B-1) shown below, and has a feature of generating acid by irradiation (exposure). Such oximesulfonate acid generators are widely used for a chemically amplified resist composition, and can be appropriately selected.

[Chemical Formula 54]

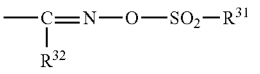

(B-1)

(In general formula (B-1), each of $R^{31}$ and $R^{32}$ independently represents an organic group.)

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below,

[Chemical Formula 55]

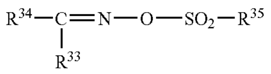

(B-2)

[In formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.]

[Chemical Formula 56]

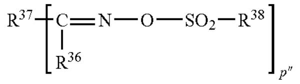

(B-3)

[In formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.]

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom.

Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3) above, as the alkyl group having no substituent and the halogenated alkyl group for $R^{36}$, the same alkyl group having no substituent and the halogenated alkyl group described above for $R^{33}$ can be used, Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-(p-toluenesulfonyloxyimino)-4-methoxyphenyl] acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 57]

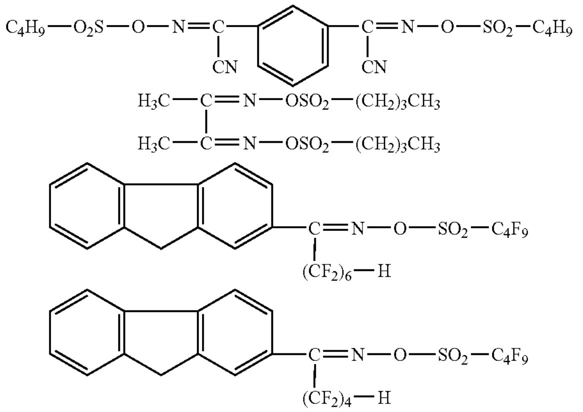

Of the aforementioned diazomethane acid generators, specific examples of suitable bisalkyl or bisaryl sulfonyl diazomethanes include bis(isopropylsulfonyl)diazomethane, bis (p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used, Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis (phenylsulfonyldiazomethylsulfonyl)butane, 1,6-bis(phenylsulfonyldiazomethylsulfonyl)hexane, 1,10-bis(phenylsulfonyliazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is preferable to use an onium salt-based acid generator having a fluorinated alkylsulfonic acid ion as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (F)>

In the present invention, the component (F) includes a fluorine-containing resin component having a structural unit (f1) represented by general formula (f1-0) shown below.

In the structural unit (f1), when acid is generated from the component (B) included in the positive resist composition of the present invention upon exposure, an acid dissociable, dissolution inhibiting group or an acid dissociable portion is dissociated by the action of the generated acid. As a result, the alkali solubility of the entire fluorine-containing resin component is increased.

[Chemical Formula 58]

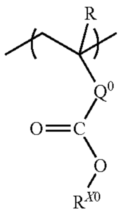

(f1-0)

[In formula (f1-0), R represents a hydrogen atom, an alkyl group of 1 to 5 carbon atoms or a halogenated alkyl group of 1 to 5 carbon atoms; $Q^0$ represents a single bond or a divalent linking group having a fluorine atom; $R^{X0}$ represents an acid dissociable, dissolution inhibiting group-containing group which may contain a fluorine atom, with the proviso that at least one fluorine atom is contained in formula (f1-0).]

(Structural unit (f1))

In general formula (f1-0) above, R represents a hydrogen atom, an alkyl group of 1 to 5 carbon atoms or a halogenated alkyl group of 1 to 5 carbon atoms, and is the same as defined above for R in relation to the component (A).

Specific examples of the alkyl group of 1 to 5 carbon atoms for R include linear or branched lower alkyl groups such as a methyl group, an ethyl group, a propyl group, an isopropyl group, an n-butyl group, an isobutyl group, a Cert-butyl group, a pentyl group, an isopentyl group and a neopentyl group.

Specific examples of the halogenated alkyl group of 1 to 5 carbon atoms for R include groups in which some or all of the hydrogen atoms in an aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

R is preferably a hydrogen atom, an alkyl group of 1 to 5 carbon atoms or a fluorinated alkyl group of 1 to 5 carbon atoms, more preferably a hydrogen atom or a methyl group, and most preferably a methyl group.

In general formula (f1-0) above, $Q^0$ represents a single bond or a divalent linking group having a fluorine atom.

A "divalent linking group having a fluorine atom" refers to a divalent linking group in which part or all of the hydrogen atoms have been substituted with a fluorine atom.

The divalent linking group for $Q^0$ may or may not have an acid dissociable portion in the structure thereof.

An "acid dissociable portion" refers to a portion within the structure of the $Q^0$ group which is dissociated from the group by the action of acid generated from the component (B) upon exposure. Specific examples of such acid dissociable portion include a portion that forms a cyclic or chain-like tertiary alkyl ester with the carboxyl group; and a portion in which one or more hydrogen atoms have been removed from a group bonded to the oxygen atom constituting the acetal structure of an acetal-type acid dissociable group such as an alkoxyalkyl group.

Preferable examples of the divalent linking group having a fluorine atom for $Q^0$ include a divalent hydrocarbon group containing a fluorine atom which may have a substituent other than the fluorine atom (hereafter, referred to as "Linking group ($Q^0$-1)"), and a divalent linking group having a fluorine atom which includes a hetero atom other than the fluorine atom (hereafter, referred to as "linking group ($Q^0$-2)"), Linking Group ($Q^0$-1)

With respect to $Q^0$ in the linking group ($Q^0$-1), the hydrocarbon group "has a substituent" means that part or all of the hydrogen atoms within the hydrocarbon group has been substituted with a group or an atom other than a hydrogen atom or a fluorine atom.

The hydrocarbon group may be either an aliphatic hydrocarbon group containing a fluorine atom or an aromatic hydrocarbon group containing a fluorine atom, An aliphatic hydrocarbon group refers to a hydrocarbon group that has no aromaticity. The aliphatic hydrocarbon group may be either saturated or unsaturated, but in general, the aliphatic hydrocarbon group is preferably saturated.

An aliphatic hydrocarbon group containing no fluorine atom and an aromatic hydrocarbon group containing no fluorine atom will be described below. $Q^0$ in the linking group ($Q^0$-1) represents an aliphatic hydrocarbon group or an aromatic hydrocarbon group in which at least one hydrogen atom has been substituted with a fluorine atom.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable, and specific examples include a methylene group [$-CH_2-$], an ethylene group [$-(CH_2)_2-$], a trimethylene group [$-(CH_2)_3-$], a tetramethylene group [$-(CH_2)_4-$] and a pentamethylene group [$-(CH_2)_5-$].

As the branched aliphatic hydrocarbon group, a branched alkylene group is preferable, and specific examples include alkylalkylene groups, e.g., alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$ and $-C(CH_2CH_3)_2-CH_2-$; alkyltrimethylene groups such as $-CH(CH_3)CH_2CH-$, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. As an example of a substituent, an oxygen atom (═O) can be given.

As examples of the hydrocarbon group containing a ring in the structure thereof; a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantine, norbornane, isobornane, tricyclodecane and tetracyclododecane.

The cyclic aliphatic hydrocarbon group may or may not have a substituent. Examples of the substituent include an alkyl group of 1 to 5 carbon atoms, and an oxygen atom (═O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, and an oxygen atom (═O).

Linking Group ($Q^0$-2)

With respect to the "divalent linking group containing a hetero atom" for $Q^0$, a hetero atom refers to an atom other than a carbon atom and a hydrogen atom, and examples thereof include an oxygen atom, a nitrogen atom, a sulfur atom, and a halogen atom other than a fluorine atom.

Specific examples of divalent linking groups containing a hetero atom include —O—, —C(═O)—, —C(═O)—O—, a carbonate bond (—O—C(═O)—O—), —NH—, —$NR^{04}$— (in the formula, $R^{04}$ represents a substituent such as an alkyl group or an acyl group), —NH—C(═O)—, ═N—, —S—, —S(═O)$_2$— and —S(═O)$_2$—O—.

Further, a combination of any one of these "divalent linking groups containing a hetero atom" with a divalent hydrocarbon group can also be used. As examples of the divalent hydrocarbon group, the same groups as those described above for the linking group ($Q^0$-1) and the linking group ($Q^0$-1) in which at least one hydrogen atom has been substituted with a fluorine atom can be given, and a linear or branched aliphatic hydrocarbon group which may have a fluorine atom is preferable.

In the —$NR^{04}$— group, $R^{04}$ represents a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

In the present invention, as the divalent linking group for $Q^0$, a linear or branched alkylene group having a fluorine atom, a divalent aliphatic cyclic group having a fluorine atom, or the linking group ($Q^0$-2) is preferable. Among these, the linking group ($Q^0$-2) is particularly desirable.

When $Q^0$ represents a fluorinated alkylene group, the alkylene group preferably has 1 to 10 carbon atoms, more preferably 1 to 6 carbon atoms, still more preferably 1 to 4 carbon atoms, and most preferably 1 to 3 carbon atoms. Specific examples of alkylene groups include the aforementioned linear alkylene groups and branched alkylene groups.

When $Q^0$ represents a divalent aliphatic cyclic group having a fluorine atom, as the aliphatic cyclic group, the same cyclic aliphatic hydrocarbon groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When $Q^0$ represents the linking group ($Q^0$-2), preferable examples of the linking group ($Q^0$-2) include —O—, —C(═O)—O—, —C(═O)—, —O—C(═O)—O—, —C(═O)—NH—, —$NR^{04}$— (in the formula, $R^{04}$ represents a substituent such as an alkyl group or an acyl group), —S—, —S(═O)$_2$—, —S(═O)$_2$—O—, a group represented by the formula: —O—$R^{08}$—, a group represented by the formula: —$R^{09}$—O—$R^{08}$—, and a group represented by the formula: —C(═O)—O—$R^{08}$—.

With respect to the group represented by the formula: —O—$R^{08}$—, group represented by the formula: —$R^{09}$—O—$R^{08}$— and group represented by the formula: —C(═O)—O—$R^{08}$—, $R^{08}$ represents a divalent hydrocarbon group containing a fluorine atom which may have a substituent other than the fluorine atom, and $R^{09}$ represents a divalent hydrocarbon group which may have a substituent other than a fluorine atom.

Examples of the divalent hydrocarbon groups for $R^{08}$ which may have a substituent when $R^{08}$ contains no fluorine atom include the same groups as those described above for the "linking group ($Q^0$-1)" usable as $Q^0$.

As $R^{08}$, a linear or branched aliphatic hydrocarbon group having a fluorine atom is preferable, and the aliphatic hydrocarbon group preferably has 1 to 5 carbon atoms.

Specific examples of preferable "—$R^{08}$—" include —$CH_2CF_2$—, —$CH(CH_3)CF_2$—, —$CH_2CF(CF_3)$—, —$CH(CH_3)CF(CF_3)$—, and —$CH(CH_2CH_3)CF_2$—, and of these, —$CH_2CF_2$—, $CH(CH_3)CF_2$—, and —$CH(CH_2CH_3)CF_2$— are particularly desirable.

As $R^{09}$, a linear or branched aliphatic hydrocarbon group is preferable, and a methylene group, an ethylene group or an alkyl methylene group is more preferable. The alkyl group within the alkyl methylene group is preferably a linear alkyl group of 1 to 5 carbon atoms, more preferably a linear alkyl group of 1 to 3 carbon atoms, and most preferably a methyl group.

In general formula (f1-0) above, $R^{X0}$ represents an acid dissociable, dissolution inhibiting group-containing group which may have a fluorine atom.

The term "acid dissociable, dissolution inhibiting group-containing group" is used as a generic term that includes acid dissociable, dissolution inhibiting groups and organic groups having an acid dissociable, dissolution inhibiting group.

An "acid dissociable, dissolution inhibiting group" is the same acid dissociable, dissolution inhibiting group as described in the aforementioned structural unit (a1), and refers to a group that is dissociated by the action of acid generated from the component (B) upon exposure, and is eliminated from the fluorine-containing resin component after exposure.

An "organic group having an acid dissociable, dissolution inhibiting group" refers to a group constituted of an acid dissociable, dissolution inhibiting group and a group or atom that is not dissociated by acid (i.e., a group or atom that is not dissociated by acid, and remains bonded to the fluorine-containing resin component even after the acid dissociable, dissolution inhibiting group has been dissociated).

The expression "acid dissociable, dissolution inhibiting group-containing group which may have a fluorine atom" means that part or all of the hydrogen atoms in the acid dissociable, dissolution inhibiting group-containing group may be substituted with a fluorine atom.

The acid dissociable, dissolution inhibiting group-containing group is not particularly limited as long as it is an organic group that is dissociable by the action of an acid, and examples thereof include a cyclic or chain-like tertiary alkyl ester-type acid dissociable, dissolution inhibiting group-containing group; a group containing an acetal-type acid dissociable, dissolution inhibiting group, such as an alkoxyalkyl group; and a divalent organic group having an acid dissociable portion.

Further, the acid dissociable, dissolution inhibiting group-containing group may include a "divalent linking group containing a hetero atom". As examples of the "divalent linking group containing a hetero atom", the same groups as the "divalent linking groups containing a hetero atom" described above for $R^2$ can be given, and preferable examples thereof include a group represented by the formula -A-C(=O)—O—. Here, A represents a divalent hydrocarbon group which may have a substituent, and is preferably a linear alkylene group.

Note that at least one fluorine atom is contained in general formula (f1-0) above.

Among the examples described above, the structural unit (f1) is preferably a structural unit represented by general formula (f1-01) shown below or a structural unit represented by general formula (f1-02) to be described later.

[Chemical Formula 59]

(f1-01)

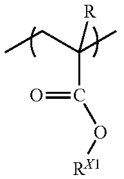

[In formula (f1-01), R represents a hydrogen atom, an alkyl group of 1 to 5 carbon atoms or a halogenated alkyl group of 1 to 5 carbon atoms; and $R^{X1}$ represents an acid dissociable, dissolution inhibiting group-containing group having a fluorine atom.]

Structural Unit Represented by General Formula (f1-01)

In general formula (f1-01) above, $R^{X1}$ represents a hydrogen atom, an alkyl group of 1 to 5 carbon atoms or a halogenated alkyl group of 1 to 5 carbon atoms, and is the same as defined for R in general formula (f1-0) above.

In general formula (f1-01) above, $R^{X1}$ represents an acid dissociable, dissolution inhibiting group-containing group having a fluorine atom.

Examples of $R^{X1}$ include the acid dissociable, dissolution inhibiting group-containing groups as those described above in relation to $R^{X0}$ which have a fluorine atom, As preferable examples of the structural units represented by general formula (f1-01) above, at least one structural unit selected from the group consisting of structural units represented by general formula (f1-01-1) shown below and structural units represented by general formula (f1-01-2) to be described later, can be given.

Structural Unit Represented by General Formula (f1-01-1)

[Chemical Formula 60]

(f1-01-1)

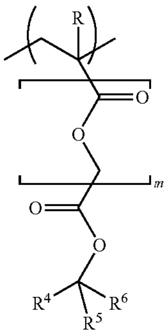

[In formula (f1-01-1) above, R represents a hydrogen atom, an alkyl group of 1 to 5 carbon atoms or a halogenated alkyl group of 1 to 5 carbon atoms; and each of $R^4$ to $R^6$ independently represents an alkyl group or a fluorinated alkyl group, provided that no fluorine atom within the fluorinated alkyl group is bonded to the carbon atom adjacent to the tertiary carbon atom having $R^4$ to $R^6$ bonded thereto, and at least one of $R^4$ to $R^6$ represents the aforementioned fluorinated alkyl group; $R^5$ and $R^6$ may be bonded to each other to form a ring structure; and m represents 0 or 1.]

In general formula (f1-01-1) above, R represents a hydrogen atom, an alkyl group of 1 to 5 carbon atoms or a halogenated alkyl group of 1 to 5 carbon atoms, and is the same as defined for R in general formula (f1-0) above, In formula (f1-01-1) above, each of $R^4$ to $R^6$ independently represents an alkyl group or a fluorinated alkyl group.

The alkyl group for $R^4$ to $R^6$ may be any of linear, branched or cyclic.

When the alkyl group is linear or branched, it is preferably an alkyl group of 1 to 5 carbon atoms, more preferably an ethyl group or a methyl group, and most preferably an ethyl group.

When the alkyl group is cyclic, it preferably has 4 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane; tricycloalkane or a tetracycloalkane. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

The fluorinated alkyl group represented by $R^4$ to $R^6$ is an alkyl group (excluding a methyl group) in which part or all of the hydrogen atoms have been substituted with a fluorine atom.

However, the fluorinated alkyl group is a group in which no fluorine atom is bonded to a carbon atom adjacent to the tertiary carbon atom having $R^4$ to $R^6$ bonded thereto.

With respect to the fluorinated alkyl group, the alkyl group prior to being fluorinated may be any of linear, branched or cyclic. When the alkyl group prior to being substituted is linear or branched, it preferably has 2 to 7 carbon atoms, more preferably 2 to 5 carbon atoms, and an n-butyl group is particularly desirable. When the alkyl group prior to being substituted is cyclic, examples of the alkyl group prior to being substituted include the same groups as those described above for the aforementioned "alkyl group for $R^4$ to $R^6$".

In the fluorinated alkyl group, it is preferable that a carbon atom having the fluorine atom bonded thereto is positioned remote from the tertiary carbon atom having $R^4$ to $R^6$ bonded thereto, and more preferably positioned at the terminal.

A preferable example of such a fluorinated alkyl group includes those in which all of the hydrogen atoms in the terminal methyl group have been substituted with a fluorine atom, such as 4,4,4-trifluoro-n-butyl group and 3,3,3-trifluoro-n-propyl group.

In general formula (f1-01-1) above, at least one of $R^4$ to $R^5$ represents the aforementioned fluorinated alkyl group.

Of the various possibilities, in the present invention, it is particularly desirable that one of $R^4$ to $R^6$ represent the aforementioned fluorinated alkyl group while the remaining two represent an alkyl group.

In general formula (f1-01-1) above, $R^5$ and $R^6$ may be bonded to each other to form a ring structure. In those cases where the terminals of $R^5$ and $R^6$ are bonded to form a ring structure, it is preferable that $R^5$ and $R^6$ not be fluorinated, and in such a case, $R^4$ represent the aforementioned fluorinated alkyl group. In such as case, as the cyclic alkyl group formed by $R^5$ and $R^6$, the same groups as those described above for the aforementioned "alkyl group for $R^4$ to $R^6$" can be mentioned.

In general formula (f1-01-1) above, m represents 0 or 1,

Specific examples of preferable structural units represented by general formula (f1-01-1) are shown below. In the formulas, R represents a hydrogen atom, an alkyl group of 1 to 5 carbon atoms or a halogenated alkyl group of 1 to 5 carbon atoms, and is the same as defined for R in general formula (f1-0) above.

[Chemical Formula 61]

(f1-01-11)

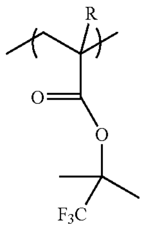

-continued (f1-01-12)

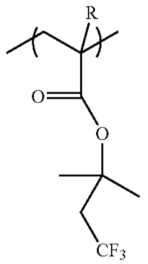

(f1-01-13)

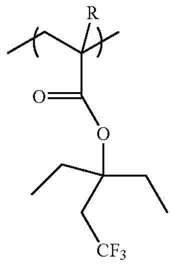

(f1-01-14)

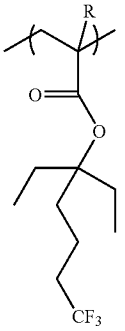

(f1-01-15)

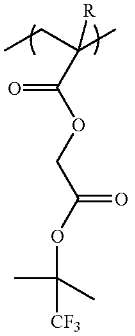

(f1-01-16)

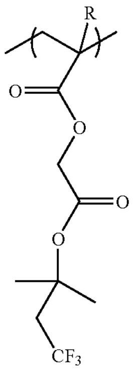

-continued (f1-01-17)

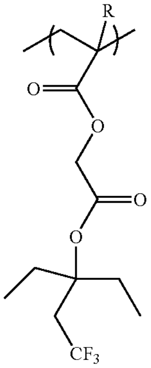

(f1-01-18)

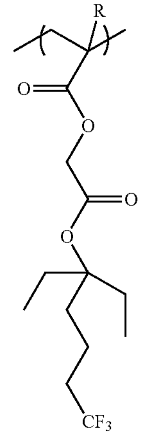

The method of producing a monomer for deriving structural units represented by general formula (f1-01-1) above is not particularly limited. For example, a method in which a compound (I-0-1) represented by general formula (I-0-1) shown below is reacted with a compound (I-0-2) represented by general formula (I-0-2) shown below can be preferably used,

[Chemical Formula 62]

(I-0-1)

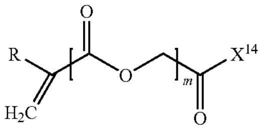

(I-0-2)

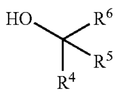

[In formula (I-0-1), R is the same as defined for R in general formula (f1-0) above, and $X^{14}$ represents a halogen atom; in formula (I-0-2), $R^4$ to $R^6$ are respectively the same as defined for $R^4$ to $R^6$ in general formula (f1-01-1) above; and in represents 0 or 1.]

In general formula (I-0-1), as examples of the halogen atom for $X^{14}$, a bromine atom, a chlorine atom, an iodine atom and a fluorine atom can be given. In terms of reactivity, a chlorine atom is preferable.

Further, in general formulas (I-0-1) and (I-0-2), R and $R^4$ to $R^6$ are respectively the same as defined for R and $R^4$ to $R^6$ in general formula (f1-01-1) above.

In the reaction between the compound (I-0-1) and the compound (I-0-2), the reaction solvent is not particularly limited, and any one capable of dissolving the aforementioned compounds as raw materials can be preferably used. Specific examples thereof include acetonitrile and acetone.

The reaction is preferably performed in the presence of a base. The base is not particularly limited, and any of those which exhibit a low nucleophilicity can be preferably used, e.g., triethylamine.

Further, it is preferable to perform the reaction in the presence of a catalyst, as the reaction proceeds smoothly. As the catalyst, any of those conventionally known can be used. Preferable examples thereof include 4-dimethylaminopyridine, In the reaction, it is preferable to mix the compound (I-0-2), and optionally a base and/or a catalyst, with a solvent, and dropwise add the compound (I-0-1) thereto. The compound (I-0-1) may be dissolved and diluted in a solvent in advance, The temperature and time for the dropwise addition can be appropriately selected depending on the raw materials used. The temperature is preferably −10 to 100° C., more preferably −5 to 90° C., and most preferably 0 to 80° C. The time is preferably 5 to 90 minutes, more preferably 10 to 60 minutes, and most preferably 20 to 40 minutes, The reaction temperature and reaction time after the addition of the compound (I-0-1) can also be appropriately selected. The reaction temperature is preferably the same as the temperature during the addition of the compound (I-0-1). The reaction time can also be appropriately selected depending on the raw materials used, and is preferably 0.5 to 15 hours, more preferably 1 to 10 hours, and most preferably 1.5 to 8 hours, After the completion of the reaction, the compound of the present invention can be collected by a conventional method. For example, if necessary, the reaction solution may be washed with water, an aqueous basic solution, a saline solution or the like, and the organic phase may be concentrated, followed by crystallization of the objective compound. The concentrated organic phase or the crystallized objective compound may be purified by silica gel chromatography or the like.

As the compound (I-0-2), a commercially available product may be used, or a synthesized product may be used. The synthesis of the compound (I-0-2) may be performed by a conventional synthesis method of a tertiary alcohol. For example, the synthesis may be performed by Grignard reaction, or a silane compound having a fluorinated alkyl group may be reacted with ketone.

Structural Unit Represented by General Formula (f1-01-2)

[Chemical Formula 63]

(f1-01-2)

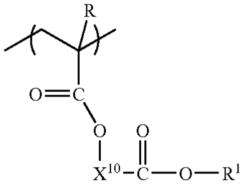

[In formula (f1-01-2), R represents a hydrogen atom, an alkyl group of 1 to 5 carbon atoms or a halogenated alkyl group of 1 to 5 carbon atoms; $R^1$ represents an organic group having a fluorine atom; and $X^{10}$ represents a divalent organic group represented by general formula (x-1) or (x=2) shown below.]

[Chemical Formula 64]

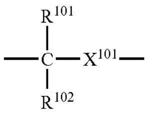

(x-1)

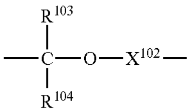

(x-2)

In the formulas above, each of $R^{101}$ and $R^{102}$ independently represents an alkyl group which may be mutually bonded to form a ring; each of $R^{103}$ and $R^{104}$ independently represents a hydrogen atom or a linear or branched alkyl group; and each of $X^{101}$ and $X^{102}$ independently represents an alkylene group or a divalent aliphatic cyclic group, with the provision that $R^{101}$ to $R^{104}$ and $X^{101}$ and $X^{102}$ do not contain a fluorine atom.]

In general formula (f1-01-2) above, R represents a hydrogen atom, an alkyl group of 1 to 5 carbon atoms or a halogenated alkyl group of 1 to 5 carbon atoms, and is the same as defined for R in general formula (f1-0) above, In formula (f1-01-2) above, $R^1$ represents an organic group having a fluorine atom.

An "organic group having a fluorine atom" refers to an organic group in which part or all of the hydrogen atoms have been substituted with a fluorine atom.

As a preferable example of $R^1$, an aliphatic hydrocarbon group having a fluorine atom which may or may not have a substituent can be given. As the aliphatic hydrocarbon group, the same aliphatic hydrocarbon groups as those described in relation to the aforementioned linking group ($Q^0$-1) can be used. Among the aliphatic hydrocarbon groups having a fluorine atom, a fluorinated hydrocarbon group is preferable, more preferably a fluorinated, saturated hydrocarbon group or a fluorinated, unsaturated hydrocarbon group is preferable, and most preferably a fluorinated, saturated hydrocarbon group.

A fluorinated hydrocarbon group "has a substituent" means that part or all of the hydrogen atoms within the fluorinated hydrocarbon group has been substituted with a group or atom other than a hydrogen atom or a fluorine atom, Examples of substituents for the fluorinated hydrocarbon group include an alkyl group, an alkoxy group, a halogenated alkyl group of 1 to 5 carbon atoms which has been substituted with a halogen atom other than a fluorine atom, and a halogen atom other than a fluorine atom.

The alkyl group as a substituent is preferably a lower alkyl group, and is the same as defined for the lower alkyl group (i.e., alkyl group of 1 to 5 carbon atoms) for R in the component (A).

The alkyoxy group as a substituent preferably has 1 to 5 carbon atoms.

The halogenated alkyl group as a substituent is the same as defined above for the halogenated alkyl group for R in the component (A).

Examples of the halogen atom other than a fluorine atom include a chlorine atom, a bromine atom and an iodine atom.

$R^1$ may be linear, branched or cyclic, preferably linear or branched, and most preferably linear.

Further, $R^1$ preferably has 1 to 20 carbon atoms, more preferably 1 to 15 carbon atoms, still more preferably 1 to 10 carbon atoms, and most preferably 1 to 5 carbon atoms, It is preferable that the percentage of the hydrogen atoms substituted with fluorine atoms within $R^1$ be 25% or more, more preferably 40% or more, and most preferably 50% or more, as the hydrophobicity of the resist film during immersion exposure is enhanced.

Further, it is preferable that the number of fluorine atoms bonded to $R^1$ on a terminal carbon atom on the opposite side from the carbon atom bonded to the terminal oxygen atom of the "$—X^{10}—C(═O)—O—$" group in general formula (f1-01-2) above be as large as possible, those in which all the terminal carbon atoms have been substituted with fluorine atoms are more preferable, and those having $—CF_3$ or $—CF_2CF_3$ on the terminal thereof are most preferable.

In general formula (f1-01-2) above, the group "$—O—R^1$" may be a group that is dissociable by the action of a base, such that, for example, the ester bond "—C(═O)—O—" in general formula (f1-01-2) is decomposed (hydrolyzed) by the action of a base (alkali developing solution) to generate a hydrophilic group "—C(═O)—OH". In such a case, the component (F) becomes decomposable in an alkali developing solution, The component (F) is "decomposable in an alkali developing solution" means that the component (F) is decomposable by action of an alkali developing solution (preferably decomposable by action of a 2.38% by weight aqueous solution of tetramethylammonium hydroxide (TMAH) at 23° C.), and exhibits increased solubility in the alkali developing solution. The component (F) is hardly soluble in an alkali developing solution prior to decomposition, and when the component (F) is decomposed by action of the alkali developing solution, a carboxy group which is a hydrophilic group is formed, thereby exhibiting increased solubility in the alkali developing solution.

By using the positive resist composition of the present invention containing such a component (F) in the resist pattern formation, a resist pattern can be formed which is hydrophobic prior to coming into contact with an alkali developing solution (e.g., during immersion exposure), and becomes hydrophilic during alkali developing, By using such a positive resist composition in which the hydrophilicity is enhanced during alkali developing, generation of defects during immersion exposure can be effectively suppressed. More specifically, in liquid immersion lithography, when the resist film is subjected to immersion exposure, the solubility of the exposed portions in an alkali developing solution is increased. By conducting alkali developing, the exposed portions are removed in the case of a positive resist, thereby enabling formation of a resist pattern. Generally, after alkali developing, defects (water mark defects and the like) due to the influence of the immersion medium such as water are likely to be generated on the surface of the resist film at those portions that are not irradiated during the immersion exposure (unexposed portions in the case of a positive resist).

However, when the hydrophilicity of the resist film is enhanced during alkali developing, generation of such defects can be suppressed, In general formula (f1-01-2) above, $X^{10}$ represents a divalent organic group represented by general formula (x-1) or (x-2) shown below. These divalent organic groups have an acid dissociable portion.

In general formula (x-1) above, each of $R^{101}$ and $R^{102}$ independently represents an alkyl group which may be mutually bonded to form a ring.

The alkyl group for $R^{101}$ and $R^{102}$ may be any of linear, branched or cyclic, and preferably linear or branched.

When the alkyl group is linear or branched, it is preferably an alkyl group of 1 to 5 carbon atoms, more preferably an ethyl group or a methyl group, and most preferably an ethyl group.

When the alkyl group is cyclic, it preferably has 4 to 15 carbon atoms, more preferably 4 to 12 carbon atoms, and most preferably 5 to 10 carbon atoms. Examples of cyclic alkyl groups include groups in which one or more hydrogen atoms have been removed from a monocycloalkane or a polycycloalkane such as a bicycloalkane, tricycloalkane or tetracycloalkane. Specific examples thereof include groups in which one or more hydrogen atoms have been removed from a monocycloalkane such as cyclopentane and cyclohexane; and groups in which one or more hydrogen atoms have been removed from a polycycloalkane such as adamantine, norbornane, isobornane, tricyclodecane or tetracyclododecane. Among these examples, a group in which one or more hydrogen atoms have been removed from adamantine is preferable.

$R^{101}$ and $R^{102}$ may be mutually bonded to form a ring. Such a ring constituted of $R^{101}$, $R^{102}$ and the carbon atom having $R^{101}$ and $R^{102}$ bonded thereto can be mentioned as a group in which two hydrogen atoms have been removed from a monocycloalkne or polycycloalkane described above for the aforementioned cyclic alkyl group, preferably a 4- to 10-membered ring, and more preferably a 5- to 7-membered ring.

In general formula (x-1) above, $X^{101}$ represents an alkylene group or a divalent aliphatic cyclic group.

As an example of the alkylene group for $X^{101}$, a group in which one hydrogen atom has been removed from an alkyl group for $R^{101}$ and $R^{102}$ can be given. As the alkylene group, a linear or branched alkylene group is preferable, more preferably a linear or branched alkylene group of 1 to 10 carbon atoms, and most preferably a linear or branched alkylene group of 1 to 5 carbon atoms.

As an example of the divalent aliphatic cyclic group for $X^{101}$, a group in which one hydrogen atom has been removed from an "aliphatic cyclic group" described above in relation to the structural unit (a1) can be given, Among these examples, as $X^{101}$, an alkylene group is preferable.

In general formula (x-2) above, each of $R^{103}$ and $R^{104}$ independently represents a hydrogen atom or a linear or branched alkyl group.

The linear or branched alkyl group for $R^{103}$ and $R^{104}$ preferably has 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group. Among these examples, a methyl group or an ethyl group is preferable, and a methyl group is particularly desirable.

In general formula (x-2), it is preferable that at least one of $R^{103}$ and $R^{104}$ represent a hydrogen atom.

In general formula (x-2) above, $X^{102}$ represents an alkylene group or a divalent aliphatic cyclic group, and is the same as defined for $X^{101}$ in general formula (x-1) above.

However, $R^{101}$ to $R^{104}$ and $X^{102}$ and $X^{102}$ do not contain a fluorine atom.

The structural unit represented by general formula (f1-01-2) above is preferably a structural unit having a portion that forms a cyclic or chain-like tertiary alkyl ester with the carboxyl group in $X^{10}$, more preferably a structural unit having a portion that forms a chain-like tertiary alkyl ester with the carboxyl group, and still more preferably a structural unit represented by general formula (f1-01-200) shown below.

[Chemical Formula 65]

(f1-01-200)

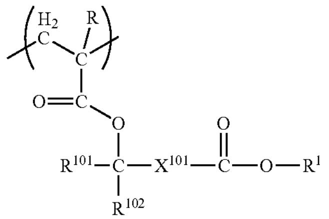

[In formula (f1-01-200), R represents a hydrogen atom, an alkyl group of 1 to 5 carbon atoms or a halogenated alkyl group of 1 to 5 carbon atoms; $R^1$ represents an organic group having a fluorine atom; each of $R^{101}$ and $R^{102}$ independently represents an alkyl group which may be mutually bonded to form a ring; and $X^{101}$ represents an alkylene group or a divalent aliphatic cyclic group, with the provision that $R^{101}$, $R^{102}$ and $X^{101}$ do not contain a fluorine atom.]

In general formula (f1-01-200) above, R and $R^1$ are respectively the same as defined for R and $R^1$ in general formula ((f1-01-2), and $R^{101}$, $R^{102}$ and $X^{101}$ are respectively the same as defined for $R^{101}$, $R^{102}$ and $X^{101}$ in general formula (x-1) above.

As the structural unit represented by general formula (f1-01-2), a structural unit represented by general formula (f1-01-20) shown below is particularly desirable.

[Chemical Formula 66]

(f1-01-20)

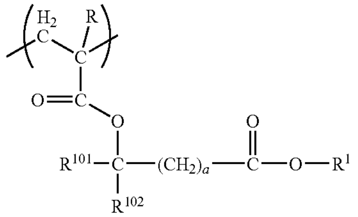

[In formula (f1-01-20), R represents a hydrogen atom, an alkyl group of 1 to 5 carbon atoms or a halogenated alkyl group of 1 to 5 carbon atoms; $R^1$ represents an organic group having a fluorine atom; each of $R^{101}$ and $R^{102}$ independently represents an alkyl group which may be mutually bonded to form a ring; and a represents an integer of 1 to 10, with the provision that $R^{101}$ to $R^{102}$ do not contain a fluorine atom.]

In general formula (f1-01-20) above, R and $R^1$ are respectively the same as defined for R and $R^1$ in general formula ((f1-01-2), and $R^{101}$ and $R^{102}$ are respectively the same as defined for $R^{101}$ and $R^{102}$ in general formula (x-1) above.

In general formula (f1-01-20) above, a represents an integer of 1 to 10, and preferably an integer of 1 to 5.

Specific examples of preferable structural units represented by general formula (f1-01-2) are shown below.

[Chemical Formula 67]

(f1-01-21)

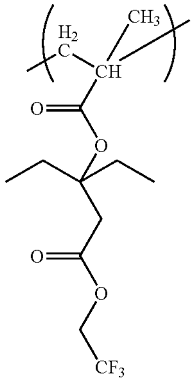

(f1-01-22)

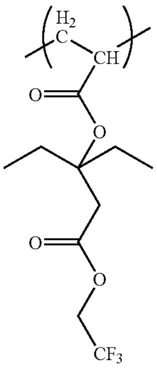

(f1-01-23)

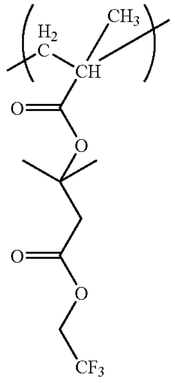

-continued (f1-01-24)

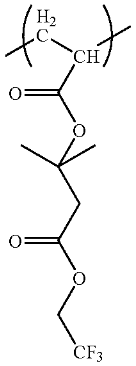

(f1-01-25)

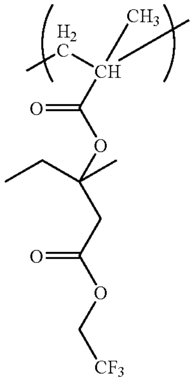

(f1-01-26)

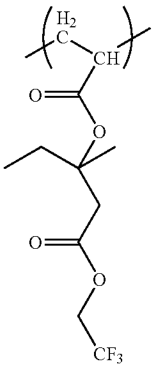

(f1-01-27)

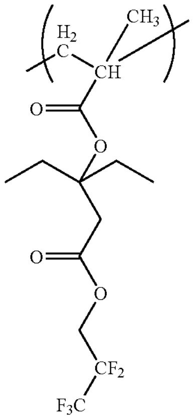

-continued
(f1-01-28)
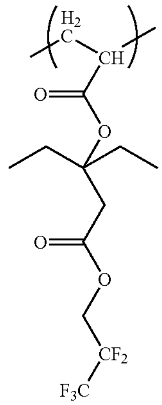
(f1-01-29)
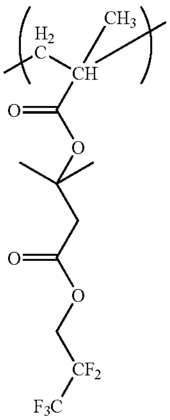
(f1-01-30)
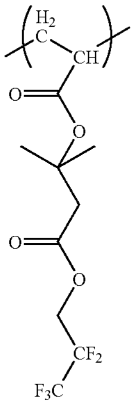
(f1-01-31)
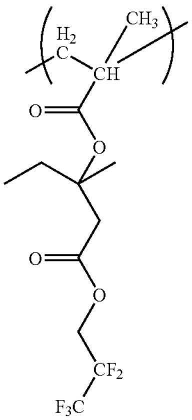
-continued
(f1-01-32)
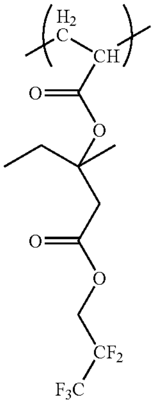
(f1-01-33)
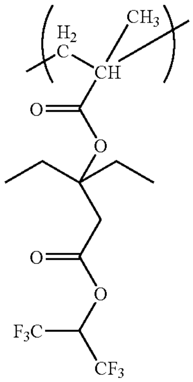
(f1-01-34)
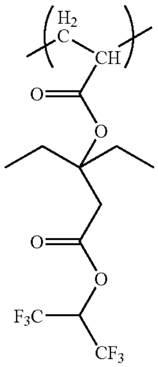
(f1-01-35)
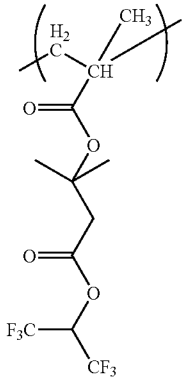

-continued
(f1-01-36)
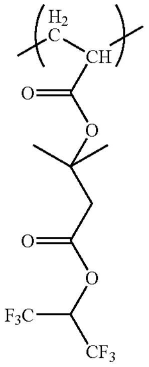
(f1-01-37)
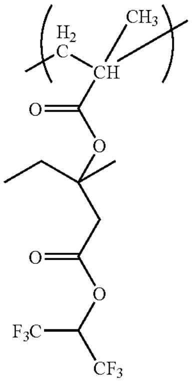
(f1-01-38)
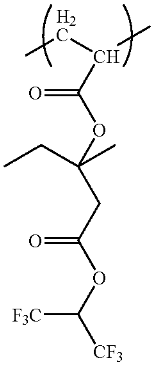
(f1-01-39)
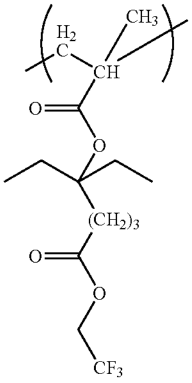
-continued
(f1-01-40)
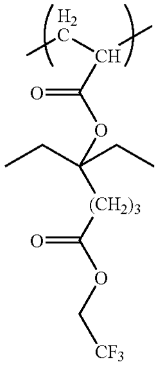
(f1-01-41)
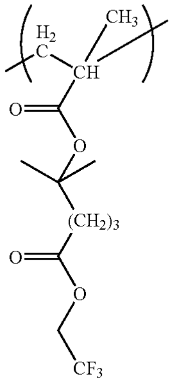
(f1-01-42)
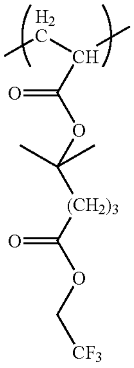
(f1-01-43)
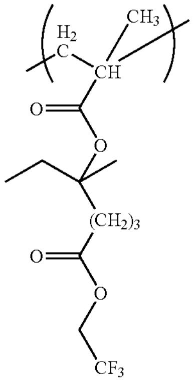

-continued
(f1-01-44)
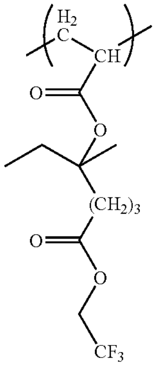
[Chemical Formula 68]
(f1-01-45)
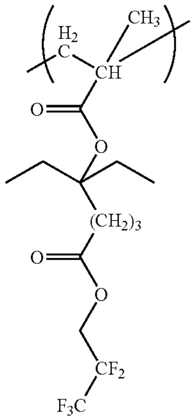
(f1-01-46)
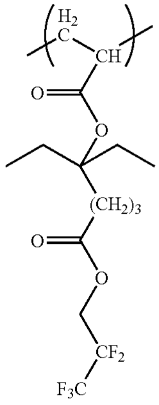
(f1-01-47)
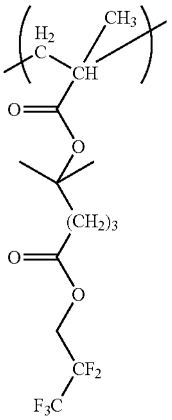
-continued
(f1-01-48)
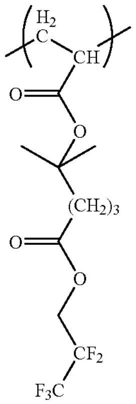
(f1-01-49)
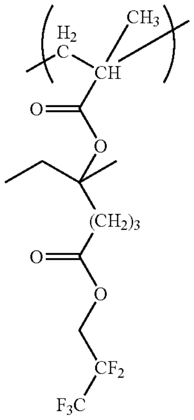
(f1-01-50)
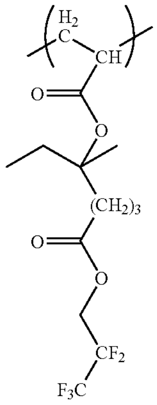
(f1-01-51)
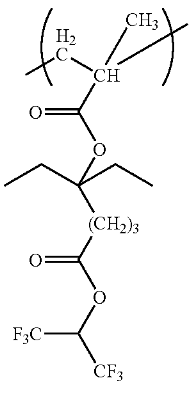

-continued
(f1-01-52)
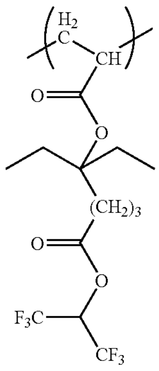
(f1-01-53)
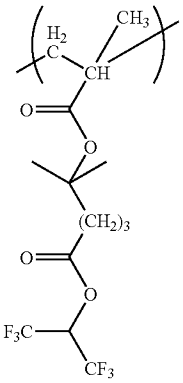
(f1-01-54)
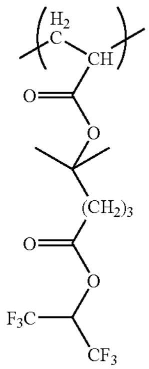
(f1-01-55)
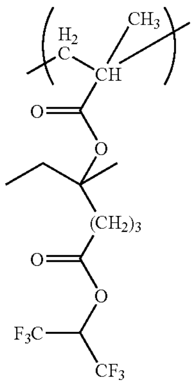
-continued
(f1-01-56)
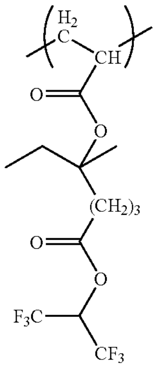
(f1-01-57)
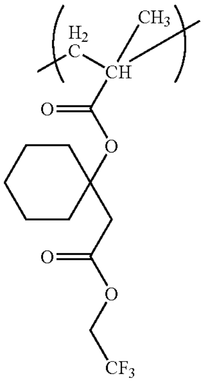
(f1-01-58)
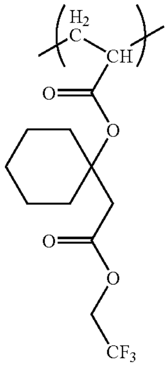
(f1-01-59)
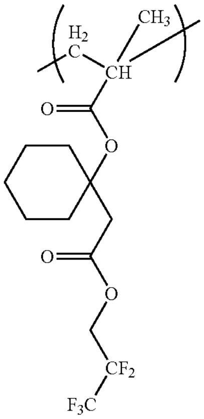

-continued
(f1-01-60)
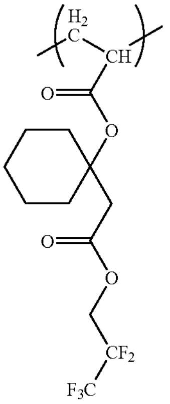
(f1-01-61)
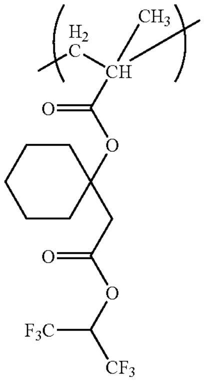
(f1-01-62)
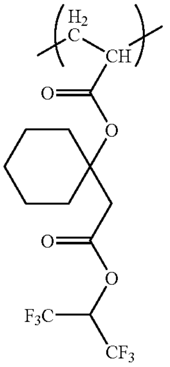
(f1-01-63)
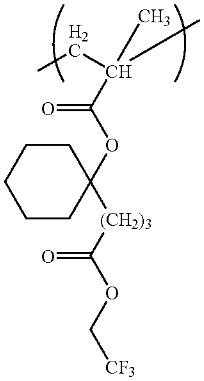
-continued
(f1-01-64)
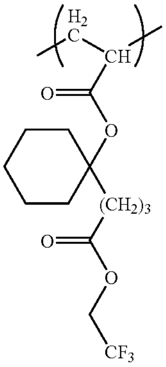
(f1-01-65)
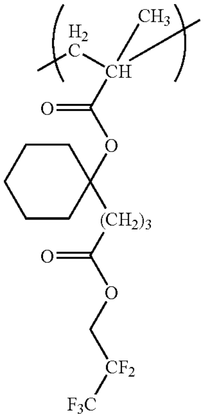
(f1-01-66)
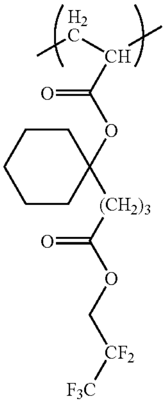
(f1-01-67)
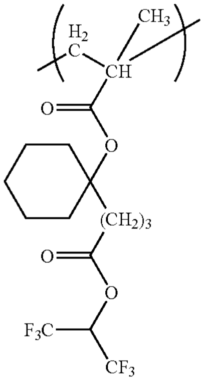

-continued
(f1-01-68)
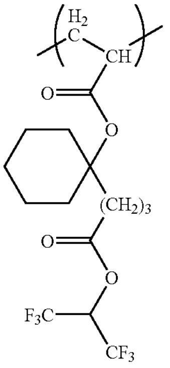
[Chemical Formula 69]
(f1-01-69)
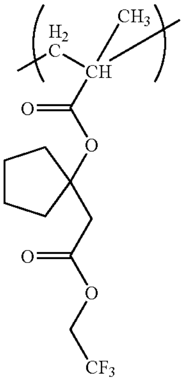
(f1-01-70)
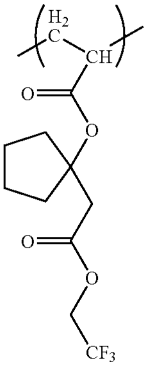
(f1-01-71)
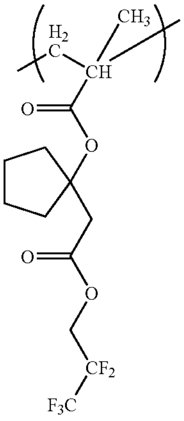
-continued
(f1-01-72)
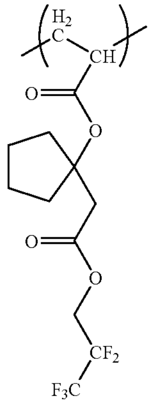
(f1-01-73)
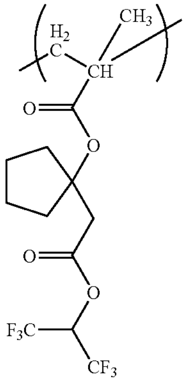
(f1-01-74)
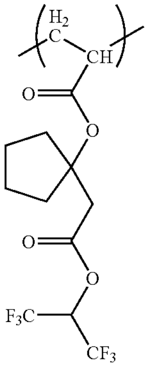
(f1-01-75)
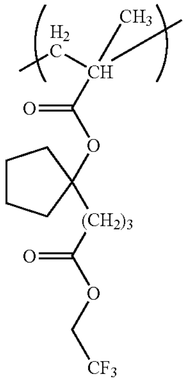

-continued
(f1-01-76)
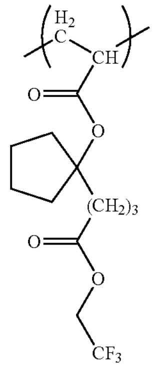
(f1-01-77)
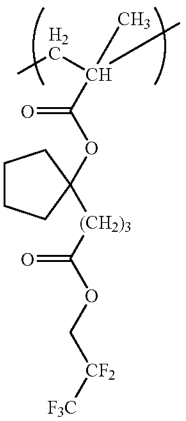
(f1-01-78)
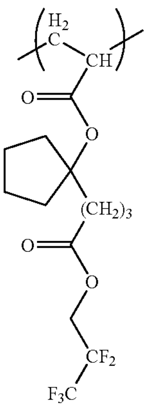
(f1-01-79)
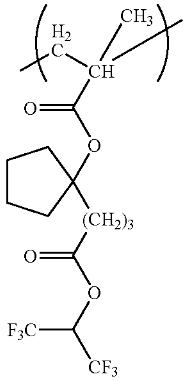
-continued
(f1-01-80)
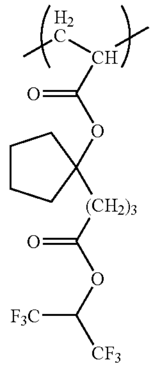
(f1-01-81)
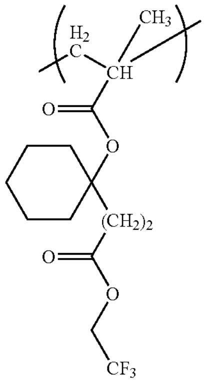
(f1-01-82)
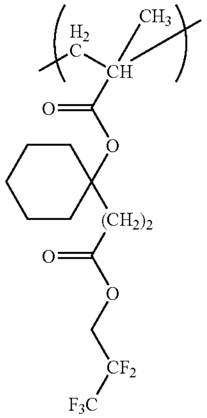
(f1-01-83)
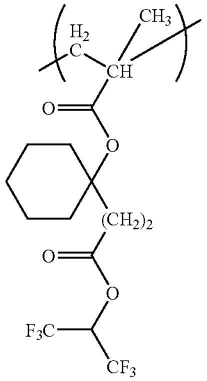

-continued (f1-01-84)

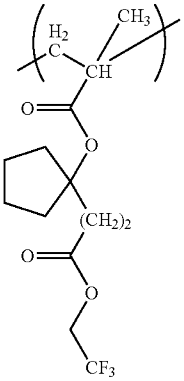

(f1-01-85)

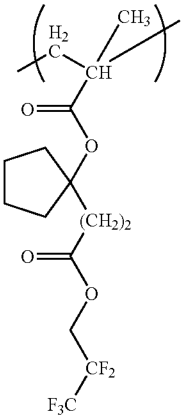

(f1-01-86)

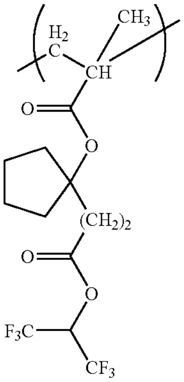

Among the structural units represented by formulas (f1-01-21) to (f1-01-86) above, structural units represented by formulas (f1-01-21), (f1-01-22), (f1-01-27), (f1-01-28), (f1-01-33), (f1-01-34), (f1-01-39), (f1-01-40), (f1-01-45), (f1-01-46), (f1-01-51), (f1-01-52), (f1-01-57) to (f1-01-60), and (f1-01-63) to (f1-01-66) are preferable, and structural units represented by formulas (f1-01-21), (f1-01-22), (f1-01-27), (f1-01-28), (f1-01-57) to (f1-01-60), and (f1-01-63) to (f1-01-66) are particularly desirable.

The method of producing a monomer for deriving structural units represented by general formula (f1-01-2) above is not particularly limited. As a preferable method, for example, a monomer for deriving a structural unit represented by general formula (f1-01-20) above can be produced as follows.

In a first step, a compound represented by general formula (c-1-01) shown below (hereafter, referred to as "compound (c-1-01)") is reacted with a compound represented by general formula (c-1-02) shown below (hereafter, referred to as "compound (c-1-02)") to obtain a compound represented by general formula (c-1-03) shown below (hereafter, referred to as "compound (c-1-03)").

Subsequently, in a second step, the compound (c-1-03) is reacted with a compound represented by general formula (c-1-04) shown below (hereafter, referred to as "compound (c-1-04)") to obtain a compound represented by general formula (c-1-05) shown below (hereafter, referred to as "compound (c-1-05)").

Thereafter, in a third step, the compound (c-1-05) is reacted with a compound represented by general formula (c-1-06) shown below (hereafter, referred to as "compound (c-1-06)") to thereby obtain a monomer (c-1-1a) for deriving a structural unit represented by general formula (f1-01-20).

[Chemical Formula 70]

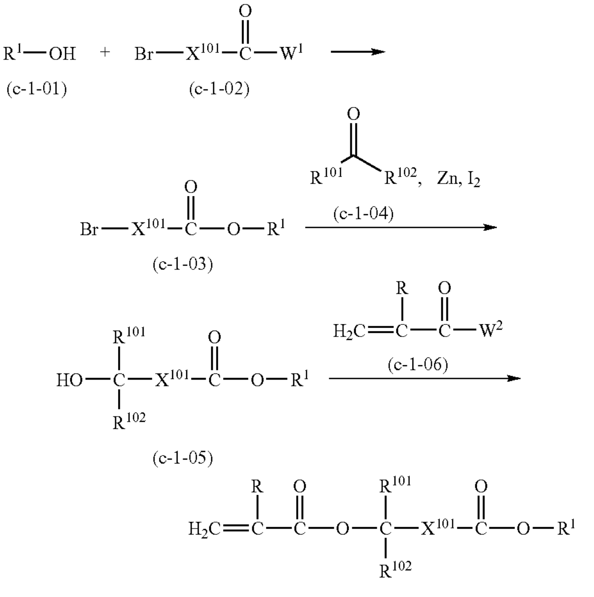

(c-1-01) (c-1-02) (c-1-03) (c-1-04) (c-1-05) (c-1-06) (c-1-1a)

[In the formulas, R represents a hydrogen atom, an alkyl group of 1 to 5 carbon atoms or a halogenated alkyl group of 1 to 5 carbon atoms; $R^1$ represents an organic group having a fluorine atom; each of $R^{101}$ and $R^{102}$ independently represents an alkyl group which may be mutually bonded to form a ring; $X^{101}$ represents an alkylene group or a divalent aliphatic cyclic group; and each of $W^1$ and $W^2$ independently represents a halogen atom.]

In the formulas, R and $R^1$ are respectively the same as defined for R and $R^1$ in general formula (f1-01-2) above, and $R^{101}$, $R^{102}$ and $X^{101}$ are respectively the same as defined for $R^{101}$, $R^{102}$ and $X^{101}$ in general formula (x-1) above, In the formulas, each of $W^1$ and $W^2$ independently represents a halogen atom, preferably a chlorine atom or a bromine atom, and more preferably $W^1$ represents a bromine atom and $W^2$ represents a chlorine atom.

[First Step]

The first step is preferably performed, for example, by adding the compound (c-1-01) to a reaction solvent such as acetone, preferably in the presence of a base, more preferably in the presence of an organic base such as triethylamine, and adding the compound (c-1-02) thereto to effect a reaction. At this time, the compound (c-1-02) is preferably added in a dropwise manner, preferably over 1 to 5 hours, more preferably over 2 to 4 hours. The temperature during the addition of the compound (c-1-02) is preferably in the range of −5 to 15° C., more preferably −5 to 10° C. Further, the reaction time following the addition of the compound (c-1-02) is preferably 0.5 to 7 hours, more preferably 1 to 4 hours. The reaction temperature is preferably −5 to 10° C., more preferably −5 to 5° C.

The amount of the compound (c-1-01) used per 1 mole of the compound (c-1-02) is preferably 1 to 4 moles, more preferably 1.5 to 3 moles. The amount of the base used per 1 mole of the compound (c-1-02) is preferably 1 to 5 moles, more preferably 2 to 3.5 moles.

Following the completion of the reaction, post treatment such as extraction and washing may be conducted if desired. Then, the compound (c-1-03) may be separated and purified, or may be used directly as it is for the second step without separation thereof. The separation and purification can be conducted by a conventional method. For example, any one of concentration, solvent extraction, distillation, crystallization, re-crystallization and chromatography can be used alone, or two or more of these methods may be used in combination.

In the manner described above, the compound (c-1-03) can be obtained.

[Second Step]

The second step is preferably performed, for example, by adding the compound (c-1-04), a zinc powder, and iodine in a catalyst amount to a reaction solvent such as tetrahydrofuran (THF), and adding the compound (c-1-03) thereto to effect a reaction. At this time, the compound (c-1-03) is preferably added in a dropwise manner. The addition time is preferably over 0.2 to 4 hours, more preferably over 0.3 to 2 hours. The temperature during the addition of the compound (c-1-03) is preferably in the range of 30 to 70° C., more preferably 40 to 60° C. Further, the reaction time following the addition of the compound (c-1-03) is preferably 0.5 to 7 hours, more preferably 1 to 4 hours. The reaction temperature may be the same as the temperature during the addition of the compound (c-1-03).

The amount of the compound (c-1-04) used per 1 mole of the compound (c-1-03) is preferably 0.5 to 3 moles, more preferably 0.7 to 1.5 moles. The amount of the zinc powder used per 1 mole of the compound (c-1-03) is preferably 0.7 to 3.5 moles, more preferably 1 to 2 moles.

The treatment following the completion of the reaction can be conducted in the same manner as in the first step.

In the manner described above, the compound (c-1-05) can be obtained.

[Third Step]

In the third step, the compound (c-1-05) may be reacted with the compound (c-1-06) using the same reaction solvent as that used in the second step. The third step is preferably performed following the second step without separation of the compound (c-1-05). In such a case, it is preferable to add a base, preferably an organic base such as triethylamine to the reaction solution following the second step, and then add the compound (c-1-06). During the reaction in the third step, the compound (c-1-06) is preferably added in a dropwise manner. The addition time is preferably over 0.2 to 4 hours, more preferably over 0.3 to 2 hours. The temperature during the addition of the compound (c-1-06) is preferably in the range of 10 to 40° C., more preferably 15 to 25° C. Further, the reaction time following the addition of the compound (c-1-06) is preferably 0.5 to 7 hours, more preferably 1 to 4 hours. The reaction temperature may be the same as the temperature during the addition of the compound (c-1-06).

When the reaction is effected without separation of the compound (c-1-05), the amount of the compound (c-1-06) used per 1 mole of the compound (c-1-03) is preferably 0.7 to 3 moles, more preferably 0.9 to 2 moles. The amount of the base used may be the same as that of the compound (c-1-06).

After the completion of the reaction, various post treatments, separation and purification can be conducted in the same manner as in the first step.

In the manner described above, the monomer (c-1-1a) for deriving the structural units represented by general formula (f1-01-20) can be obtained.

In the fluorine-containing resin component, the amount of the structural unit represented by general formula (f1-01) based on the combined total of all structural units constituting the fluorine-containing resin component is preferably 50 to 100 mol %, more preferably 70 to 100 mol %, still more preferably 80 to 100 mol %, still more preferably 90 to 100 mol %, and most preferably 100 mol %.

By ensuring that the amount of the structural unit represented by general formula (f1-01) is at least as large as the lower limit of the above-mentioned range, a high hydrophobicity can be achieved during formation of a resist pattern, and a resist film exhibiting excellent lithography properties can be obtained.

[Chemical Formula 71]

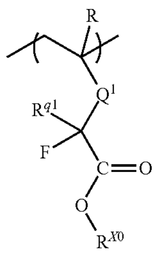

(f1-02)

[In formula (f1-02), R represents a hydrogen atom, an alkyl group of 1 to 5 carbon atoms or a halogenated alkyl group of 1 to 5 carbon atoms; $Q^1$ represents a group containing —O—, —$CH_2$—O—, or —C(═O)—O—; $R^{q1}$ represents a fluorine atom or a fluorinated alkyl group; and $R^{X0}$ represents an acid dissociable, dissolution inhibiting group-containing group which may contain a fluorine atom.]

Structural Unit Represented by General Formula (f1-02)

In general formula (f1-02) above, R represents a hydrogen atom, an alkyl group of 1 to 5 carbon atoms or a halogenated alkyl group of 1 to 5 carbon atoms, and is the same as defined for R in general formula (f1-0) above, In general formula (f1-02) above, $Q^1$ represents a group containing —O—, —$CH_2$—O—, or —C(═O)—O—.

Specific examples of $Q^1$ include a group composed of —O—, —$CH_2$—O—, or —C(═O)—O— and a divalent hydrocarbon group which May have a fluorine atom; —O—, —$CH_2$—O—, or —C(═O)—O—.

As examples of the divalent hydrocarbon group, the same aliphatic hydrocarbon groups containing no fluorine atom and aromatic hydrocarbon groups containing no fluorine atom as those described in relation to the aforementioned linking group ($Q^0$-1) can be given. The divalent hydrocarbon group is preferably an aliphatic hydrocarbon group, more preferably a linear or branched alkylene group.

Among these examples above, $Q^1$ is more preferably a group composed of —C(═O)—O— and a divalent hydrocarbon group which may have a fluorine atom in view of the synthesis thereof and the stability within the positive resist composition, still more preferably a group composed of —C(=O)—O— and an aliphatic hydrocarbon group which may have a fluorine atom, and most preferably a group composed of —C(=O)—O— and a linear or branched alkylene group which may have a fluorine atom.

In general formula (f1-02) above, $R^{q1}$ represents a fluorine atom or a fluorinated alkyl group, With respect to the fluorinated alkyl group for $R^{q1}$, the alkyl group prior to being fluorinated may be any of linear, branched or cyclic.

When the alkyl group is linear or branched, it is preferably an alkyl group of 1 to 5 carbon atoms, more preferably 1 to 3 carbon atoms, and most preferably 1 or 2 carbon atoms.

When the alkyl group is cyclic, it preferably has 3 to 6 carbon atoms.

In the fluorinated alkyl group, the percentage of the number of fluorine atoms based on the total number of fluorine atoms and hydrogen atoms (fluorination ratio (%)) is preferably 30 to 100%, and more preferably 50 to 100%. The hydrophobicity of the resist film is enhanced as the fluorination ratio is increased.

In general formula (f1-02) above, $R^{X0}$ represents an acid dissociable, dissolution inhibiting group-containing group which may have a fluorine atom, and is the same as defined for $R^{X0}$ in general formula (f1-0) above.

As preferable examples of the structural units represented by general formula (f1-02) above, a structural unit represented by general formula (f1-02-1) shown below can be given.

[Chemical Formula 72]

(f1-02-1)

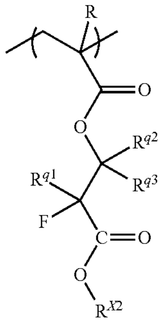

[In formula (f1-02-1), R represents a hydrogen atom, an alkyl group of 1 to 5 carbon atoms or a halogenated alkyl group of 1 to 5 carbon atoms; $R^{q1}$ represents a fluorine atom or a fluorinated alkyl group; each of $R^{q2}$ and $R^{q3}$ independently represents a hydrogen atom, an alkyl group or a fluorinated alkyl group which may be mutually bonded to form a ring; and $R^{X2}$ represents an acid dissociable, dissolution inhibiting group-containing group.]

In general formula (f1-02-1) above, R represents a hydrogen atom, an alkyl group of 1 to 5 carbon atoms or a halogenated alkyl group of 1 to 5 carbon atoms, and is the same as defined for R in general formula (f1-0) above.

$R^{q1}$ represents a fluorine atom or a fluorinated alkyl group, and is the same as defined for $R^{q1}$ in general formula (f1-02) above.

In general formula (f1-02-1) above, each of $R^{q2}$ and $R^{q3}$ independently represents a hydrogen atom, an alkyl group or a fluorinated alkyl group which may be mutually bonded to form a ring.

The alkyl group for $R^{q2}$ and $R^{q3}$ may be any of linear, branched or cyclic, and preferably linear or branched.

When the alkyl group is linear or branched, it is preferably an alkyl group of 1 to 5 carbon atoms, more preferably an ethyl group or a methyl group, and most preferably an ethyl group.

When the alkyl group is cyclic, it preferably has 4 to 15 carbon atoms, more preferably 4 to 12 carbon atoms, and most preferably 5 to 10 carbon atoms. Examples of cyclic alkyl groups include groups in which one or more hydrogen atoms have been removed from a monocycloalkane or a polycycloalkane such as a bicycloalkane, tricycloalkane or tetracycloalkane. Specific examples thereof include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these examples, a group in which one or more hydrogen atoms have been removed from adamantane is preferable.

The fluorinated alkyl group for $R^{q2}$ and $R^{q3}$ is an alkyl group in which part or all of the hydrogen atoms have been substituted with a fluorine atom.

With respect to the fluorinated alkyl group, the alkyl group prior to being fluorinated may be any of linear, branched or cyclic, and examples thereof include the same groups as those described above for the aforementioned "alkyl group for $R^{q2}$ and $R^{q3}$".

$R^{q2}$ and $R^{q3}$ may be mutually bonded to form a ring. Such a ring constituted of $R^{q2}$, $R^{q3}$ and the carbon atom having $R^{q2}$ and $R^{q3}$ bonded thereto can be mentioned as a group in which two hydrogen atoms have been removed from a monocycloalkane or polycycloalkane described above for the aforementioned cyclic alkyl group, preferably a 4- to 10-membered ring, and more preferably a 5- to 7-membered ring.

Among the examples described above, $R^{q2}$ and $R^{q3}$ are preferably a hydrogen atom or an alkyl group.

In general formula (f1-02-1) above, $R^{X2}$ represents an acid dissociable, dissolution inhibiting group-containing group.

Examples of $R^{X2}$ include the same acid dissociable, dissolution inhibiting group-containing groups as those described above in relation to $R^{X0}$.

The acid dissociable, dissolution inhibiting group-containing group for $R^{X2}$ may or may not have a fluorine atom, but preferably does not have a fluorine atom.

Specific examples of preferable structural units represented by general formula (f1-02-1) are shown below. In the general formulas shown below, R is the same as defined for R in general formula (f1-02-1) above, and is preferably a hydrogen atom or a methyl group.

[Chemical Formula 73]

(f1-02-11)

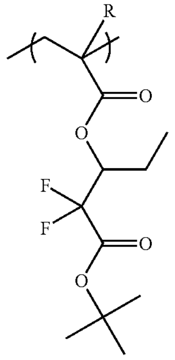

-continued (f1-02-12)

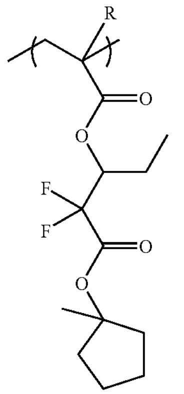

(f1-02-13)

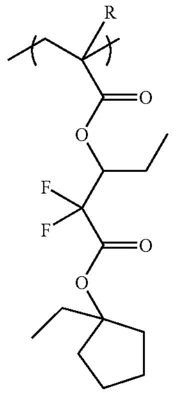

In the fluorine-containing resin component, the amount of the structural unit represented by general formula (f1-02) based on the combined total of all structural units constituting the fluorine-containing resin component is preferably 50 to 100 mol %, more preferably 70 to 100 mol %, still more preferably 80 to 100 mol %, still more preferably 90 to 100 mol %, and most preferably 100 mol %.

By ensuring that the amount of the structural unit represented by general formula (f1-02) is at least as large as the lower limit of the above-mentioned range, the hydrophobicity of the surface of the resist film can be enhanced during formation of a resist pattern. Further, a resist film exhibiting excellent lithography properties can be obtained.

In the fluorine-containing resin component, as the structural unit (f1), one type of structural unit may be used alone, or two or more types of structural units may be used in combination. In the present invention, it is preferable to use one type of structural unit (f1) alone.

(Other Structural Units)

In the component (F), the fluorine-containing resin component may include a structural unit other than the above-mentioned structural unit (f1), as long as the effects of the present invention are not impaired.

Such a structural unit is not particularly limited, although it is preferable to use a structural unit derived from a compound copolymerizable with a compound for deriving the structural unit (f1). Examples of such structural units include the structural units (a1) to (a4) described above in relation to the aforementioned component (A1).

In the fluorine-containing resin component, as such structural units, one type of structural unit may be used alone, or two or more types of structural units may be used in combination.

The component (F) is a fluorine-containing resin component having a structural unit (f1) represented by general formula (f1-0) above.

During resist pattern formation, in order to achieve excellent lithography properties, it is particularly desirable that the component (F) be capable of providing both (i) hydrophobicity and (ii) solubility in a developing solution.

For example, in those cases where the two functions (i) and (ii) provided by the component (F) are each caused by a separate structural unit, a trade-off type relationship is likely to be established, in which the increase of either one function (for example, the increase in the proportion of one structural unit) results in the decline of the other function.

Since the structural unit (f1) represented by general formula (f1-0) above has a fluorine atom and also exhibits excellent solubility in a developing solution (the solubility in the developing solution increases due to dissociation of the acid dissociable, dissolution inhibiting group in the structural unit (f1) by the action of acid generated upon exposure), the two functions (i) and (ii) are both derived by a single structural unit, and thus both functions can be improved simultaneously.

Therefore, the fluorine-containing resin component in the present invention is preferably a resin component in which the amount of the structural unit (f1) is 100%. Furthermore, from the following viewpoints, it is preferable to use a homopolymer, as the fluorine-containing resin component, composed of the structural unit (f1) that is consisted of a single type of structural unit.

First, although the fluorine-containing resin component has a feature of segregating in the surface of the resist film, if the fluorine-containing resin component is a homopolymer, the fluorine-containing resin component can be distributed more homogeneously in the resist film surface.

Further, although the component (F) itself is also affected by the reaction caused upon exposure because the structural unit (f1) represented by general formula (f1-0) above has an acid dissociable, dissolution inhibiting group, if a homopolymer is used, the component (F) is readily distributed within the resist film in a homogeneous manner, and thus excellent lithography properties can be achieved as a result. This is also advantageous when forming various patterns (such as line and space patterns and hole patterns). For example, when forming a hole pattern, the level of incident energy of light to the resist film is optically reduced, as compared to the case where a line and space pattern is formed. Therefore, it is presumed that when a homopolymer is used which causes the component (F) segregated in the resist film surface to be affected in a less variable manner upon exposure, other components in the resist film (such as the component (A) and the component (B)) are also affected by the reaction in a less variable manner, and thus excellent lithography properties can be achieved.

In the present invention, as the fluorine-containing resin component, a polymer (homopolymer) including a recurring unit such as those shown below is particularly desirable.

[Chemical Formula 74]

(F1-1)

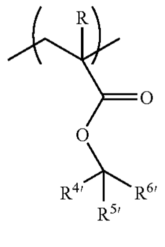

-continued (F1-2)

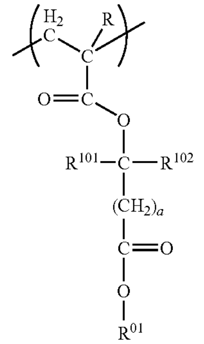

(F1-3)

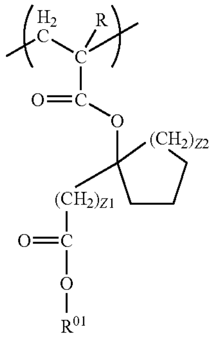

[In the formulas, R represents a hydrogen atom, an alkyl group of 1 to 5 carbon atoms or a halogenated alkyl group of 1 to 5 carbon atoms; the plurality of R may be the same or different from each other;

in general formula (F1-1), each of $R^{4'}$ and $R^{5'}$ independently represents an alkyl group, and $R^{6'}$ represents a fluorinated alkyl group;

in general formula (F1-2), $R^{101}$, $R^{102}$ and a are respectively the same as defined for $R^{101}$, $R^{102}$ and a in general formula (f1-01-20) above; $R^{01}$ represents a fluorinated alkyl group; and in general formula (F1-3), $R^{01}$ represents a fluorinated alkyl group, Z1 represents an integer of 1 to 5, and Z3 represents an integer of 1 to 3.]

In general formulas (F1-1) to (F1-3) above, R represents a hydrogen atom, an alkyl group of 1 to 5 carbon atoms or a halogenated alkyl group of 1 to 5 carbon atoms, and is the same as defined for R in general formula (f1-0) above. The plurality of R may be the same or different from each other.

In general formula (F1-1) above, each of $R^{4'}$ and $R^{5'}$ independently represents an alkyl group, and is preferably a linear or branched alkyl group, more preferably a linear or branched alkyl group of 1 to 5 carbon atoms, and most preferably a linear alkyl group of 1 to 5 carbon atoms.

$R^{6}$ represents a fluorinated alkyl group, and is preferably a linear or branched fluorinated alkyl group of 2 to 7 carbon atoms, more preferably 2 to 5 carbon atoms, and an n-butyl group is particularly desirable.

In general formula (F1-2) above, $R^{101}$, $R^{102}$ and a are respectively the same as defined for $R^{101}$, $R^{102}$ and a in general formula (f1-01-20) above.

$R^{01}$ represents a fluorinated alkyl group, and preferably has 1 to 10 carbon atoms, more preferably 1 to 5 carbon atoms. Specific examples thereof include $—CH_2—CF_3$, $—CH_2—CF_2—CF_3$, and $—C(CF_3)(CF_3)$.

In general formula (F1-3) above, $R^{01}$ represents a fluorinated alkyl group, and is the same as defined for $R^{01}$ in general formula (F1-2) above.

Z1 represents an integer of 1 to 5, preferably an integer of 1 to 3, and most preferably 1 or 2 to indicate a methylene group or an ethylene group.

Z3 represents an integer of 1 to 3, and is most preferably 2.

The fluorine-containing resin component can be obtained, for example, by a conventional radical polymerization or the like of the monomers for deriving a desired structural unit, using a radical polymerization initiator such as azobisisobutyronitrile (AIBN) or dimethyl azobisisobutyrate.

The weight average molecular weight (Mw) (the polystyrene equivalent value determined by gel permeation chromatography) of the fluorine-containing resin component is not particularly limited, but is preferably 2,000 to 50,000, more preferably 3,000 to 30,000, still more preferably 4,000 to 25,000, and most preferably 5,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5.

In the component (F), as the fluorine-containing resin component, one type may be used alone, or two or more types may be used in combination.

In the positive resist composition of the present invention, the amount of the component (F) relative to 100 parts by weight of the component (A) is preferably 0.1 to 50 parts by weight, more preferably 0.1 to 40 parts by weight, still more preferably 0.3 to 30 parts by weight, and most preferably 0.5 to 15 parts by weight. By ensuring that the amount of the component (F) is at least as large as the lower limit of the above-mentioned range, the hydrophobicity of a resist film formed using the positive resist composition is enhanced, thereby yielding a resist composition that is suitable also for immersion exposure. On the other hand, by ensuring that the amount of the component (F) is no more than the upper limit of the above-mentioned range, the lithography properties are improved.

Such fluorine-containing resin components can also be used favorably as an additive in a resist composition for immersion exposure.

<Component (D)>

The positive resist composition of the present invention may further contain a nitrogen-containing organic compound component (D) (hereafter referred to as "component (D)") as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used although an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of 1 to 12 carbon atoms (i.e., alkylamines or alkyl alcohol amines), and cyclic amines.

Specific examples of alkylamines and alkyl alcohol amines include monoalkylamines such as n-hexylamine, n-heptylamine, n-octylamine, n-nonylamine, and n-decylamine;

dialkylamines such as diethylatnine, di-n-propylamine, di-n-heptylamine, di-n-octylatnine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine and tri-n-octanolamine. Among these, trialkylamines of 5 to 10 carbon atoms are more preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monacyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D), one type of compound may be used alone, or two or more types may be used in combination.

In the present invention, a trialkylamine of 5 to 10 carbon atoms can be preferably used as the component (D).

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<Optional Components>

[Component (E)]

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid, and among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is preferably used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The positive resist composition of the present invention can be prepared by dissolving the materials for the positive resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents may be used individually, or as a mixed solvent containing two or more different solvents.

Among these, PGMEA, PGME and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration that enables application of a coating solution to a substrate in accordance with the thickness of the coating film. In general, the component (S) is used in an amount that yields a solid content for the resist composition that is within a range from 0.5 to 20% by weight, and preferably from 1 to 15% by weight.

Dissolving of the resist materials in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

<<Method of Forming a Resist Pattern>>

The method of forming a resist pattern according to the second aspect of the present invention includes: applying the positive resist composition of the present invention on a substrate to form a resist film, subjecting the resist film to exposure, and subjecting the resist film to alkali developing to form a resist pattern.

More specifically, the method for forming a resist pattern according to the present invention can be performed, for example, as follows.

Firstly, a positive resist composition according to the present invention is applied onto a substrate using a spinner or the like, and a prebake (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, PEB (post exposure baking) is conducted under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer' organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

The method of forming a resist pattern according to the present invention is also applicable to a double exposure method or a double patterning method.

According to the positive resist composition and the method of forming a resist pattern of the present invention described above, a resist film having a highly hydrophobic surface can be formed.

In the resist film formed using the positive resist composition of the present invention, the polymeric compound (A1) having the structural unit (a0) represented by general formula (a0-1) above and the structural unit (a1), and a fluorine-containing resin component having the structural unit (f1) represented by general formula (f1-0) above are included.

As described above, since the fluorine-containing resin component contains a fluorine atom, the hydrophobicity of a resist film formed using the positive resist composition of the present invention is high, as compared to the case where a positive resist composition containing no fluorine-containing resin component is used.

Further, since the polymeric compound (A1) includes the structural unit (a0) having a "cyclic group containing —$SO_2$—" on the side chain terminal, the hydrophobicity of a resist film formed using the positive resist composition of the present invention is high, as compared to the case where a positive resist composition that does not include the component (A1) is used, and the receding angle to be described later becomes particularly large, it is presumed that a high hydrophobicity of the "cyclic group containing —$SO_2$—", as compared to that of the "lactone-containing cyclic group" included in the conventional polymeric compounds, particularly contributes to the increase in the receding angle.

As described above, a resist film formed using the positive resist composition of the present invention exhibits high hydrophobicity during immersion exposure as compared to the conventional cases. Therefore, the resist film exhibits an excellent water tracking ability which is required when immersion exposure is conducted using a scanning-type immersion exposure apparatus as disclosed in the above-mentioned Non-Patent Document 1, and thus a high scanning speed can be achieved.

By virtue of using a fluorine-containing resin and the component (A1), a resist film formed using the positive resist composition of the present invention has a higher resist film hydrophobicity, as compared to the cases where the conventional positive resist compositions are used, and the contact angles relative to water, such as the static contact angle (the contact angle between the surface of a water droplet on the resist film in a horizontal state and the resist film surface), the dynamic contact angles (the contact angles at which a water droplet starts to slide when the resist film is inclined, including the contact angle at the front-end point of the water droplet in the sliding direction (advancing angle) and the contact angle at the rear-end point of the water droplet in the sliding direction (receding angle)), and the sliding angle (the inclination angle of the resist film at which a water droplet starts to slide when the resist film is inclined) are changed. For example, the higher the hydrophobicity of the resist film, the larger the static contact angle and the dynamic contact angles, and the smaller the sliding angle.

FIG. 1 is a diagram describing an advancing angle ($\theta_1$), a receding angle ($\theta_2$) and a sliding angle ($\theta_3$).

As shown in FIG. 1, when a flat surface 2 with a liquid droplet 1 placed thereon is gradually inclined, the advancing angle describes the angle $\theta_1$ between the surface of the liquid droplet at the bottom edge 1*a* of the liquid droplet 1 and the flat surface 2 when the liquid droplet 1 starts to move (slide) down the flat surface 2.

Further, at this point (the point when the liquid droplet 1 starts to move (slide) down the fiat surface 2), the angle $\theta_2$ between the surface of the liquid droplet at the top edge 1*b* of the liquid droplet 1 and the flat surface 2 is the receding angle, and the inclination angle $\theta_3$ of the flat surface 2 is the sliding angle.

In the present description, the advancing angle, receding angle and sliding angle are measured in the following manner.

First, a resist composition solution is spin-coated onto a silicon substrate, and then heated under a predetermined condition, for example, at a temperature of 110 to 115° C. for 60 seconds, to form a resist film.

Subsequently, the respective angles can be measured for the resist film using commercially available measurement apparatuses such as DROP MASTER-700 (product name; manufactured by Kyowa Interface Science Co., Ltd.), AUTO SLIDING ANGLE: SA-30 DM (product name; manufactured by Kyowa Interface Science Co., Ltd.), and AUTO DISPENSER: AD-31 (product name; manufactured by Kyowa Interface Science Co., Ltd.).

For a resist film obtained using the positive resist composition of the present invention, the measured receding angle is preferably 70 degrees(°) or more, more preferably 73° or more, and still more preferably 75° or more. The hydrophobicity of the resist film surface improves as the level of the receding angle increases, and thus a scanning speed can be further enhanced during immersion exposure. Further, the effect of suppressing the elution of a substance is also improved. It is presumed that one of the main reasons for these effects is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. There are no particular limitations on the upper limit for the receding angle, and may be 90° or less, for example.

For the same reasons as described above, with respect to a resist film formed using the positive resist composition of the present invention, it is particularly desirable that the static contact angle as measured prior to conducting immersion exposure and developing be 80 to 100°.

Further, with respect to a resist film formed using the positive resist composition of the present invention, it is preferable that the sliding angle as measured prior to conducting immersion exposure and developing be 25° or lower, and more preferably 20° or lower. When the sliding angle is no more than the upper limit of the above-mentioned range, the effect of suppressing the elution: of a substance during immersion exposure is enhanced, There are no particular limitations on the lower limit for the sliding angle, and may be 5° or more, for example.

Further, with respect to a resist film formed using the positive resist composition of the present invention, it is preferable that the advancing angle as measured prior to conducting immersion exposure and developing be 80 to 100°, and more preferably 80 to 90°. When the advancing angle is within the above-mentioned range, the lithography properties are improved, and for example, the occurrence of defects can be suppressed.

The level of the above-mentioned various angles (static contact angle, dynamic contact angle and sliding angle) and static contact angle) can be controlled by adjusting the formulation of the positive resist composition, for example, type of the component (A1), the amount of the structural unit (a0) in the component (A), and the type and amount of the fluorine-containing resin component. For example, the hydrophobicity of the formed resist film becomes higher and the receding angle in particular becomes larger, as the amount of the structural unit (a0) in the component (A) increases or the amount of the fluorine-containing resin component increases. Further, by adjusting the amount of the fluorine-containing resin component or the content of fluorine atoms in the structural units, the level of the angles (the advancing angle, in particular) can be controlled (i.e., the level of the advancing angle reduces when the content of fluorine atoms is low).

Further, by using the positive resist composition of the present invention, elution of a substance from the resist film during immersion exposure can be suppressed.

That is, as described above, immersion exposure is a method in which exposure (immersion exposure) is conducted in a state where the region between the lens and the resist layer formed on a wafer (which is conventionally filled with air or an inert gas such as nitrogen) is filled with a solvent (an immersion medium) that has a larger refractive index than the refractive index of air. In immersion exposure, when the resist film comes into contact with the immersion medium, elution of substances within the resist film (component (B), component (D), and the like) into the immersion medium occurs. This elution of a substance causes phenomenon such as degeneration of the resist film and change in the refractive index of the immersion medium, thereby adversely affecting the lithography properties.

The amount of the eluted substance is affected by the properties of the resist film surface (e.g., hydrophilicity, hydrophobicity, and the like). Therefore, it is presumed that the amount of eluted substance can be reduced, for example, by enhancing the hydrophobicity of the resist film surface.

Since a resist film formed using the positive resist composition of the present invention includes the fluorine-containing resin component and the component (A1), the resist film exhibits a higher level of hydrophobicity prior to conducting exposure and developing than a resist film that does not include these components. Therefore, according to the positive resist composition of the present invention, elution of a substance during immersion exposure can be suppressed.

Since substance elution can be suppressed, by using the positive resist composition of the present invention, phenomena such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

Further, since the fluorine-containing resin component in the present invention has an acid dissociable, dissolution inhibiting group, the structure thereof is unchanged at unexposed portions, and when acid is generated from the component (B) upon exposure, the bond between the acid dissociable, dissolution inhibiting group (i.e., the acid dissociable portion) in the fluorine-containing resin component and the atom to which the acid dissociable, dissolution inhibiting group (acid dissociable portion) is bonded is broken. As a result, the alkali solubility of the exposed portions of the resist film is increased. Thus, it is considered that a high contrast of exposed portions/unexposed portions can be achieved.

Furthermore, since the fluorine-containing resin component represented by general formula (f1-0) has a carbonyloxy group (—C(═O)—O—) exhibiting a relatively high polarity, the fluorine-containing resin component exhibits improved compatibility with other components in the resist composition. Therefore, the positive resist composition of the present invention is expected to exhibit improved post exposure stability.

In addition, a resist film formed using the positive resist composition of the present invention hardly swells due to being exposed to water. Therefore, a very fine resist pattern can be formed with a high precision.

Also, the positive resist composition of the present invention exhibits excellent lithography properties with respect to sensitivity, resolution, etching resistance and the like, and is capable of forming a resist pattern without any practical problems when used as a resist for immersion exposure. For example, by using the positive resist composition of the present invention, a very fine resist pattern with a size of 65 nm or smaller can be formed. As described above, the positive resist composition of the present invention exhibits excellent lithography properties, and is capable of forming a resist pattern without any practical problems when used as a resist for immersion exposure. Thus, the positive resist composition of the present invention not only exhibits excellent lithography properties (e.g., sensitivity, resolution, etching resistance and the like), but also exhibits excellent properties required of a resist material for immersion exposure (such as hydrophobicity, ability of suppressing elution of a substance, and water tracking ability). Therefore, the positive resist composition of the present invention can also be suitably used for immersion exposure.

EXAMPLES

As follows is a description of examples of the present invention, although the scope of the present invention is by no way limited by these examples.

In the following examples, a unit represented by a chemical formula (1) is designated as "compound (1)", and the same applies for compounds represented by other formulas.

<Synthesis of Base Material Component (A)>

The polymeric compounds used as the base material component (A) in the present examples were synthesized using the compounds (1) to (7) represented by chemical formulas shown below in accordance with the following polymer synthesis examples.

The compound (1) and the compound (2) used in the polymer synthesis examples were synthesized in accordance with the following monomer synthesis examples.

[Chemical Formula 75]

Compound (1)

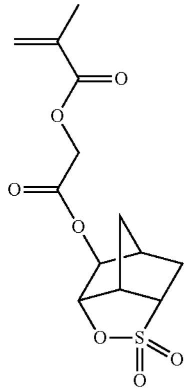

-continued

Compound (2)

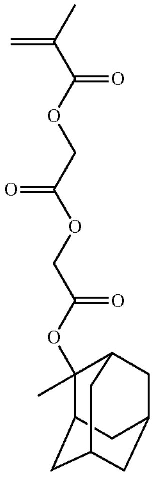

Compound (3)

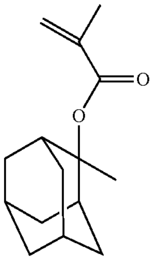

Compound (4)

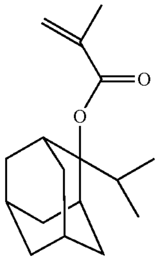

Compound (5)

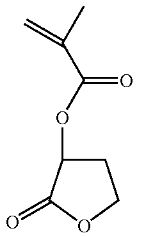

Compound (6)

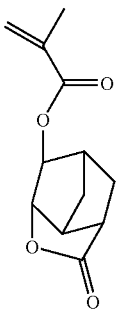

-continued

Compound (7)

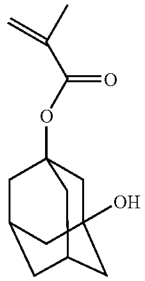

Monomer Synthesis Example 1

Synthesis of Compound (1)

300 ml of a THF solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1) was added thereto while cooling with ice (0° C.), followed by stirring at room temperature for 12 hours.

After conducting thin-layer chromatography (TLC) to confirm that the raw materials had been consumed, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N—HClaq in this order. Thereafter, the solvent was distilled off under reduced pressure, and the resulting product was dried, thereby obtaining the compound (1).

[Chemical Formula 76]

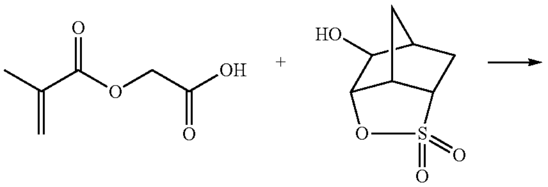

Precursor(1) Alcohol(1)

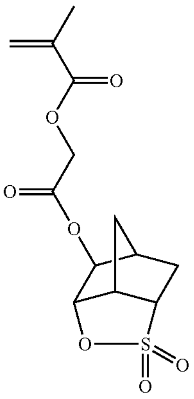

Compound(1)

The results of instrumental analysis of the obtained compound (1) were as follows.

$^{1}$H-NMR ($CDCl_3$, 400 MHz): δ (ppm)=6.22 (s, 1H, $H^{a}$), 5.70 (s, 1H, $H^{b}$), 4.71-4.85 (m, 2H, $H^{c,d}$), 4.67 (s, 2H, $H^{k}$), 3.40-3.60 (m, 2H, $H^{e,f}$), 2.58-2.70 (m, 1H, $H^{g}$), 2.11-2.21 (m, 2H, $H^{h}$), 2.00 (s, 3H, $H^{i}$), 1.76-2.09 (m, 2H, $H^{j}$).

From the results shown above, it was confirmed that the compound (1) had a structure shown below.

[Chemical Formula 77]

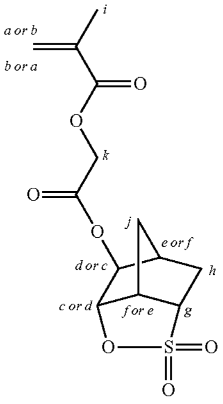

Monomer Synthesis Example 2

Synthesis of Compound (2)

i) Synthesis of 2-(2-(2-methyl-2-adamantyloxy)-2-oxoethoxy)-2-oxoethanol 37.6 g (494 mmol) of glycolic acid, 700 mL of dimethylformamide (DMF), 86.5 g (626 mmol) of potassium carbonate, and 28.3 g (170 mmol) of potassium iodide were added to a 2 L three-necked flask equipped with a thermometer, a cooling pipe, and a stirrer, followed by stirring at room temperature for 30 minutes. Then, 300 mL of a dimethylformamide solution containing 100 g (412 mmol) of 2-methyl-2-adamantyl chloroacetate was gradually added thereto. The resultant was heated to 40° C., and stirred for 4 hours. Following completion of the reaction, 2,000 mL of diethyl ether was added to the reaction mixture, followed by filtration. The resulting solution was washed with 500 mL of distilled water three times. Then, crystallization was conducted using a mixed solution containing 300 mL of toluene and 200 mL of heptane, thereby obtaining 78 g of an objective compound in the form of a colorless solid (yield: 67%, GC purity: 99%), The results of instrumental analysis of the obtained objective compound were as follows.

$^{1}$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27,26, 32.97, 34.54, 36.29, 38.05, 60.54, 61.50, 89.87, 165.97, 172.81.

GC-MS: 282 ($M^{+}$, 0.02%), 165 (0.09%), 149 (40%), 148 (100%), 133 (22%), 117 (2.57%), 89 (0.40%).

From the results above, it was confirmed that the obtained objective compound was 2-(2-(2-methyl-2-adamantyloxy)-2-oxoethoxy)-2-oxoethanol.

ii) Synthesis of 2-(2-(2-methyl-2-adamantyloxy)-2-oxoethoxy)-2-oxoethyl methacrylate (compound (2))

165 g (584 mmol) of 2-(2-(2-methyl-2-adamantyloxy)-2-oxoethoxy)-2-oxoethanol, 2,000 mL, of tetrahydrofuran (THF), 105 mL (754 mmol) of triethylamine, and 0.165 g (1,000 ppm) of p-methoxyphenol were added to and dissolved in a 2 L three-necked flask equipped with a thermometer, a cooling pipe, and a stirrer. Then, 62.7 mL (648 mmol) of methacryloyl chloride was gradually added thereto while cooling in an ice bath. The temperature of the resultant was elevated to room temperature, and the resultant was stirred for 3 hours. Following completion of the reaction, 1,000 mL of diethyl ether was added thereto, followed by washing with 200 mL of distilled water 5 times. Thereafter, the extraction liquid was concentrated, thereby obtaining 198 g of an objective compound in the form of a colorless liquid (yield: 97%, GC purity: 99%).

The results of instrumental analysis of the obtained objective compound were as follows.

$^{1}$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 ($M^{+}$, 1.4%), 206 (0.13%), 149 (47%), 148 (100%), 133 (20%), 69 (37%).

From the results above, it was confirmed that the obtained objective compound was 2-(2-(2-methyl-2-adamantyloxy)-2-oxoethoxy)-2-oxoethyl methacrylate (compound (2)) having a structure shown below.

[Chemical Formula 78]

Compound (2)

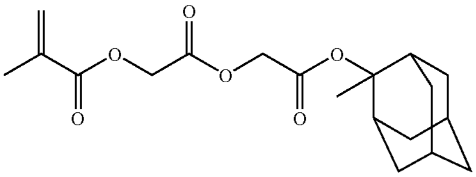

Polymer Synthesis Example 1

Synthesis of Polymeric Compound (1)

In a three-necked flask equipped with a thermometer and a reflux tube, 10.00 g (31.65 mmol) of a compound (1), 9.10 g (38.88 mmol) of a compound (3) and 4.05 g (17.18 mmol) of a compound (7) were dissolved in 34.73 g of methyl ethyl ketone (MEK) to obtain a solution. Then, 5.8 mmol of dimethyl 2,2'-azobis(isobutyrate) (V-601) as a polymerization initiator was added and dissolved in the obtained solution. The resultant was dropwise added to 19.29 g of MEK heated to 78° C. in a nitrogen atmosphere over 6 hours. Following completion of the dropwise addition, the reaction solution was heated for 1 hour while stirring, and then cooled to room temperature. The obtained reaction polymer solution was dropwise added to an excess amount of a methanol/water mixed solvent, and an operation to deposit a polymer was conducted. Thereafter, the precipitated white powder was separated by filtration, followed by washing with a methanol/water mixed solvent and drying, thereby obtaining 15 g of a polymeric compound (1) as an objective compound.

With respect to the polymeric compound (1), the weight average molecular weight (Mw) and the molecular weight dispersity (Mw/Mn) were determined by the polystyrene equivalent value as measured by gel permeation chromatography (GPC). As a result, it was found that the weight average molecular weight was 9,200, and the dispersity was 1.52.

Further, the polymeric compound (1) was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was a0/a11/a3=39.5/41.4/19.1.

[Chemical Formula 79]

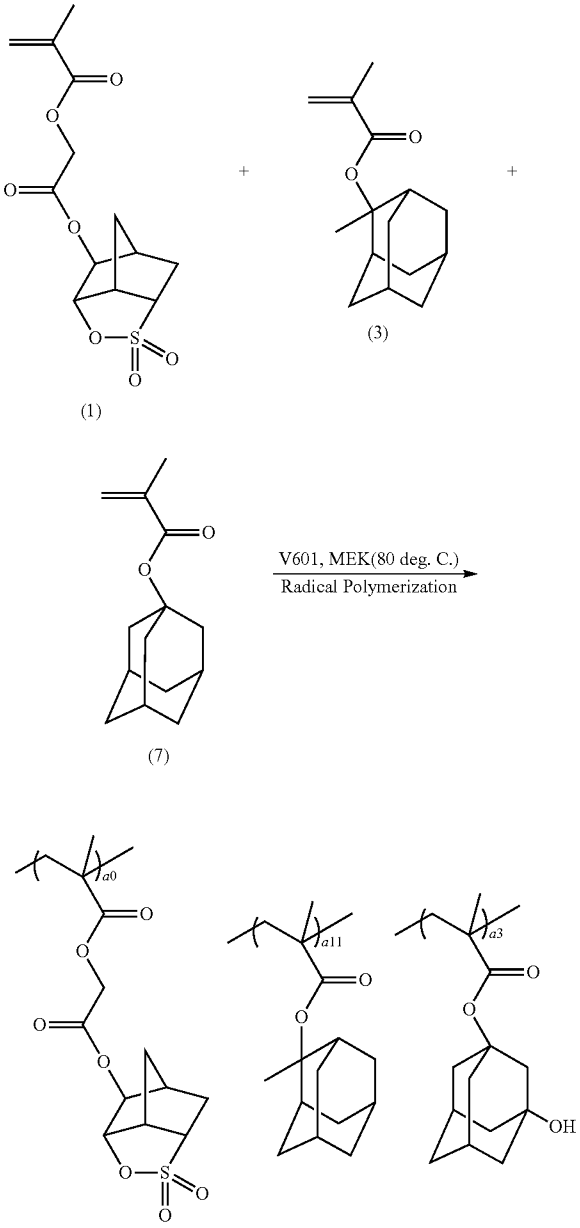

(1) + (3) + (7)

Polymeric Compound (1)

Polymer Synthesis Examples 2 and 3

Synthesis of Polymeric Compound (2) and Polymeric Compound (3)

Other polymeric compounds (2) and (3) of ternary systems were synthesized by the same method as described in the above Polymer Synthesis Example 1, with the exception that monomers for deriving the structural units of the respective polymeric compounds were used in a predetermined molar ratio.

With respect to the polymeric compounds (2) and (3), the structure, the weight average molecular weight (Mw) and the molecular weight dispersity (Mw/Mn) determined by the polystyrene equivalent value as measured by gel permeation chromatography (GPC), and the composition of the copolymer (ratio (molar ratio) of the respective structural units within the structural formula) determined by carbon 13 nuclear magnetic resonance spectroscopy (600 MHz, $^{13}$C-NMR) are shown below, respectively.

[Chemical Formula 80]

Polymeric Compound (2)

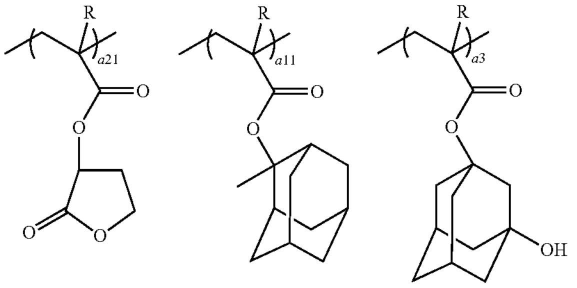

[Mw: 7,100, Mw/Mn: 1.48; a21/a11/a3=47.6/36.8/15.6]

[Chemical Formula 81]

Polymeric Compound (3)

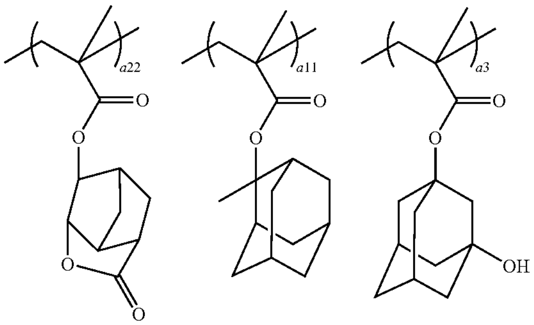

[Mw: 7,370, Mw/Mn: 1.81; a22/a11/a3=39.7/39.4/20.9]

Polymer Synthesis Example 4

Synthesis of Polymeric Compound (4)

32.32 g (102.29 mmol) of the compound (1), 11.93 g (34.10 mmol) of the compound (2), and 8.05 g (34.10 mmol) of the compound (7) were dissolved in 106.77 g of methyl ethyl ketone (MEK) in a three-necked flask equipped with a thermometer and a reflux tube. Then, 17.3 mmol of dimethyl azobis(isobutyrate) (V-601) as a polymerization initiator was added and dissolved in the resulting solution. The resulting solution was dropwise added to 67.00 g of MEK (in which 67.00 g (255.73 mmol) of the compound was dissolved in advance) heated to 80° C. over 3 hours under a nitrogen atmosphere. Following completion of the dropwise addition, the reaction solution was stirred on heating for 2 hours, and then cooled to room temperature. The reaction polymer solution as obtained was dropwise added to an excess amount of n-heptane, and an operation to deposit a polymer was conducted. Thereafter, the precipitated white powder was separated by filtration, followed by washing with an n-heptane/2-propanol mixed solvent and with methanol and drying, thereby obtaining 65 g of a polymeric compound (4) as an objective compound.

With respect to the polymeric compound (4), the weight average molecular weight (Mw) and the molecular weight dispersity (Mw/Mn) were determined by the polystyrene equivalent value as measured by gel permeation chromatography (GPC). As a result, it was found that the weight average molecular weight was 8,300, and the dispersity was 1.54. Further, the polymeric compound (4) was analyzed by carbon 13 nuclear magnetic resonance spectroscopy (600 MHz, $^{13}C$-NMR). As a result, it was found that the composition of the copolymer (ratio (molar ratio) of the respective structural units within the structural formula) was a0/a12/a13/a3=34.8/10.9/42.7/11.6.

[Chemical Formula 82]

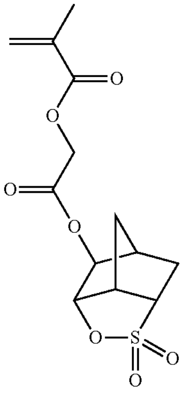

(1)

+

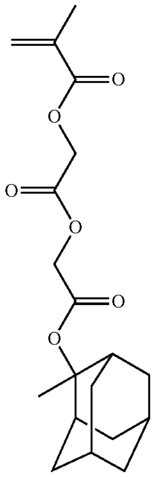

(2)

+

-continued

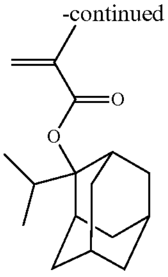

(4)

+

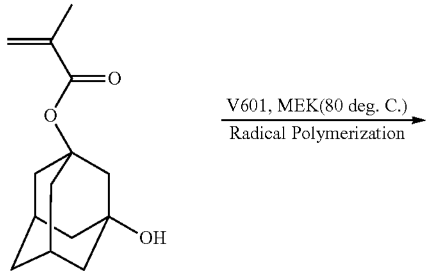

(7)

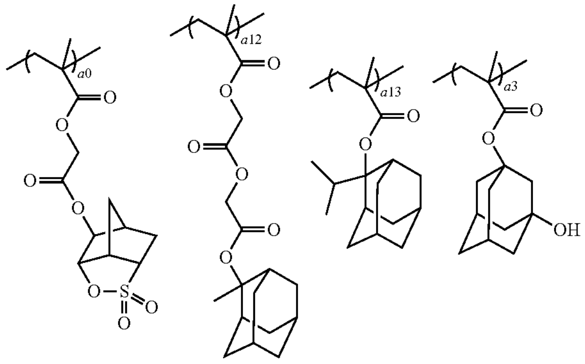

Polymeric Compound (4)

Polymer Synthesis Example 5

Synthesis of Polymeric Compound (5)

Another polymeric compound (5) of a quaternary system was synthesized by the same method as described in the above Polymer Synthesis Example 4, with the exception that monomers for deriving the structural units of the respective polymeric compounds were used in a predetermined molar ratio.

With respect to the polymeric compound (5), the structure, the weight average molecular weight (Mw) and the molecular weight dispersity (Mw/Mn) determined by the polystyrene equivalent value as measured by gel permeation chromatography (GPC), and the composition of the copolymer (ratio (molar ratio) of the respective structural units within the structural formula) determined by carbon 13 nuclear magnetic resonance spectroscopy (600 MHz, $^{13}C$-NMR) are shown below, respectively.

[Chemical Formula 83]

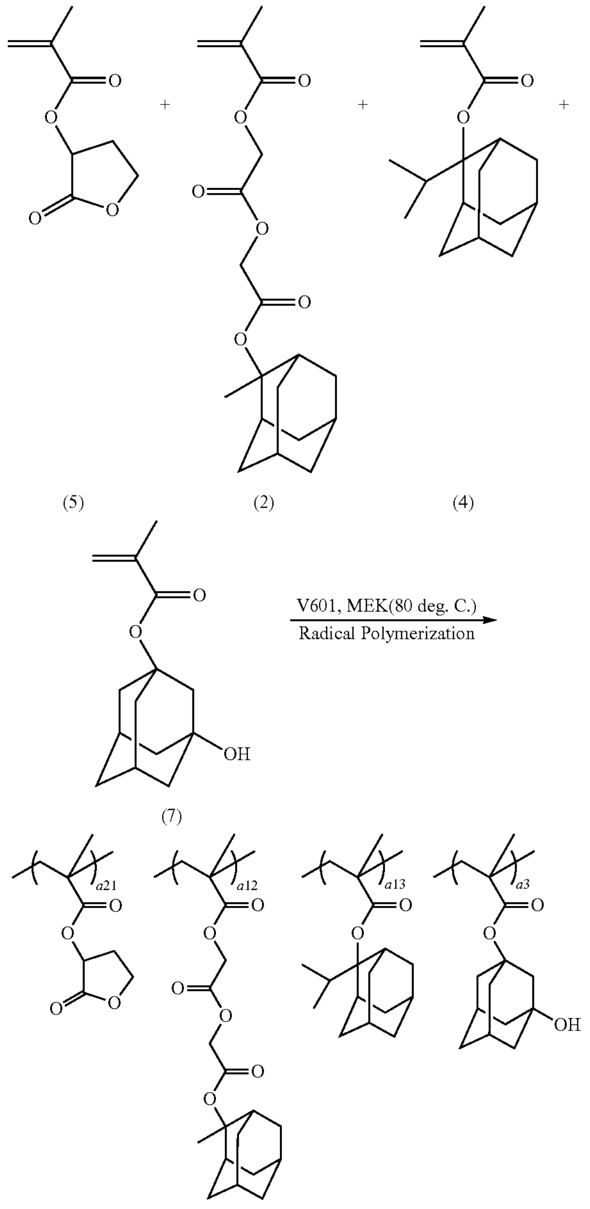

(5) (2) (4) (7)

Polymeric Compound (5)

[Mw: 10,000, Mw/Mn: 1.38; a21/a12/a13/a3=25.8/24.0/36.8/13.4]

<Synthesis of Fluorine-Containing Resin Component>

Fluorine-containing resin components used as the fluorine-containing compound component (F) in the present examples were synthesized as described in the following polymer synthesis examples.

Polymer Synthesis Example 6

Synthesis of Fluorine-Containing Resin (1)

i) Synthesis of 7,7,7-trifluoro-3-ethyl-3-heptanol 1.3 g of magnesium, 10.0 g of 1-bromo-4,4,4-trifluorobutane and 20 g of tetrahydrofuran were added to a four-necked flask equipped with a nitrogen feeding pipe, a reflux condenser, a dropping funnel and a thermometer, and a Grignard reagent was prepared by a conventional method. Then, a mixed solution containing 5.0 g of 3-pentanone and 4 g of tetrahydrofuran was dropwise added to the obtained Grignard reagent at a temperature of 25 to 35° C. over 30 minutes, followed by stirring at the same temperature for 1 hour. The reaction mixture was treated by a conventional method, and the resulting organic phase was washed with water, followed by drying with anhydrous magnesium sulfate. Thereafter, the resultant was concentrated under reduced pressure, thereby obtaining 7.9 g of 7,7,7-trifluoro-3-ethyl-3-heptanol in the form of a pale yellow oily matter.

ii) Synthesis of 7,7,7-trifluoro-3-ethyl-3-heptyl methacrylate 7.9 g of 7,7,7-trifluoro-3-ethyl-3-heptanol obtained above, 0.2 g of 4-dimethylaminopyridine, 7.1 g of triethylamine and 10 g of acetonitrile were added to a four-necked flask equipped with a stirrer, a thermometer and a dropping funnel, and were dissolved by stirring. Subsequently, 6.7 g of methacrylic acid chloride was dropwise added to the resulting solution at about 75° C. over 30 minutes, followed by stirring at the same temperature for 2 hours. Then, the reaction solution was cooled to room temperature, and washing was conducted once with a mixed solution containing 8.8 g of potassium carbonate and 100 ml of water, and once with a 10 weight % saline solution. Thereafter, the resultant was dried with anhydrous magnesium sulfate, and then concentrated under reduced pressure. The obtained concentrate was purified by silica gel column chromatography, thereby obtaining 5.7 g of 7,7,7-trifluoro-3-ethyl-3-heptyl methacrylate.

The 1H-NMR data of the obtained 7,7,7-trifluoro-3-ethyl-3-hepthyl methacrylate were as follows.

$^1$H-NMR ($CDCl_3$) δ: 0.82-0.87 (tr, 6H, —$CH_3$), 1.46-1.58 (m, 2H, —$CH_2$ —), 1.78-1.97 (m, 9H, ═C—$CH_3$, —C—$CH_2$—), 1.98-2.16 (m, 2H, $CF_3CH_2$—), 5.49 (s, 1H, C═$CH_2$), 6.01 (s, 1H, C═$CH_2$).

From the results shown above, it was confirmed that the compound had a structure represented by formula (I-1) shown below.

[Chemical Formula 84]

(I-1)

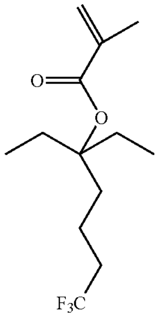

iii) Synthesis of Fluorine-Containing Resin (1)

27 g of tetrahydrofuran and 11.98 g of the 7,7,7-trifluoro-3-ethyl-3-hepthyl methacrylate obtained in the above section ii) were charged into a four-necked flask equipped with a nitrogen feeding pipe, a reflux condenser, a dropping funnel and a thermometer, and the flask was purged with nitrogen, followed by elevating the temperature to 67° C. While maintaining that temperature, a solution obtained by dissolving 0.30 g of 2,2'-azobis(2,4-dimethylvaleronhrile) in 3 g of tetrahydrofuran was dropwise added thereto over 10 minutes. Following completion of the dropwise addition, while maintaining that temperature, the resultant was stirred for 6 hours, and then cooled to room temperature. The resulting polymerization reaction solution was dropwise added to an excess amount of a methanol/water mixed solution, and the precipitated resin was separated by filtration, followed by washing and drying, thereby obtaining 4.0 g of a fluorine-containing resin (1) represented by chemical formula shown below, as an objective compound in the form of a white solid.

The weight average molecular weight (Mw) and dispersity (Mw/Mn) of the obtained fluorine-containing resin (1) were 8,200 and 1.50, respectively.

[Chemical Formula 85]

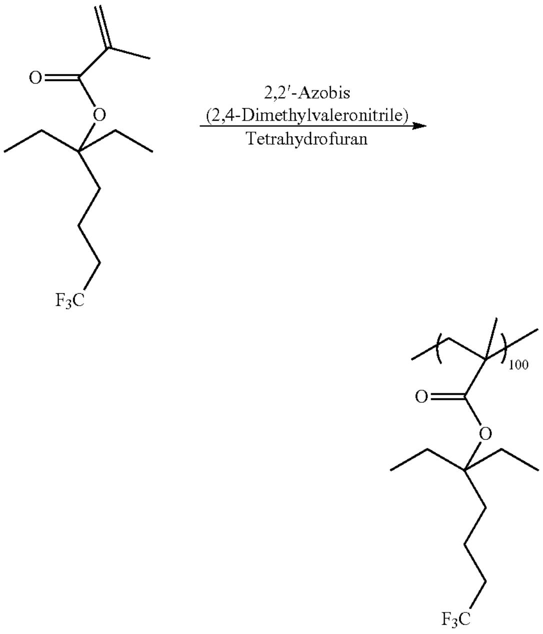

Fluorine-Containing Resin (1)

Polymer Synthesis Example 7

Synthesis of Fluorine-Containing Resin (2)

i) First Step; Synthesis of 2,2,2-trifluoroethyl bromoacetate (compound (III))

400 g of acetone, 100 g of 2,2,2-trifluoroethanol (compound (I)) and 121.3 g of triethylamine were added to a four-necked flask equipped with a stirrer, a nitrogen-feeding pipe, a dropping funnel and a thermometer. The four-necked flask was purged with nitrogen, and cooled to 0° C. Then, 86.1 g of bromoacetylbromide (compound (II)) was dropwise added thereto at 0 to 5° C. over 3 hours, followed by stirring at 0° C. for 2 hours. Thereafter, 300 g of saturated sodium hydrocarbonate aqueous solution was added thereto to stop the reaction, and extraction was conducted using ethyl acetate. The obtained organic phase was washed with water, followed by drying with anhydrous magnesium sulfate and concentration under reduced pressure. The resulting concentrate was purified by distillation under reduced pressure, thereby obtaining 72.4 g of 2,2,2-trifluoroethyl bromoacetate (compound (III).

ii) Second Step and Third Step; Synthesis of 1,1-diethyl-2-(2,2,2-trifluoroethoxycarbonyl)ethyl methacrylate (compound (8))

125.6 g of tetrahydrofuran, 24.7 g of 3-pentanone (compound (IV)) and 23.6 g of a zinc powder were added and stirred in a four-necked flask equipped with a stirrer, a nitrogen-feeding pipe, a dropping funnel and a thermometer. The flask was purged with nitrogen, and then, iodine was added thereto in a catalyst amount, and 6.2 g of the compound (III) obtained in the first step was further added at 45° C. Thereafter, 55.3 g of the compound (III) obtained in the first step was dropwise added at 55° C. over 30 minutes, followed by stirring for 90 minutes.

Subsequently, the reaction solution was cooled to room temperature, and 31.7 g of triethylamine was added thereto. Then, 32.8 g of methacrylic acid chloride (compound (VI)) was dropwise added thereto at 20° C. over 40 minutes, followed by stirring for 2 hours. Thereafter, 250 g of a 10% sodium hydrocarbonate aqueous solution was added to stop the reaction, and extraction was conducted with ethyl acetate. The obtained organic phase was washed with a 10% sodium hydrocarbonate aqueous solution, and then with water, followed by drying with anhydrous magnesium sulfate and concentration under reduced pressure. The resulting concentrate was purified by distillation under reduced pressure, thereby obtaining 57.5 g of 1,1-diethyl-2-(2,2,2-trifluoroethoxycarbonyl)ethyl methacrylate (compound (8)) as a fluorine-containing compound (C1).

[Chemical Formula 86]

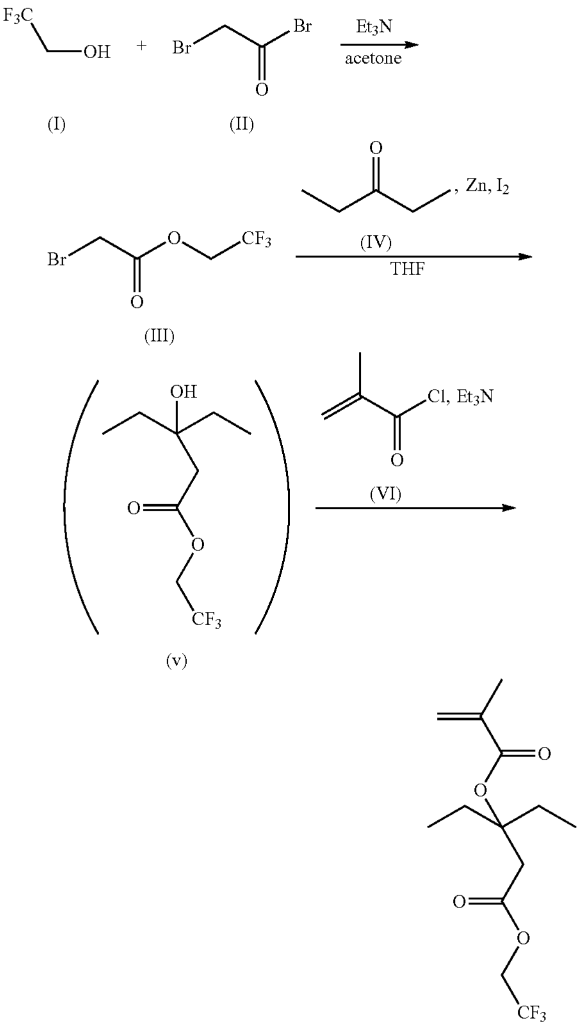

(8)

The obtained compound (8) was analyzed by $^1$H-NMR. The results are shown below.

$^1$H-NMR ($CDCl_3$) δ: 0.92 (tr, 6H, —CH3), 1.90 (s, 3H, =C—$CH_3$), 1.86-2.08 (m, 4H, —C—$CH_2$—), 3.09 (s, 2H, —$CH_2$—C(=O)—), 4.49 (q, 2H, $CF_3$—$CH_2$—), 5.51 (m, 1H, C=$CH_2$), 6.03 (s, 1H, C=$CH_2$).

From the results shown above, it was confirmed that the compound (8) had a structure shown above.

iii) Synthesis of Fluorine-Containing Resin (2)

3.84 g of isopropylalcohol was added to a four-necked flask equipped with a nitrogen-feeding pipe, a reflux condenser, a dropping funnel and a thermometer, and the flask was purged with nitrogen. Then, the flask was heated to 80° C., and a solution obtained by dissolving 15.0 g of the compound (8) and 0.582 g of azobisisobutyronitrile in 10.0 g of isopropylalcohol was dropwise added over 2 hours. Following completion of the dropwise addition, stirring was conducted for 4 hours while maintaining that temperature, and then the resultant was cooled to room temperature. The obtained polymerization reaction solution was dropwise added to an excess amount of an isopropylalcohol/water mixed solution to obtain a precipitate. The obtained precipitate was dissolved in tetrahydrofuran, and the resultant was dropwise added to an excess amount of an isopropylalcohol/water mixed solution. The precipitated resin was separated by filtration, followed by washing and drying, thereby obtaining 7.1 g of a fluorine-containing resin (2) in the form of a white solid.

The obtained fluorine-containing resin (2) had a weight average molecular weight (Mw) of 8,000 and a molecular weight dispersity (Mw/Mn) of 1.38 (polystyrene equivalent value determined by gel permeation chromatography (GPC)).

[Chemical Formula 87]

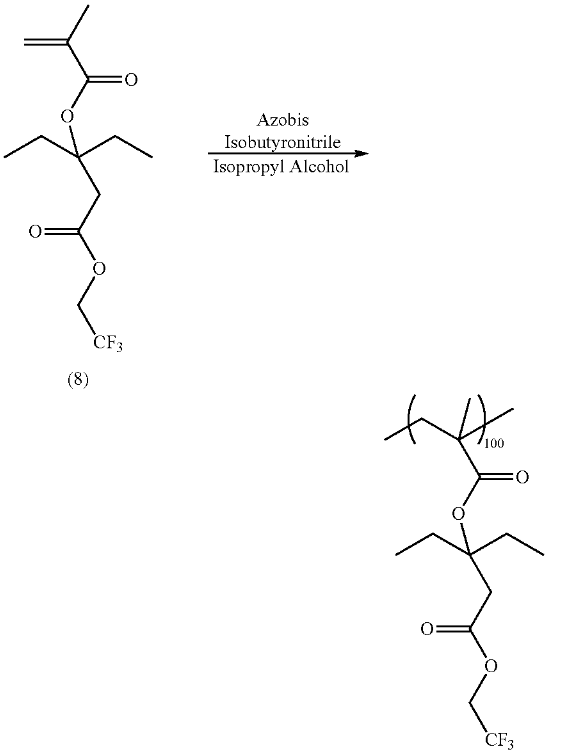

(8)

Fluorine-Containing Resin (2)

Polymer Synthesis Example 8

Synthesis of Fluorine-Containing Resin (3)

i) First Step; Synthesis of 2,2,3,3,3-pentafluoropropyl bromoacetate (compound (III-b))

400 g of acetone, 100 g of 2,2,3,3,3-pentafluoropropanol (compound (I-b)) and 121.3 g of triethylamine were added to a four-necked flask equipped with a stirrer, a nitrogen-feeding pipe, a dropping funnel and a thermometer, and synthesis was conducted in the same manner as in the above synthesis of compound (III), thereby obtaining 49.6 g of 2,2,3,3,3-pentafluoropropyl bromoacetate (compound (III-b)).

ii) Second Step and Third Step; Synthesis of 1,1-diethyl-2-(2,2,3,3,3-pentafluoropropoxycarbonyl)ethyl methacrylate (compound (9))

224.7 g of tetrahydrofuran, 24.7 g of 3-pentanone (compound (IV)) and 23.6 g of a zinc powder were added and stirred in a four-necked flask equipped with a stirrer, a nitrogen-feeding pipe, a dropping funnel and a thermometer. The flask was purged with nitrogen, and then, iodine was added thereto in a catalyst amount, and 7.6 g of the compound (III-b) obtained in the first step was further added at 45° C. Thereafter, 68.3 g of the compound (III-b) obtained in the first step was dropwise added at 55° C. over 30 minutes, followed by stirring for 90 minutes.

Subsequently, the reaction solution was cooled to room temperature, and 42.5 g of triethylamine was added thereto. Then, 41.0 g of methacrylic acid chloride (compound (VI)) was dropwise added thereto at 20° C. over 40 minutes, and the same procedure as in the above synthesis of the compound (1) was performed, thereby obtaining 51.1 g of 1,1-diethyl-2-(2,2,3,3,3-pentafluoropropoxycarbonyl)ethyl methacrylate (compound (9)) as a fluorine-containing compound (C1).

[Chemical Formula 88]

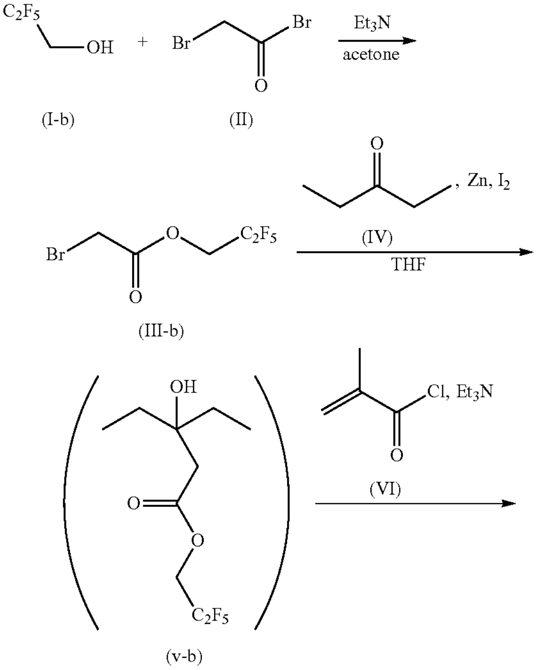

(I-b) (II) (III-b) (IV) (v-b) (VI)

-continued

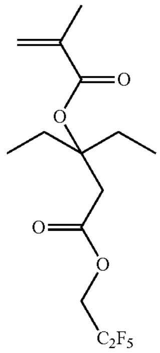

(9)

The obtained compound (9) was analyzed by $^1$H-NMR. The results are shown below.

$^1$H-NMR ($CDCl_3$) δ: 0.90 (tr, 6H, —$CH_3$), 1.90 (s, 3H, =C—$CH_3$), 1.86-2.08 (m, 4H, —C—$CH_2$—), 3.08 (s, 2H, —$CH_2$—C(=O)—), 4.53 (q, 2H, $CF_3$—$CH_2$—), 5.52 (m, 1H, C=$CH_2$), 6.03 (s, 1H, C=$CH_2$).

From the results shown above, it was confirmed that the compound (9) had a structure shown above.

iii) Synthesis of Fluorine-Containing Resin (3)

4.16 g of isopropylalcohol was added to a four-necked flask equipped with a nitrogen-feeding pipe, a reflux condenser, a dropping funnel and a thermometer, and the flask was purged with nitrogen. Then, the flask was heated to 80° C., and a solution obtained by dissolving 18.0 g of the compound (9) and 0.682 g of azobisisobutyronitrile in 12.0 g of isopropylalcohol was dropwise added over 2 hours. Following completion of the dropwise addition, stirring was conducted for 4 hours while maintaining that temperature, and then the resultant was cooled to room temperature. The obtained polymerization reaction solution was dropwise added to an excess amount of an isopropylalcohol/water mixed solution to obtain a precipitate. The obtained precipitate was dissolved in tetrahydrofuran, and the resultant was dropwise added to an excess amount of an isopropylalcohol/water mixed solution. The precipitated resin was separated by filtration, followed by washing and drying, thereby obtaining, 7.1 g of a fluorine-containing resin (3) in the form of a white solid.

The obtained fluorine-containing resin (3) had a weight average molecular weight (Mw) of 7,100 and a molecular weight dispersity (Mw/Mn) of 1.36 (polystyrene equivalent values determined by gel permeation chromatography (GPC)).

[Chemical Formula 89]

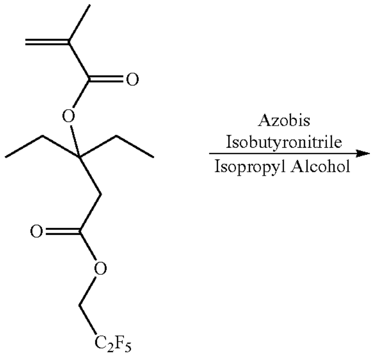

(9)

-continued

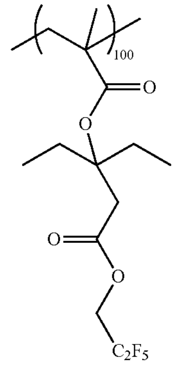

Fluorine-Containing Resin (3)

Polymer Synthesis Example 9

Synthesis of Fluorine-Containing Resin (4)

(i) Synthesis of Compound (10)

296.0 g of tetrahydrofuran, 48.9 g of cyclohexanone (compound (IV-b)) and 35.0 g of a zinc powder were added and stirred in a four-necked flask equipped with a stirrer, a nitrogen-feeding pipe, a dropping funnel and a thermometer. The flask, was purged with nitrogen, and then, iodine was added thereto in a catalyst amount, and 10.0 g of the compound (III) obtained in. Synthesis Example 1 was further added at 55° C. Thereafter, 90.0 g of the compound (III) was added at 60° C. over 30 minutes, followed by stirring for 120 minutes.

Subsequently, the reaction solution was cooled to room temperature, and 593 g of triethylamine was added thereto. Then, 56.8 g of methacrylic acid chloride (compound (VI)) was dropwise added thereto at 20° C. over 40 minutes, and the same procedure as in the above synthesis of the compound (8) was performed, thereby obtaining 56.6 g of 1-cyclohexyl-2-(2,2,2-trifluoroethoxycarbonyl)ethyl methacrylate (compound (10)).

The obtained compound (10) was analyzed by $^1$H-NMR. The results are shown below.

$^1$H-NMR ($CDCl_3$) δ: 1.20-1.38 (m, 1H, c-$C_6H_{10}$), 1.48-1.71 (m, 7H, c-$C_6H_{10}$), 1.93 (s, 3H, =C—$CH_3$), 2.30-2.38 (m, 2H, c-$C_6H_{10}$), 3.12 (s, 2H, —$CH_2$—C(=O)—), 4.44 (q, 2H, $CF_3$—$CH_2$—), 5.56 (m, 1H, C=$CH_2$), 6.09 (s, 1H, C=$CH_2$).

[Chemical Formula 90]

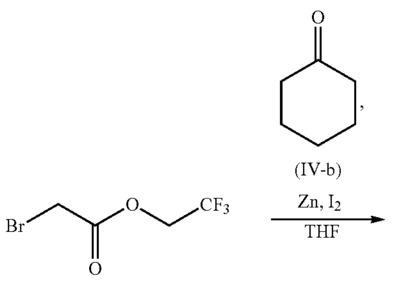

-continued

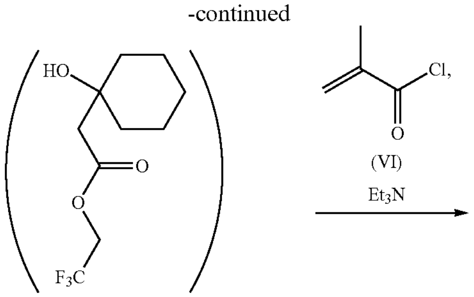

(V-c)

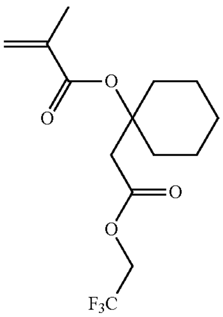

(10)

(ii) Synthesis of Fluorine-Containing Resin (4)

3.84 g of isopropylalcohol was added to a four-necked flask equipped with a nitrogen-feeding pipe, a reflux condenser, a dropping funnel and a thermometer, and the flask was purged with nitrogen. Then, the flask was heated to 80° C., and a solution obtained by dissolving 15.0 g of the compound (10) and 0.960 g of dimethyl-2,2'-azobis(2-methylpropionate) in 10.0 g of isopropylalcohol was dropwise added over 2 hours, Following completion of the dropwise addition, stirring was conducted for 4 hours while maintaining that temperature, and then the resultant was cooled to room temperature. The obtained polymerization reaction solution was dropwise added to an excess amount of an isopropylalcohol/water mixed solution to obtain a precipitate. The obtained precipitate was dissolved in tetrahydrofuran, and the resultant was dropwise added to an excess amount of an isopropylalcohol/water mixed solution. The precipitated resin was separated by filtration, followed by washing and drying, thereby obtaining 8.9 g of a fluorine-containing resin (4) in the form of a white solid.

The obtained fluorine-containing resin (4) had a weight average molecular weight (Mw) of 8,300 and a molecular weight dispersity (Mw/Mn) of 1.48 (polystyrene equivalent values determined by gel permeation chromatography (GPC)).

[Chemical Formula 91]

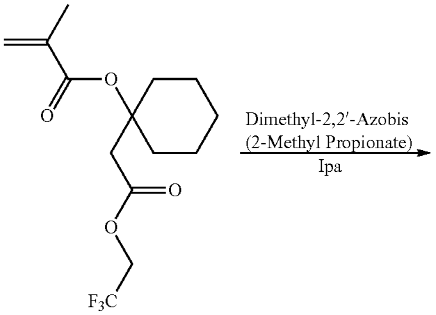

(10)

-continued

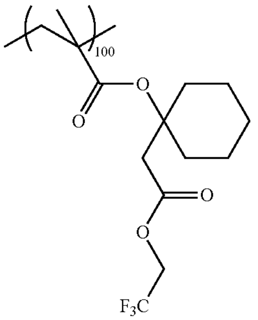

Fluorine-Containing Resin(4)

Polymer Synthesis Example 10

Synthesis of Fluorine-Containing Resin (5)

(i) Synthesis of Compound (11)

444.0 g of tetrahydrofuran, 70.6 g of cyclohexanone (compound (IV-b)) and 51.0 g of a zinc powder were added and stirred in a four-necked flask equipped with a stirrer, a nitrogen-feeding pipe, a dropping funnel and a thermometer. The flask was purged with nitrogen, and then, iodine was added thereto in a catalyst amount, and 15.0 g of the compound (III-b) obtained in Synthesis Example 3 was further added at 55° C. Thereafter, 135.0 g of the compound (III-b) was added at 60° C. over 30 minutes, followed by stirring for 90 minutes.

Subsequently, the reaction solution was cooled to room temperature, and 72.8 g of triethylamine was added thereto. Then, 69.4 g of methacrylic acid chloride (compound (VI)) was dropwise added thereto at 20° C. over 40 minutes, and the same procedure as in the above synthesis of the compound (8) was performed, thereby obtaining 38.1 g of 1-cyclohexane-2-(2,2,3,3,3-pentafluoropropoxycarbonyl)ethyl methacrylate (compound (11)).

The obtained compound (11) was analyzed by $^1$H-NMR. The results are shown below.

$^1$H-NMR ($CDCl_3$) δ: 1.21-1.38 (m, 1H, c-$C_6H_{10}$), 1.48-1.72 (m, 7H, c-$C_6H_{10}$), 1.94 (s, 3H, =C—$CH_3$), 2.28-2.39 (m, 2H, c-$C_6H_{10}$), 3.13 (s, 2H, —$CH_2$—C(=O)—), 4.51 (t, 2H, —$CF_2$—$CH_2$—), 5.55 (m, 1H, C=$CH_2$), 6.07 (s, 1H, C=$CH_2$).

[Chemical Formula 92]

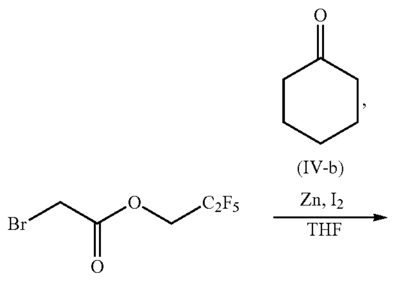

(III-b)

-continued

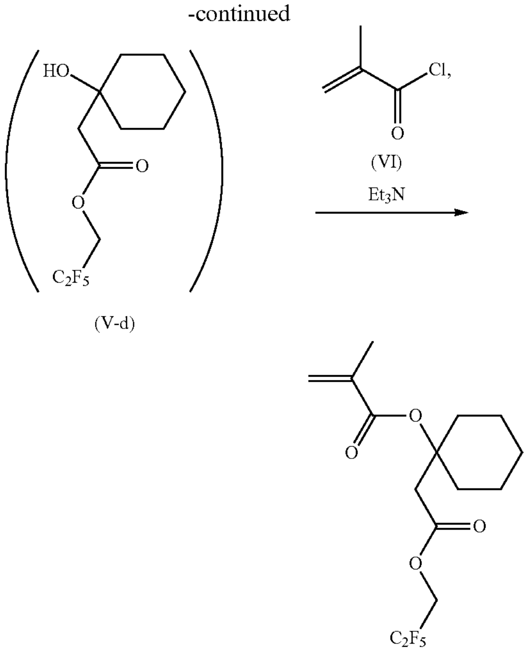

(V-d)

(VI)

(11)

(ii) Synthesis of Fluorine-Containing Resin (5)

3.84 g of isopropylalcohol was added to a four-necked flask equipped with a nitrogen-feeding pipe, a reflux condenser, a dropping funnel and a thermometer, and the flask was purged with nitrogen. Then, the flask was heated to 80° C., and a solution obtained by dissolving 15.0 g of the compound (11) and 0.916 g of dimethyl-2,2'-azobis(2-methylpropionate) in 10.0 g of isopropylalcohol was dropwise added over 2 hours. Following completion of the dropwise addition, stirring was conducted for 4 hours while maintaining that temperature, and then the resultant was cooled to room temperature. The obtained polymerization reaction solution was dropwise added to an excess amount of an isopropylalcohol/water mixed solution to obtain a precipitate. The obtained precipitate was dissolved in tetrahydrofuran, and the resultant was dropwise added to an excess amount of an isopropylalcohol/water mixed solution. The precipitated resin was separated by filtration, followed by washing and drying, thereby obtaining 9.6 g of a fluorine-containing resin (5) in the form of a white solid.

The obtained fluorine-containing resin (5) had a weight average molecular weight (Mw) of 8,900 and a molecular weight dispersity (Mw/Mn) of 1.44 (polystyrene equivalent values determined by gel permeation chromatography (GPC)).

[Chemical Formula 93]

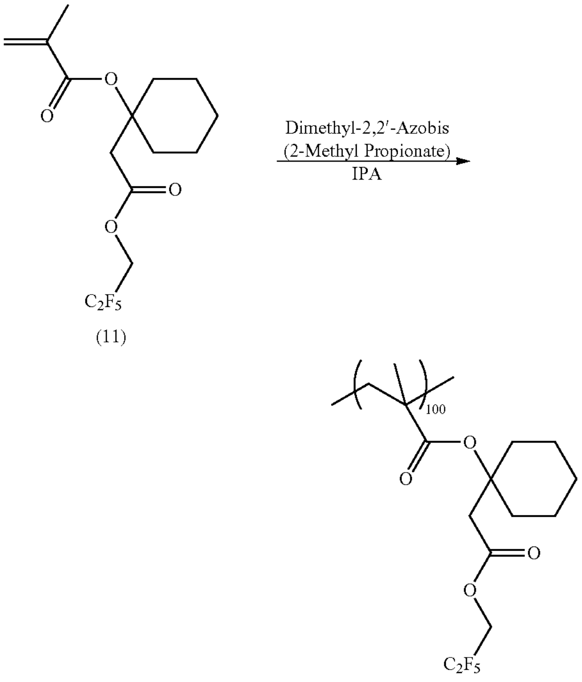

(11)

Fluorine-Containing Resin (5)

Preparation of Positive Resist Composition Solution

Examples 1 to 10, Comparative Examples 1 to 15

The components shown in Tables 1 and 2 were mixed together and dissolved to obtain positive resist composition solutions.

TABLE 1

| | Component (A) | Component (B) | Component (F) | Component (D) | Component (E) | Component (S) | |
|---|---|---|---|---|---|---|---|
| Comparative Example 1 | (A)-1 [100] | (B-1) [8.0] | (F)-1 [2.0] | (D)-1 [1.2] | (E)-1 [1.32] | (S)-1 [10] | (S)-2 [2,400] |
| Comparative Example 2 | (A)-2 [100] | (B-1) [8.0] | (F)-1 [2.0] | (D)-1 [1.2] | (E)-1 [1.32] | (S)-1 [10] | (S)-2 [2,400] |
| Example 1 | (A)-3 [100] | (B-1) [8.0] | (F)-1 [2.0] | (D)-1 [1.2] | (E)-1 [1.32] | (S)-1 [10] | (S)-2 [2,400] |
| Comparative Example 3 | (A)-1 [100] | (B-1) [8.0] | (F)-2 [2.0] | (D)-1 [1.2] | (E)-1 [1.32] | (S)-1 [10] | (S)-2 [2,400] |
| Comparative Example 4 | (A)-2 [100] | (B-1) [8.0] | (F)-2 [2.0] | (D)-1 [1.2] | (E)-1 [1.32] | (S)-1 [10] | (S)-2 [2,400] |
| Example 2 | (A)-3 [100] | ((B-1) [8.0] | (F)-2 [2.0] | (D)-1 [1.2] | (E)-1 [1.32] | (S)-1 [10 ] | (S)-2 [2,400] |
| Comparative Example 5 | (A)-1 [100] | (B-1) [8.0] | (F)-3 [2.0] | (D)-1 [1.2] | (E)-1 [1.32] | (S)-1 [10] | (S)-2 [2,400] |
| Comparative Example 6 | (A)-2 [100] | (B-1) [8.0] | (F)-3 [2.0] | (D)-1 [1.2] | (E)-1 [1.32] | (S)-1 [10] | (S)-2 [2,400] |

TABLE 1-continued

| | Component (A) | Component (B) | Component (F) | Component (D) | Component (E) | Component (S) | |
|---|---|---|---|---|---|---|---|
| Example 3 | (A)-3 [100] | (B-1) [8.0] | (F)-3 [2.0] | (D)-1 [1.2] | (E)-1 [1.32] | (S)-1 [10] | (S)-2 [2,400] |
| Comparative Example 7 | (A)-1 [100] | (B-1) [8.0] | (F)-4 [2.0] | (D)-1 [1.2] | (E)-1 [1.32] | (S)-1 [10] | (S)-2 [2,400] |
| Comparative Example 8 | (A)-2 [100] | (B-1) [8.0] | (F)-4 [2.0] | (D)-1 [1.2] | (E)-1 [1.32] | (S)-1 [10] | (S)-2 [2,400] |
| Example 4 | (A)-3 [100] | (B-1) [8.0] | (F)-4 [2.0] | (D)-1 [1.2] | (E)-1 [1.32] | (S)-1 [10] | (S)-2 [2,400] |
| Comparative Example 9 | (A)-1 [100] | (B-1) [8.0] | (F)-5 [2.0] | (D)-1 [1.2] | (E)-1 [1.32] | (S)-1 [10] | (S)-2 [2,400] |
| Comparative Example 10 | (A)-2 [100] | (B-1) [8.0] | (F)-5 [2.0] | (D)-1 [1.2] | (E)-1 [1.32] | (S)-1 [10] | (S)-2 [2,400] |
| Example 5 | (A)-3 [100] | (B-1) [8.0] | (F)-5 [2.0] | (D)-1 [1.2] | (E)-1 [1.32] | (S)-1 [10] | (S)-2 [2,400] |

TABLE 2

| | Component (A) | Component (B) | Component (F) | Component (D) | Component (E) | Component (S) | |
|---|---|---|---|---|---|---|---|
| Comparative Example 11 | (A)-4 [100] | (B-1) [8.0] | (F)-1 [2.0] | (D)-1 [1.2] | (E)-1 [1.32] | (S)-1 [10] | (S)-2 [2,400] |
| Example 6 | (A)-5 [100] | (B-1) [8.0] | (F)-1 [2.0] | (D)-1 [1.2] | (E)-1 [1.32] | (S)-1 [10] | (S)-2 [2,400] |
| Comparative Example 12 | (A)-4 [100] | (B-1) [8.0] | (F)-2 [2.0] | (D)-1 [1.2] | (E)-1 [1.32] | (S)-1 [10] | (S)-2 [2,400] |
| Example 7 | (A)-5 [100] | (B-1) [8.0] | (F)-2 [2.0] | (D)-1 [1.2] | (E)-1 [1.32] | (S)-1 [10] | (S)-2 [2,400] |
| Comparative Example 13 | (A)-4 [100] | (B-1) [8.0] | (F)-3 [2.0] | (D)-1 [1.2] | (E)-1 [1.32] | (S)-1 [10] | (S)-2 [2,400] |
| Example 8 | (A)-5 [100] | ((B-1) [8.0] | (F)-3 [2.0] | (D)-1 [1.2] | (E)-1 [1.32] | (S)-1 [10] | (S)-2 [2,400] |
| Comparative Example 14 | (A)-4 [100] | (B-1) [8.0] | (F)-4 [2.0] | (D)-1 [1.2] | (E)-1 [1.32] | (S)-1 [10] | (S)-2 [2,400] |
| Example 9 | (A)-5 [100] | (B-1) [8.0] | (F)-4 [2.0] | (D)-1 [1.2] | (E)-1 [1.32] | (S)-1 [10] | (S)-2 [2,400] |
| Comparative Example 15 | (A)-4 [100] | (B-1) [8.0] | (F)-5 [2.0] | (D)-1 [1.2] | (E)-1 [1.32] | (S)-1 [10] | (S)-2 [2,400] |
| Example 10 | (A)-5 [100] | (B-1) [8.0] | (F)-5 [2.0] | (D)-1 [1.2] | (E)-1 [1.32] | (S)-1 [10] | (S)-2 [2,400] |

In Tables 1 and 2, the reference characters indicate the following. Further, the values in brackets [ ] indicate the amount (in terms of parts by weight) of the component added.

(A)-1: the aforementioned polymeric compound (2)

(A)-2: the aforementioned polymeric compound (3)

(A)-3: the aforementioned polymeric compound (1)

(A)-4: the aforementioned polymeric compound (5)

(A)-5: the aforementioned polymeric compound (4)

(B)-1: (4-methylphenyl)diphenylsulfonium nonafluoro-n-butane sulfonate (F)-1: the aforementioned fluorine-containing resin (1)

(F)-2: the aforementioned fluorine-containing resin (2)

(F)-3: the aforementioned fluorine-containing resin (3)

(F)-4: the aforementioned fluorine-containing resin (4)

(F)-5: the aforementioned fluorine-containing resin (5)

(D)-1: tri-n-pentylamine (E)-1: salicylic acid (5)-1: γ-butyrolactone (S)-2: a mixed solvent of PGMEA/PGME=6/4 (weight ratio)

<Evaluation of Hydrophobicity of Resist Films>

Using the obtained positive resist compositions, the static contact angle and the dynamic contact angle (sliding angle, advancing angle and receding angle) of the resist film surface prior to exposure were measured by the following procedure, to thereby evaluate the hydrophobicity of the resist film.

[Evaluation of Hydrophobicity]

Each of the obtained positive resist composition solutions was applied onto an 8-inch silicon wafer using a spinner, and was then prebaked on a hotplate at 110° C. for 60 seconds and dried, thereby forming a resist film having a film thickness of 120 nm.

Subsequently, 50 μL of water was dropped onto the surface of the resist film (prior to exposure), and the contact angles were measured using DROP MASTER-700 (product name; manufactured by Kyowa Interface Science Co., Ltd.). The results are shown in Tables 3 and 4.

TABLE 3

| | Sliding angle (°) | Advancing angle (°) | Receding angle (°) | Static contact angle (°) |
|---|---|---|---|---|
| Comparative Example 1 | 17.0 | 99.0 | 82.3 | 90.7 |
| Comparative Example 2 | 16.0 | 99.1 | 80.9 | 92.5 |
| Example 1 | 15.0 | 100.0 | 84.2 | 94.3 |
| Comparative Example 3 | 15.0 | 91.4 | 75.3 | 91.3 |
| Comparative Example 4 | 15.0 | 92.2 | 74.9 | 90.6 |

TABLE 3-continued

| | Sliding angle (°) | Advancing angle (°) | Receding angle (°) | Static contact angle (°) |
|---|---|---|---|---|
| Example 2 | 13.0 | 89.6 | 77.0 | 90.9 |
| Comparative Example 5 | 19.0 | 99.0 | 77.5 | 96.6 |
| Comparative Example 6 | 19.0 | 99.8 | 77.1 | 95.9 |
| Example 3 | 17.0 | 99.2 | 79.2 | 96.2 |
| Comparative Example 7 | 15.0 | 90.8 | 74.6 | 86.0 |
| Comparative Example 8 | 17.0 | 89.3 | 72.5 | 83.5 |
| Example 4 | 14.0 | 89.6 | 77.6 | 88.1 |
| Comparative Example 9 | 20.5 | 98.2 | 75.8 | 95.3 |
| Comparative Example 10 | 22.5 | 99.7 | 73.7 | 96.8 |
| Example 5 | 19.5 | 100.0 | 78.8 | 97.4 |

TABLE 4

| | Sliding angle (°) | Advancing angle (°) | Receding angle (°) | Static contact angle (°) |
|---|---|---|---|---|
| Comparative Example 11 | 17.0 | 99.4 | 80.9 | 95.2 |
| Example 6 | 15.0 | 100.0 | 84.2 | 91.9 |
| Comparative Example 12 | 15.0 | 91.8 | 73.9 | 95.8 |
| Example 7 | 13.0 | 89.2 | 77.0 | 96.1 |
| Comparative Example 13 | 18.0 | 100.9 | 81.3 | 95.7 |
| Example 8 | 16.0 | 100.0 | 83.2 | 96.8 |
| Comparative Example 14 | 17.0 | 90.5 | 74.9 | 86.5 |
| Example 9 | 14.0 | 93.7 | 76.3 | 88.0 |
| Comparative Example 15 | 20.5 | 100.5 | 74.4 | 95.75 |
| Example 10 | 19.5 | 99.5 | 78.8 | 95.95 |

From the above results shown in Tables 3 and 4, it was confirmed that the resist films formed using the positive resist compositions of Examples which included the polymeric compound (A1) having both of the structural units (a1) and (a0) according to the present invention exhibited a smaller sliding angle and a larger receding angle prior to exposure, as compared to the resist films formed using the resist compositions of Comparative Examples.

Therefore, it was verified that according to the present invention, a resist film having a highly hydrophobic surface can be formed.

Further, when comparing the results of Examples 2 and 3, Examples 4 and 5, Examples 7 and 8, and Examples 9 and 10, in all cases, it is apparent that the level of the advancing angle increased as the number of fluorine atoms in the structural unit constituting the fluorine-containing resin used as the component (F) increased. From the results, it is verified that in terms of the factors determining the level of the advancing angle, the contribution by the component (F) is great.

As for the receding angle, although somewhat higher angles were achieved when the components (F) with a large number of fluorine atoms were used, it is evident that the level of change in the angle caused by different combinations of the fluorine-containing resin and a polymeric compound used as the component (A) was larger than the level of change in the angle caused by different numbers of fluorine atoms in the component (F). From the results, it is verified that in terms of the factors for increasing the level of the receding angle, contribution due to the combinations of the fluorine-containing resin and the polymeric compound (A1) is great.

From these results, according to the present invention, by combining the component (F) and the polymeric compound (A1), the level of receding angle can be increased and a favorable level of water tracking ability can be retained when using a scanning-type immersion exposure apparatus. Furthermore, the level of advancing angle can be adjusted by appropriately selecting the type of the fluorine-containing resin component according to the present invention as the component (F). Since the level of advancing angle is thought to be related to the risk for the occurrence of defects during immersion lithography, adjustments of advancing angle within a preferable range is useful with respect to the immersion lithography process.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A positive resist composition comprising:

a base material component (A) which exhibits increased solubility in an alkali developing solution under action of acid;

an acid generator component (B) which generates acid upon exposure; and a fluorine-containing compound component (F);

wherein the base material component (A) includes a polymeric compound (A1) having a structural unit (a0) represented by general formula (a0-1) shown below and a structural unit (a1) derived from an acrylate ester containing an acid dissociable, dissolution inhibiting group, and the fluorine-containing compound component (F) includes a fluorine-containing resin component having a structural unit (f1) represented by general formula (f1-0) shown below:

[Chemical Formula 1]

(a0-1)

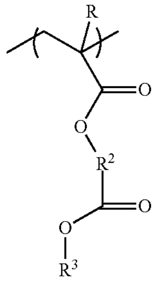

wherein R represents a hydrogen atom, an alkyl group of 1 to 5 carbon atoms or a halogenated alkyl group of 1 to 5 carbon atoms; $R^2$ represents a divalent linking group; and $R^3$ represents a cyclic group containing $—SO_2—$ within the ring skeleton thereof;

[Chemical Formula 2]

(f1-0)

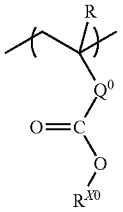

wherein R represents a hydrogen atom, an alkyl group of 1 to 5 carbon atoms or a halogenated alkyl group of 1 to 5 carbon atoms; $Q^0$ represents a single bond or a divalent linking group having a fluorine atom; $R^{X0}$ represents an acid dissociable, dissolution inhibiting group-containing group which may contain a fluorine atom, with the provision that at least one fluorine atom is contained in formula (f1-0).

2. The positive resist composition according to claim 1, wherein the structural unit (f1) is a structural unit represented by general formula (f1-01) shown below or a structural unit represented by general formula (f1-02) shown below:

[Chemical Formula 3]

(f1-01)

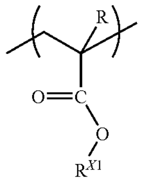

wherein R represents a hydrogen atom, an alkyl group of 1 to 5 carbon atoms or a halogenated alkyl group of 1 to 5 carbon atoms; and $R^{X1}$ represents an acid dissociable, dissolution inhibiting group-containing group having a fluorine atom;

[Chemical Formula 4]

(f1-02)

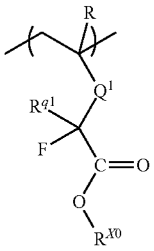

wherein R represents a hydrogen atom, an alkyl group of 1 to 5 carbon atoms or a halogenated alkyl group of 1 to 5 carbon atoms; $Q^1$ represents a group containing —O—, —$CH_2$—O—, or —C(═O)—O—; $R^{q1}$ represents a fluorine atom or a fluorinated alkyl group; and $R^{X0}$ represents an acid dissociable, dissolution inhibiting group-containing group which may contain a fluorine atom.

3. The positive resist composition according to claim 2, wherein the structural unit represented by the general formula (f1-01) is at least one structural unit selected from the group consisting of structural units represented by general formula (f1-01-1) shown below and structural units represented by general formula (f1-01-2) shown below:

[Chemical Formula 5]

(f1-01-1)

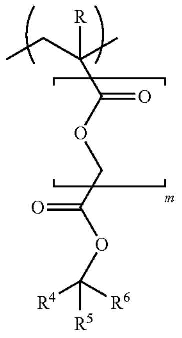

wherein R represents a hydrogen atom, an alkyl group of 1 to 5 carbon atoms or a halogenated alkyl group of 1 to 5 carbon atoms; and each of $R^4$ to $R^6$ independently represents an alkyl group or a fluorinated alkyl group, provided that no fluorine atom within the fluorinated alkyl group is bonded to the carbon atom adjacent to the tertiary carbon atom having $R^4$ to $R^6$ bonded thereto, and at least one of $R^4$ to $R^6$ represents the fluorinated alkyl group; $R^5$ and $R^6$ may be bonded to each other to form a ring structure; and m represents 0 or 1;

[Chemical Formula 6]

(f1-01-2)

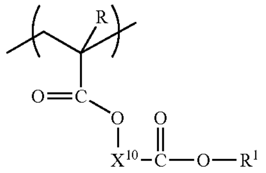

wherein R represents a hydrogen atom, an alkyl group of 1 to 5 carbon atoms or a halogenated alkyl group of 1 to 5 carbon atoms; $R^1$ represents an organic group having a fluorine atom; and $X^{10}$ represents a divalent organic group represented by general formula (x-1) or (x-2) shown below:

[Chemical Formula 7]

(x-1)

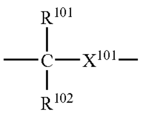

-continued (x-2)

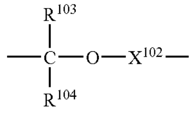

wherein each of $R^{101}$ and $R^{102}$ independently represents an alkyl group which may be mutually bonded to form a ring; each of $R^{103}$ and $R^{104}$ independently represents a hydrogen atom or a linear or branched alkyl group; and each of $X^{101}$ and $X^{102}$ independently represents an alkylene group or a divalent aliphatic cyclic group, with the provision that $R^{101}$ to $R^{104}$ and $X^{101}$ and $X^{102}$ do not contain a fluorine atom.

4. The positive resist composition according to claim 2, wherein the structural unit represented by the general formula (f1-02) is a structural unit represented by general formula (f1-02-1) shown below:

[Chemical Formula 8]

(f1-02-1)

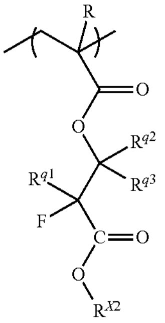

wherein R represents a hydrogen atom, an alkyl group of 1 to 5 carbon atoms or a halogenated alkyl group of 1 to 5 carbon atoms; $R^{q1}$ represents a fluorine atom or a fluorinated alkyl group; each of $R^{q2}$ and $R^{q3}$ independently represents a hydrogen atom, an alkyl group or a fluorinated alkyl group which may be mutually bonded to form a ring; and $R^{X2}$ represents an acid dissociable, dissolution inhibiting group-containing group.

5. The positive resist composition according to claim 1, wherein $R^3$ in the general formula (a0-1) represents a cyclic group containing —O—$SO_2$— in the ring skeleton thereof.

6. The positive resist composition according to claim 5, wherein $R^3$ in the general formula (a0-1) represents a cyclic group represented by general formula (3-1) shown below:

[Chemical Formula 9]

(3-1)

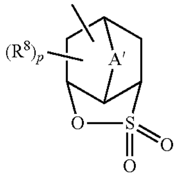

wherein A' represents an oxygen atom, a sulfur atom, or an alkylene group of 1 to 5 carbon atoms which may contain an oxygen atom or a sulfur atom; p represents an integer of 0 to 2; and $R^8$ represents an alkyl group, an alkoxy group, a halogenated alkyl group, a hydroxyl group, —COOR", —OC(=O)R", a hydroxyalkyl group or a cyano group, wherein said R" represents a hydrogen atom or an alkyl group.

7. The positive resist composition according to claim 1, wherein the polymeric compound (A1) also has a structural unit (a3) derived from an acrylate ester that contains a polar group-containing aliphatic hydrocarbon group.

8. The positive resist composition according to claim 1, further comprising a nitrogen-containing organic compound (D).

9. A method of forming a resist pattern, comprising:

applying the positive resist composition of claim 1 on a substrate to form a resist film;

subjecting the resist film to exposure; and subjecting the resist film to alkali developing to form a resist pattern.

* * * * *

UNITED STATES PATENT AND TRADEMARK OFFICE

CERTIFICATE OF CORRECTION

PATENT NO. : 8,349,534 B2
APPLICATION NO. : 12/717785
DATED : January 8, 2013
INVENTOR(S) : Tsuyoshi Kurosawa and Hiroaki Shimizu It is certified that error appears in the above-identified patent and that said Letters Patent is hereby corrected as shown below:

In the Specifications:

In Column 6, Lines 42-43, Change "preferable," to --preferable.--.

In Column 8, Line 61, Change "sulfone" to --sultone--.

In Column 16, Line 61, Change "used" to --used,--.

In Column 18, Line 14 (Approx.), Change "bonded," to --bonded.--.

In Column 20, Line 64, Change "$K^{2'}$" to --$R^{2'}$--.

In Column 59, Line 40, Change "used" to --used.--.

In Column 80, Line 13 (Approx.), Change "used" to --used,--.

In Column 81, Line 60, Change "like," to --like.--.

In Column 82, Line 39, Change "groups," to --groups.--.

In Column 83, Line 29 (Approx.), Change "2," to --2.--.

In Column 85, Line 58, Change "atom," to --atom.--.

In Column 85, Line 60, Change "atom," to --atom.--.

In Column 86, Line 2, Change "(—(=O)—NH—),"

to --(—C(=O)—NH—),--.

In Column 87, Line 64, Change "preferable," to --preferable.--.

In Column 88, Line 45, Change "atoms," to --atoms.--.

Signed and Sealed this
Third Day of September, 2013

Teresa Stanek Rea
*Acting Director of the United States Patent and Trademark Office*

In Column 88, Line 62, Change “desirable,” to --desirable.--.

In Column 88, Line 66, Change “—C(O)—O—,” to ——C(=O)—O—,--.

In Column 90, Line 4, Change “$R^{\sigma}$” to --$R^{94}$--.

In Column 90, Line 58, Change “used,” to --used.--.

In Column 91, Line 1, Change “—$CH_2CF_2CF_2$—;”

to ——$CH_2CF_2CF_2$—,--.

In Column 91, Line 19, Change “—$CH_1CH_2CF_2$—,”

to ——$CH_2CH_2CF_2$—,--.

In Column 91, Line 30, Change “atoms,” to --atoms.--.

In Column 91, Line 44, Change “group,” to --group.--.

In Column 92, Lines 25-26, Change “1-(5,5-dimethyl-4-”

to --1-(3,5-dimethyl-4---.

In Column 92, Line 30 (Approx.), Change “nonafluorobutanesulfonate,”

to --nonafluorobutanesulfonate.--.

In Column 92, Limne 32 (Approx.), Change “allcylsulfonate” to --alkylsulfonate-

In Column 92, Line 39 (Approx.), Change “used,” to --used.--.

In Column 93, Line 37, Change “used” to --used.--.

In Column 94, Line 3, Change “atoms,” to --atoms.--.

In Column 94, Line 13 (Approx.), Change “improved,” to --improved.--.

In Column 94, Line 28 (Approx.), Change “used” to --used.--.

In Column 95, Line 27 (Approx.), Change “($R^{4''}SO_3'$)” to --($R^{4''}SO_3^-$)--.

In Column 96, Line 32, Change “below,” to --below.--.

In Column 97, Line 33, Change “used,” to --used.--.

In Column 97, Line 54, Change “α-(p-toluenesulfonyloxyimino)” to --α-[(p-toluenesulfonyloxyimino)--.

In Column 98, Line 55, Change “used,” to --used.--.

In Column 98, Lines 61-62, Change "bis(phenylsulfonyliazomethylsulfonyl)" to – bis(phenylsulfonyldiazomethylsulfonyl) –.

In Column 99, Line 56, Change "Cert-butyl" to --tert-butyl--.

In Column 100, Line 23, Change ""Linking" to --"linking--.

In Column 100, Line 26, Change "($Q^0$-2)")," to --($Q^0$-2)").--.

In Column 100, Line 35, Change "atom," to --atom.--.

In Column 101, Line 29, Change "adamantine," to --adamantane,--.

In Column 104, Line 13, Change "atom," to --atom.--.

In Column 104, Line 63, Change "bicycloalkane;" to --bicycloalkane,--.

In Column 105, Line 47, Change "1," to --1.--.

In Column 108, Lines 13-14 (Approx.), Change "4-dimethylaminopyridine," to --4-dimethylaminopyridine.--.

In Column 108, Line 18 (Approx.), Change "advance," to --advance.--.

In Column 108, Line 24 (Approx.), Change "minutes," to --minutes.--.

In Column 108, Line 32 (Approx.), Change "hours," to --hours.--.

In Column 108, Line 67, Change "(x-2)" to --(x=2)--.

In Column 109, Line 17 (Approx.), Change "In" to --[In--.

In Column 109, Line 30 (Approx.), Change "above," to --above.--.

In Column 109, Line 52 (Approx.), Change "atom," to --atom.--.

In Column 109, Line 62 (Approx.), Change "alkyoxy" to --alkoxy--.

In Column 110, Line 8 (Approx.), Change "atoms," to --atoms.--.

In Column 110, Line 32 (Approx.), Change "solution," to --solution.--.

In Column 110, Line 51 (Approx.), Change "developing," to --developing.--.

In Column 111, Line 3, Change "suppressed," to --suppressed.--.

In Column 111, Lines 36-37, Change "monocycloalkne" to --monocycloalkane--.

In Column 111, Line 52, Change "given," to --given.--.

In Column 130, Line 56, Change "above," to --above.--.

In Column 132, Line 51, Change "above," to --above.--.

In Column 133, Line 8, Change "group," to --group.--.

In Column 138, Line 55, Change "used" to --used,--.

In Column 139, Line 1, Change "diethylatnine," to --diethylamine,--.

In Column 139, Line 2, Change "di-n-octylatnine," to --di-n-octylamine,--.

In Column 142, Line 3, Change "lower-layer'organic" to --lower-layer organic--.

In Column 142, Line 36, Change "at" to --as--.

In Column 149, Line 60 (Approx.), Change "27,26," to --27.26,--.

In Column 150, Line 4, Change "mL," to --mL--.

Line 152, Lines 32-41,

Change "

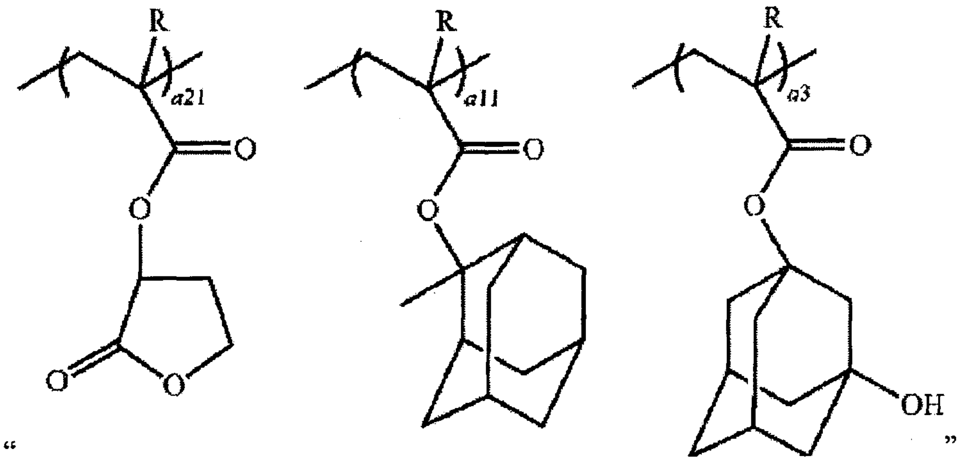

"

to -- 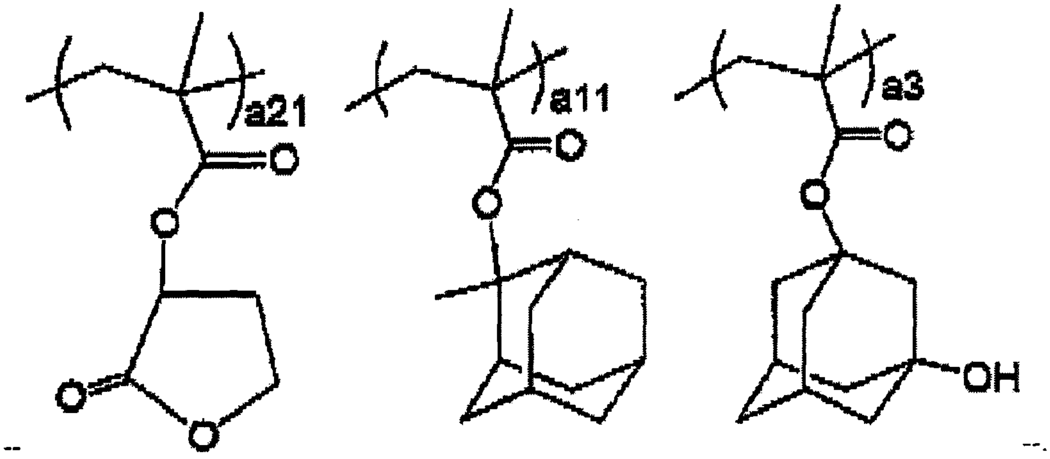 --.
In Column 156, Line 29, Change "3-hepthyl" to --3-heptyl--.
In Column 156, Line 56 (Approx.), Change "3-hepthyl" to --3-heptyl--.
In Column 156, Line 61 (Approx.), Change "4-dimethylvaleronhrile)" to --4-dimethylvaleronitrile)--.
In Column 163, Line 34 (Approx.), Change "hours," to --hours.--.